United States Patent
Akimoto et al.

(10) Patent No.: US 8,466,463 B2
(45) Date of Patent: Jun. 18, 2013

(54) SEMICONDUCTOR DEVICE AND MANUFACTURING METHOD THEREOF

(75) Inventors: Kengo Akimoto, Kanagawa (JP); Tatsuya Honda, Kanagawa (JP); Norihito Sone, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 12/948,095

(22) Filed: Nov. 17, 2010

(65) Prior Publication Data

US 2011/0163311 A1  Jul. 7, 2011

Related U.S. Application Data

(63) Continuation of application No. 12/184,388, filed on Aug. 1, 2008, which is a continuation of application No. 11/524,549, filed on Sep. 21, 2006, now Pat. No. 7,674,650.

(30) Foreign Application Priority Data

Sep. 29, 2005 (JP) ................................. 2005-283782

(51) Int. Cl.
*H01L 29/10* (2006.01)
*H01L 29/04* (2006.01)

(52) U.S. Cl.
USPC ............... 257/43; 257/E29.273; 257/E29.202

(58) Field of Classification Search
USPC ....... 257/43, 59, E29.288, E29.273, E29.202, 257/E29.004; 349/42; 216/76, 101
See application file for complete search history.

(56) References Cited

U.S. PATENT DOCUMENTS

| | | |
|---|---|---|
| 4,492,610 A | 1/1985 | Okano et al. |
| 5,094,978 A | 3/1992 | Miyagaki et al. |
| 5,286,659 A | 2/1994 | Mitani et al. |
| 5,382,457 A | 1/1995 | Coombe |
| 5,496,752 A | 3/1996 | Nasu et al. |
| 5,530,265 A | 6/1996 | Takemura |

(Continued)

FOREIGN PATENT DOCUMENTS

| | | |
|---|---|---|
| CN | 1319781 A | 10/2001 |
| CN | 1353329 A | 6/2002 |

(Continued)

OTHER PUBLICATIONS

Chaing et al "High mobility transparent thin film transistors with amorphous zinc tin oxide channel layer", Applied Physics Letters, vol. 66, (2005) 013504, 3 pages (published online Dec. 23, 2004).*

(Continued)

*Primary Examiner* — Caridad Everhart
(74) *Attorney, Agent, or Firm* — Husch Blackwell LLP

(57) ABSTRACT

An object is to provide a semiconductor device of which a manufacturing process is not complicated and by which cost can be suppressed, by forming a thin film transistor using an oxide semiconductor film typified by zinc oxide, and a manufacturing method thereof. For the semiconductor device, a gate electrode is formed over a substrate; a gate insulating film is formed covering the gate electrode; an oxide semiconductor film is formed over the gate insulating film; and a first conductive film and a second conductive film are formed over the oxide semiconductor film. The oxide semiconductor film has at least a crystallized region in a channel region.

22 Claims, 21 Drawing Sheets

U.S. PATENT DOCUMENTS

| | | | |
|---|---|---|---|
| 5,625,199 A | 4/1997 | Baumbach et al. | |
| 5,696,011 A | 12/1997 | Yamazaki et al. | |
| 5,701,167 A | 12/1997 | Yamazaki | |
| 5,723,366 A | 3/1998 | Suzuki et al. | |
| 5,731,856 A | 3/1998 | Kim et al. | |
| 5,817,548 A | 10/1998 | Noguchi et al. | |
| 5,943,593 A | 8/1999 | Noguchi et al. | |
| 6,022,801 A | 2/2000 | Domenicucci et al. | |
| 6,050,827 A | 4/2000 | Takechi et al. | |
| 6,103,558 A | 8/2000 | Yamanaka et al. | |
| 6,218,219 B1 | 4/2001 | Yamazaki et al. | |
| 6,287,663 B1 | 9/2001 | Goto | |
| 6,294,274 B1 | 9/2001 | Kawazoe et al. | |
| 6,407,431 B2 | 6/2002 | Yamazaki et al. | |
| 6,459,418 B1 | 10/2002 | Comiskey et al. | |
| 6,495,437 B1 | 12/2002 | Yu | |
| 6,529,251 B2 | 3/2003 | Hibino et al. | |
| 6,532,045 B2 | 3/2003 | Chung et al. | |
| 6,552,757 B1 | 4/2003 | Murai et al. | |
| 6,563,174 B2 | 5/2003 | Kawasaki et al. | |
| 6,569,716 B1 | 5/2003 | Suzuki | |
| 6,573,564 B2 | 6/2003 | Yamazaki et al. | |
| 6,580,405 B1 | 6/2003 | Yamazaki et al. | |
| 6,674,136 B1 | 1/2004 | Ohtani | |
| 6,680,242 B2 | 1/2004 | Ohtsu et al. | |
| 6,713,748 B1 | 3/2004 | Tsutsumi et al. | |
| 6,727,522 B1 | 4/2004 | Kawasaki et al. | |
| 6,819,368 B2 | 11/2004 | Chae | |
| 6,821,655 B1 | 11/2004 | Ohta et al. | |
| 6,852,998 B2 | 2/2005 | Sung et al. | |
| 6,855,957 B1 | 2/2005 | Yamazaki et al. | |
| 6,878,962 B1 | 4/2005 | Kawasaki et al. | |
| 6,900,461 B2 | 5/2005 | Inoue et al. | |
| 7,009,204 B2 | 3/2006 | Tsai et al. | |
| 7,012,658 B2 | 3/2006 | Sawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,075,614 B2 | 7/2006 | Izumi et al. | |
| 7,105,868 B2 | 9/2006 | Nause et al. | |
| 7,106,296 B1 | 9/2006 | Jacobson | |
| 7,161,173 B2 | 1/2007 | Burgener, II et al. | |
| 7,172,813 B2 | 2/2007 | Burgener, II et al. | |
| 7,189,992 B2 | 3/2007 | Wager, III et al. | |
| 7,193,677 B2 | 3/2007 | Ino | |
| 7,205,640 B2 | 4/2007 | Yoshioka et al. | |
| 7,211,825 B2 | 5/2007 | Shih et al | |
| 7,218,361 B2 | 5/2007 | Yamazaki et al. | |
| 7,268,842 B2 | 9/2007 | Sawasaki et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,339,187 B2 | 3/2008 | Wager, III et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,427,776 B2 | 9/2008 | Hoffman et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,473,925 B2 | 1/2009 | Burgener, II et al. | |
| 7,486,344 B2 | 2/2009 | Yamazaki et al. | |
| 7,501,293 B2 | 3/2009 | Ito et al. | |
| 7,642,573 B2 | 1/2010 | Hoffman et al. | |
| 7,666,764 B2 | 2/2010 | Ho et al. | |
| 7,674,650 B2 | 3/2010 | Akimoto et al. | |
| 7,687,325 B2 | 3/2010 | Yamazaki et al. | |
| 7,691,353 B2 | 4/2010 | Burgener, II et al. | |
| 7,732,819 B2 | 6/2010 | Akimoto et al. | |
| 7,790,048 B2 | 9/2010 | Allibert et al. | |
| 7,829,376 B1 | 11/2010 | Adekore et al. | |
| 7,838,348 B2 | 11/2010 | Hoffman et al. | |
| 7,872,259 B2 | 1/2011 | Den et al. | |
| 7,888,207 B2 | 2/2011 | Wager, III et al. | |
| 7,910,490 B2 | 3/2011 | Akimoto et al. | |
| 7,935,616 B2 | 5/2011 | Burgener, II et al. | |
| 8,088,652 B2 | 1/2012 | Hayashi et al. | |
| 2001/0008227 A1 | 7/2001 | Sadamoto et al. | |
| 2001/0017372 A1 | 8/2001 | Koyama | |
| 2001/0039066 A1 | 11/2001 | Hoon | |
| 2001/0046027 A1 | 11/2001 | Tai et al. | |
| 2001/0052889 A1 | 12/2001 | Fukunishi | |
| 2002/0020875 A1 | 2/2002 | Arao et al. | |
| 2002/0034861 A1* | 3/2002 | Iwata et al. | 438/483 |
| 2002/0056838 A1 | 5/2002 | Ogawa | |
| 2002/0068372 A1 | 6/2002 | Kunii | |
| 2002/0086471 A1 | 7/2002 | Maekawa et al. | |
| 2002/0089490 A1 | 7/2002 | Sheridon | |
| 2002/0109796 A1 | 8/2002 | Lin et al. | |
| 2002/0125535 A1 | 9/2002 | Ueda | |
| 2002/0132454 A1 | 9/2002 | Ohtsu et al. | |
| 2003/0027407 A1 | 2/2003 | Koike et al. | |
| 2003/0113957 A1 | 6/2003 | So | |
| 2003/0143784 A1 | 7/2003 | Nishitani et al. | |
| 2003/0146433 A1* | 8/2003 | Cantwell et al. | 257/43 |
| 2003/0164498 A1 | 9/2003 | Sung et al. | |
| 2003/0218221 A1 | 11/2003 | Wager et al. | |
| 2003/0218222 A1 | 11/2003 | Wager, III et al. | |
| 2003/0226499 A1* | 12/2003 | Hosseini Teherani | 117/84 |
| 2004/0038446 A1 | 2/2004 | Takeda et al. | |
| 2004/0099926 A1 | 5/2004 | Yamazaki et al. | |
| 2004/0108505 A1 | 6/2004 | Tuller et al. | |
| 2004/0127038 A1 | 7/2004 | Carcia et al. | |
| 2004/0132293 A1 | 7/2004 | Takayama et al. | |
| 2004/0155846 A1* | 8/2004 | Hoffman et al. | 345/87 |
| 2004/0195572 A1 | 10/2004 | Kato et al. | |
| 2004/0253772 A1 | 12/2004 | So | |
| 2005/0017302 A1 | 1/2005 | Hoffman | |
| 2005/0039670 A1* | 2/2005 | Hosono et al. | 117/2 |
| 2005/0062134 A1 | 3/2005 | Ho et al. | |
| 2005/0074930 A1 | 4/2005 | Chen et al. | |
| 2005/0093065 A1 | 5/2005 | So | |
| 2005/0095753 A1 | 5/2005 | So | |
| 2005/0133917 A1 | 6/2005 | Hoffman et al. | |
| 2005/0139836 A1 | 6/2005 | Oh | |
| 2005/0158920 A1 | 7/2005 | So | |
| 2005/0158928 A1 | 7/2005 | So | |
| 2005/0162591 A1 | 7/2005 | Hashimoto | |
| 2005/0170971 A1 | 8/2005 | Yata et al. | |
| 2005/0173734 A1* | 8/2005 | Yoshioka et al. | 257/202 |
| 2005/0189883 A1 | 9/2005 | Suh et al. | |
| 2005/0191798 A1 | 9/2005 | So | |
| 2005/0191799 A1 | 9/2005 | So | |
| 2005/0199879 A1 | 9/2005 | Hoffman et al. | |
| 2005/0199880 A1 | 9/2005 | Hoffman et al. | |
| 2005/0199959 A1 | 9/2005 | Chiang et al. | |
| 2005/0253803 A1 | 11/2005 | Thompson et al. | |
| 2005/0259206 A1 | 11/2005 | Son | |
| 2005/0275038 A1* | 12/2005 | Shih et al. | 257/382 |
| 2006/0012737 A1 | 1/2006 | Hirai et al. | |
| 2006/0035452 A1 | 2/2006 | Carcia et al. | |
| 2006/0043377 A1 | 3/2006 | Hoffman et al. | |
| 2006/0043380 A1 | 3/2006 | Hiroshi et al. | |
| 2006/0043447 A1 | 3/2006 | Ishii et al. | |
| 2006/0054888 A1 | 3/2006 | Ito et al. | |
| 2006/0079034 A1 | 4/2006 | Hoffman et al. | |
| 2006/0079037 A1 | 4/2006 | Hoffman et al. | |
| 2006/0086933 A1 | 4/2006 | Iechi et al. | |
| 2006/0086936 A1 | 4/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0141136 A1 | 6/2006 | Miyazawa | |
| 2006/0163743 A1 | 7/2006 | Kuwabara et al. | |
| 2006/0169973 A1 | 8/2006 | Isa et al. | |
| 2006/0170067 A1 | 8/2006 | Maekawa et al. | |
| 2006/0170111 A1 | 8/2006 | Isa et al. | |
| 2006/0177769 A1 | 8/2006 | Ichihara et al. | |
| 2006/0197092 A1 | 9/2006 | Hoffman et al. | |
| 2006/0208977 A1 | 9/2006 | Kimura | |
| 2006/0220023 A1 | 10/2006 | Hoffman et al. | |

| | | | |
|---|---|---|---|
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0258064 A1 | 11/2006 | Chen et al. | |
| 2006/0284171 A1 | 12/2006 | Levy et al. | |
| 2006/0284172 A1 | 12/2006 | Ishii | |
| 2006/0286737 A1 | 12/2006 | Levy et al. | |
| 2006/0292777 A1 | 12/2006 | Dunbar | |
| 2007/0018163 A1* | 1/2007 | Chiang et al. | 257/59 |
| 2007/0023750 A1 | 2/2007 | Chiang et al. | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0158652 A1 | 7/2007 | Lee et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0238228 A1 | 10/2007 | Su et al. | |
| 2007/0252928 A1 | 11/2007 | Ito et al. | |
| 2007/0267699 A1* | 11/2007 | Hoffman | 257/347 |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0108198 A1 | 5/2008 | Wager, III et al. | |
| 2008/0118777 A1 | 5/2008 | Li et al. | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0176349 A1 | 7/2008 | Suh et al. | |
| 2008/0182358 A1 | 7/2008 | Cowdery-Corvan et al. | |
| 2008/0198108 A1 | 8/2008 | Aoki | |
| 2008/0224133 A1 | 9/2008 | Park et al. | |
| 2008/0254569 A1* | 10/2008 | Hoffman et al. | 438/104 |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296569 A1 | 12/2008 | Ho et al. | |
| 2008/0308796 A1 | 12/2008 | Akimoto et al. | |
| 2008/0308797 A1 | 12/2008 | Akimoto et al. | |
| 2008/0308804 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0008639 A1 | 1/2009 | Akimoto et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0114911 A1 | 5/2009 | Maekawa et al. | |
| 2009/0134399 A1 | 5/2009 | Sakakura et al. | |
| 2009/0152541 A1 | 6/2009 | Maekawa et al. | |
| 2009/0153762 A1 | 6/2009 | Kuwabara et al. | |
| 2009/0155940 A1 | 6/2009 | Lee et al. | |
| 2009/0186437 A1 | 7/2009 | Akimoto | |
| 2009/0186445 A1 | 7/2009 | Akimoto | |
| 2009/0189155 A1 | 7/2009 | Akimoto | |
| 2009/0189156 A1 | 7/2009 | Akimoto | |
| 2009/0278122 A1 | 11/2009 | Hosono et al. | |
| 2009/0280600 A1 | 11/2009 | Hosono et al. | |
| 2009/0305461 A1 | 12/2009 | Akimoto et al. | |
| 2010/0136743 A1 | 6/2010 | Akimoto et al. | |
| 2010/0148221 A1 | 6/2010 | Yu et al. | |
| 2011/0017996 A1 | 1/2011 | Den et al. | |
| 2011/0104851 A1 | 5/2011 | Akimoto et al. | |
| 2011/0117697 A1 | 5/2011 | Akimoto et al. | |
| 2011/0121290 A1 | 5/2011 | Akimoto et al. | |
| 2011/0175090 A1 | 7/2011 | Sugihara et al. | |

FOREIGN PATENT DOCUMENTS

| | | |
|---|---|---|
| CN | 1380681 A | 11/2002 |
| CN | 1445821 A | 10/2003 |
| CN | 1463466 A | 12/2003 |
| CN | 1505161 A | 6/2004 |
| CN | 1577027 A | 2/2005 |
| CN | 1619362 A | 5/2005 |
| CN | 1656617 A | 8/2005 |
| EP | 0 054 201 A1 | 6/1982 |
| EP | 1 033 755 A2 | 9/2000 |
| EP | 1 134 811 A1 | 9/2001 |
| EP | 1 209 748 A1 | 5/2002 |
| EP | 1 396 881 A1 | 3/2004 |
| EP | 1 426 813 A2 | 6/2004 |
| EP | 1 533 650 A1 | 5/2005 |
| EP | 1 737 044 A1 | 12/2006 |
| EP | 2 226 847 A2 | 9/2010 |
| JP | 56-134739 | 10/1981 |
| JP | 59-13591 | 3/1984 |
| JP | 59-124162 | 7/1984 |
| JP | 60-11109 | 3/1985 |
| JP | 60-83373 | 5/1985 |
| JP | 60-170972 | 9/1985 |
| JP | 62-98774 | 5/1987 |
| JP | 2-226729 | 9/1990 |
| JP | 5-251705 | 9/1993 |
| JP | 6-88972 | 3/1994 |
| JP | 6-281956 | 10/1994 |
| JP | 09-074087 A | 3/1997 |
| JP | 9-139506 | 5/1997 |
| JP | 9-172186 | 6/1997 |
| JP | 11-103066 | 4/1999 |
| JP | 11-274160 | 10/1999 |
| JP | 2000-44236 | 2/2000 |
| JP | 2000-150900 | 5/2000 |
| JP | 2001-044174 A | 2/2001 |
| JP | 2002-76356 | 3/2002 |
| JP | 2002-289859 | 10/2002 |
| JP | 2003-037268 A | 2/2003 |
| JP | 2003-50405 | 2/2003 |
| JP | 2003-86808 | 3/2003 |
| JP | 2003-234355 | 8/2003 |
| JP | 2003-248240 | 9/2003 |
| JP | 2004-103957 | 4/2004 |
| JP | 2004-235180 | 8/2004 |
| JP | 2004-273614 | 9/2004 |
| JP | 2004-273732 | 9/2004 |
| JP | 2004-311702 | 11/2004 |
| JP | 2004-349583 | 12/2004 |
| JP | 2005-33172 | 2/2005 |
| JP | 2005-93974 | 4/2005 |
| JP | 2005-243951 | 9/2005 |
| JP | 2005-268724 | 9/2005 |
| JP | 2006-186319 | 7/2006 |
| JP | 2007-73698 | 3/2007 |
| JP | 2007-529118 | 10/2007 |
| WO | WO 03/040441 A1 | 5/2003 |
| WO | WO 03/071608 A1 | 8/2003 |
| WO | WO 03/098699 A1 | 11/2003 |
| WO | WO 2004/038757 A2 | 5/2004 |
| WO | WO 2005/088716 A2 | 9/2005 |
| WO | WO 2005/088726 A1 | 9/2005 |
| WO | WO 2005/093849 A1 | 10/2005 |
| WO | WO 2006/051994 A2 | 5/2006 |

OTHER PUBLICATIONS

Martins et al, "Transport in high mobiltiy amorphous wide band gap indium zinc oxide films", Phys. Stat. Sol. (a) vol. 202, No. 9 (2005) R95-R97 (published online Jun. 10, 2005).*
Office Action dated Mar. 24, 2011 in U.S. Appl. No. 12/184,401.
Office Action dated Mar. 18, 2011 in U.S. Appl. No. 12/542,068.
Notice of Allowance dated Mar. 28, 2011 in U.S. Appl. No. 12/184,388.
Notice of Allowance dated Mar. 21, 2011 in U.S. Appl. No. 12/699,240.
Office Action re Chinese Application No. CN 201010206970.9, dated Jun. 8, 2011 (with English translation).

Office Action re Chinese Application No. CN 201010206979.X, dated May 17, 2011 (with English translation).
Office Action re U.S. Appl. No. 11/524,549, dated Jul. 30, 2008.
Final Rejection re U.S. Appl. No. 11/524,549, dated Jan. 8, 2009.
Office Action re U.S. Appl. No. 11/524,549, dated Jun. 18, 2009.
Office Action re U.S. Appl. No. 12/184,418, dated Jul. 8, 2009.
Office Action re U.S. Appl. No. 12/699,240, dated Sep. 22, 2010.
Office Action re U.S. Appl. No. 12/184,443, dated Apr. 27, 2011.
Office Action re U.S. Appl. No. 12/184,388, dated Jun. 22, 2011.
Office Action re U.S. Appl. No. 13/011,128, dated Jun. 22, 2011.
Choi, K.-Y. et al., "A New Bottom-Gated Poly-Si Thin-Film Transistor," IEEE Electron Device Letters, vol. 20, No. 4, Apr. 1, 1999, pp. 170-172.
Kwon, Y. et al., "Enhancement-Mode-Thin-Film Field-Effect Transistor Using Phosphorus-Doped (Zn,Mg)O Channel," Applied Physics Letters, vol. 84, No. 14, Apr. 5, 2004, pp. 2685-2687.
Miyasako, T. et al., "Ferroelectric-Gate Thin-Film Transistors Using Indium-Tin-Oxide Channel with Large Charge Controllability," Applied Physics Letters, vol. 86, No. 16, 2005, pp. 162902-1-162902-3.
Dehuff, N.L. et al., "Transparent Thin-Film Transistors with Zinc Indium Oxide Channel Layer," Journal of Applied Physics, vol. 97, 2005, pp. 064505-1-064505-5.
Fortunato, E. et al., "Recent Advances in ZnO Transparent Thin Film Transistors," Thin Solid Films, vol. 487, Sep. 1, 2005, pp. 205-211.
European Search Report re Application No. EP 06019112.9, dated Aug. 24, 2011.
European Search Report re Application No. EP 08016239.9, dated Sep. 1, 2011.
European Search Report re Application No. EP 08016226.6, dated Sep. 2, 2011.
European Search Report re Application No. EP 08016242.3, dated Sep. 2, 2011.
Office Action re U.S. Appl. No. 12/184,432, dated Sep. 13, 2011.
Office Action re U.S. Appl. No. 12/950,300, dated Sep. 20, 2011.
Final Rejection re U.S. Appl. No. 12/542,068, dated Oct. 17, 2011.
Final Rejection re U.S. Appl. No. 12/184,443, dated Oct. 28, 2011.
Asakuma, N. et al, "Crystallization and Reduction of Sol-Gel-Derived Zinc Oxide Films by Irradiation with Ultraviolet Lamp," Journal of Sol-Gel Science and Technology, vol. 26, Jan.-Mar. 2003, pp. 181-184.
Masuda, S. et al, "Transparent Thin Film Transistors Using ZnO as an Active Channel Layer and Their Electrical Properties," Journal of Applied Physics, vol. 93, No. 3, Feb. 1, 2003, pp. 1624-1630.
Nomura, K. et al, "Thin-Film Transistor Fabricated in Single-Crystalline Transparent Oxide Semiconductor," Science, vol. 300, No. 5623, May 23, 2003, pp. 1269-1272.
Fortunato, E.M.C. et al, "Wide-Bandgap High-Mobility ZnO Thin-Film Transistors Produced at Room Temperature," Applied Physics Letters, vol. 85, No. 13, Sep. 27, 2004, pp. 2541-2543.
Nomura, K. et al, "Room-Temperature Fabrication of Transparent Flexible Thin-Film Transistors Using Amorphous Oxide Semiconductors," Nature, vol. 432, Nov. 25, 2004, pp. 488-492.
Chinese Office Action re application No. CN 200610141329.5, dated Apr. 17, 2009 (with English translation).
Preliminary Amendment A, re U.S. Appl. No. 12/184,388, filed Aug. 1, 2008.
Preliminary Amendment A, re U.S. Appl. No. 12/184,401, filed Aug. 1, 2008.
Preliminary Amendment A, re U.S. Appl. No. 12/184,407, filed Aug. 1, 2008.
Preliminary Amendment A, re U.S. Appl. No. 12/184,432, filed Aug. 1, 2008.
Preliminary Amendment A, re U.S. Appl. No. 12/184,443, filed Aug. 1, 2008.
Preliminary Amendment A, re U.S. Appl. No. 12/432,403, filed Apr. 29, 2009.
Preliminary Amendment A, re U.S. Appl. No. 12/542,068, filed Aug. 17, 2009.
Kimizuka, N. et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$-$ZnGa_2O_4$-ZnO System," Journal of Solid State Chemistry, vol. 116, No. 1, 1995, pp. 170-178.
Li, C. et al., "Modulated Structures of Homologous Compounds $InMO_3(ZnO)_m$ (M=In, Ga; m=Integer) Described by Four-Dimensional Superspace Group," Journal of Solid State Chemistry, vol. 139, 1998, pp. 347-355.
Nomura et al., "31a-ZA-6 Carrier Transport in Transparent Amorphous Oxide Semiconductor $InGaZnO_4$," Extended Abstracts (The 51st Spring Meeting 2004), The Japan Society of Applied Physics and Related Societies, No. 2, Mar. 28, 2004, pp. 669 (with English translation).
Kamiya et al., "1a-F-5 Room Temperature Fabrication and Carrier Transport of Amorphous Semiconductor Exhibiting Large Electron Hall Mobilities > 10 cm2/Vs," Extended Abstracts (The 65th Autumn Meeting 2004), The Japan Society of Applied Physics, No. 2, Sep. 1, 2004, pp. 791 (with English translation).
Office Action re U.S. Appl. No. 12/184,401, dated Mar. 5, 2010.
Chang, S.-C. et al, "Patterning of Zinc Oxide Thin Films," IEEE Conf. Tech Digest, Solid State Sensor and Actuator, Jun. 22-25, 1992 (Abstract).
Park, J.S. et al, "Dry Etching of ZnO Films and Plasma-Induced Damage to Optical Properties," J. Vac. Sci. Technol. B 21(2), Mar./Apr. 2003, pp. 800-803.
Ogata, K. et al, "Electron-Cyclotron-Resonance Plasma Etching of the ZnO Layers Grown by Molecular-Beam Epitaxy," J. Vac. Sci. Technol. A 22(3), May/Jun. 2004, pp. 531-533.
Notice of Allowance re U.S. Appl. No. 12/432,403, dated Sep. 22, 2010.
Office Action re U.S. Appl. No. 12/184,401, dated Sep. 23, 2010.
Giesbers, J.B. et al, "Dry Etching of All-Oxide Transparent Thin Film Memory Transistors," Microelectronic Engineering, vol. 35, 1997, pp. 71-74.
Ren, F. et al, "Wet Chemical and Plasma Etching of $Ga_2O_3(Gd_2O_3)$," J. Electrochem. Soc., vol. 144, No. 9, Sep. 1997, pp. L239-L241.
Pending Claims as of Jul. 29, 2010 re U.S. Appl. No. 12/268,558 (US patent application publication No. 2009/0073325 A1).
Final Rejection re U.S. Appl. No. 12/268,558, dated Oct. 14, 2010.
Notice of Allowance re U.S. Appl. No. 12/184,407, dated Oct. 15, 2010.
Office Action re U.S. Appl. No. 12/432,403, dated Apr. 20, 2010.
Office Action re U.S. Appl. No. 12/184,407, dated Apr. 28, 2010.
Office Action re U.S. Appl. No. 12/184,443, dated May 4, 2010.
Office Action re U.S. Appl. No. 12/184,388, dated Apr. 29, 2010.
Oh, M.S. et al, "Improving the Gate Stability of ZnO Thin-Film Transistors with Aluminum Oxide Dielectric Layers," Journal of the Electrochemical Society, vol. 155, No. 12, Dec. 2008, pp. H1009-H1014.
Ueno, K. et al, "Field-Effect Transistor on $SrTiO_3$ with Sputtered $Al_2O_3$ Gate Insulator," Applied Physics Letters, vol. 83, No. 9, Sep. 1, 2003, pp. 1755-1757.
Office Action re U.S. Appl. No. 12/542,068, dated Aug. 6, 2010.
Office Action re U.S. Appl. No. 12/184,443, dated Oct. 26, 2010.
Office Action re U.S. Appl. No. 12/184,388, dated Nov. 12, 2010.
Notice of Allowance re U.S. Appl. No. 12/432,403, dated Jan. 3, 2011.
Notice of Allowance re U.S. Appl. No. 12/184,407, dated Jan. 11, 2011.
Nomura, K. et al., "Carrier Transport in Transparent Oxide Semiconductor with Intrinsic Structural Randomness Probed using Single-Crystalline $InGaO_3(ZnO)_5$ Films," Applied Physics Letters, vol. 85, No. 11, Sep. 13, 2004, pp. 1993-1995.
Office Action re Chinese Application No. CN 200810145973.9, dated Sep. 18, 2009 (with English translation).
Office Action re U.S. Appl. No. 12/184,443, dated Sep. 18, 2009.
Office Action re U.S. Appl. No. 12/184,388, dated Sep. 30, 2009.
Office Action re Chinese Application No. CN 200810145969.2, dated Oct. 30, 2009 (with English translation).
Office Action re Chinese Application No. CN 200810145970.5, dated Nov. 27, 2009 (with English translation).
Office Action re Chinese Application No. CN 200810145974.3, dated Nov. 27, 2009 (with English translation).

Office Action re Chinese Application No. CN 200810145972.4, dated Dec. 18, 2009 (with English translation).
"Notification," re Japanese application No. JP 2008-200670, Information Offer Form, dated Aug. 31, 2010 (with full English translation).
Office Action dated Mar. 13, 2012 in U.S. Appl. No. 12/699,240.
Kohno, T. et al, "1p-ZF-2 Effects of Annealing on Defects in ZnO Thin Films," The 65$^{th}$ Autumn Meeting, The Japan Society of Applied Physics Extended Abstracts, No. 2, Sep. 1, 2004, p. 547 (with English translation, pp. 1-3).
Office Action re Japanese application No. JP 2006-262991, dated Oct. 11, 2011 (with English translation).
Office Action re Japanese application No. JP 2011-008550, dated Oct. 11, 2011 (with English translation).
Office Action re Japanese application No. JP 2008-200670 dated Oct. 25, 2011 (with English translation).
Office Action re Japanese application No. JP 2010-129921, dated Oct. 25, 2011 (with English translation).
Office Action dated Mar. 27, 2012 in U.S. Appl. No. 12/184,432.
Office Action re Japanese application No. JP 2009-177524 dated Jan. 17, 2012 (with English translation).
Office Action re Japanese application No. JP 2006-262991, dated Jan. 17, 2012 (with English translation).
Office Action re Japanese application No. JP 2008-200670, dated Jan. 31, 2012 (with English translation).
Office Action re Japanese application No. JP 2010-129921, dated Jan. 31, 2012 (with English translation).
Pending claims (Election and Amendment F) re U.S. Appl. No. 12/184,432, dated May 26, 2011.
Office Action re Japanese application No. JP 2011-008550, dated Jan. 17, 2012 (with English translation).
Final Office Action re U.S. Appl. No. 12/950,300, dated Feb. 28, 2012.
Advisory Action re U.S. Appl. No. 12/184,443, dated Mar. 15, 2012.
Advisory Action re U.S. Appl. No. 12/542,068, dated Mar. 28, 2012.
Non-final Office Action dated Apr. 19, 2012 in U.S. Appl. No. 13/011,128.
H. Q. Chiang et al., "High mobility transparent thin film transistors with amorphous zinc tin oxide channel layer" Applied Physics Letters, vol. 86 (2005) 013504, 3 pages (published online Dec. 23, 2004).
R. Martins et al., "Transport in high mobility amorphous wide band gap indium zinc oxide films" Phys. Stat. Sol. (a) vol. 202, No. 9 (2005) R95-R97 (published online Jun. 10, 2005).
A Dictionary of Science, Oxford University Press, 5$^{th}$ edition, p. 737.
Office Action dated Jan. 5, 2012 in U.S. Appl. No. 12/184,388.
Office Action dated Jan. 5, 2012 in U.S. Appl. No. 13/011,128.
E. Fortunato (CENIMAT, Portugal) "Invisible Electronics: Thin Film Transistors based on Nanocrystalline ZnO" (website of 21$^{st}$ Intl. Conf. on Amorphous & Nanocrystalline Semiconductors (ICANS21) Sep. 4-9, 2005, Lisbon, Portugal (cited in US Pat. 7,427,776).
Office Action (Japanese Patent Application No. 2009-177524) Dated Sep. 27, 2011, (with English translation).
Notice of Allowance dated Jun. 18, 2012 for related U.S. Appl. No. 12/184,401.
A Dictionary of Science, Oxford University Press, 5th edition, p. 737, (2005).
Office Action re Chinese application No. CN 201010206850.9, dated Jul. 3, 2012 (with English translation).
Notice of Allowance re U.S. Appl. No. 12/184,443, dated Jul. 18, 2012.
Non-final Office Action dated May 30, 2012 in U.S. Appl. No. 13/011,142.
Office Action re U.S. Appl. No. 12/184,388, dated Aug. 21, 2012.
Office Action re U.S. Appl. No. 12/184,432, dated Sep. 13, 2012.
Final Rejection re U.S. Appl. No. 12/699,240, dated Aug. 29, 2012.
Kao, C.J. et al., "Comparison of ZnO Metal-Oxide-Semiconductor Field Effect Transistor and Metal-Semiconductor Field Effect Transistor Structures Grown on Sapphire by Pulsed Laser Deposition," Journal of Vacuum Science & Technology, vol. B23, No. 3, 2005, pp. 1024-1028.
Ozgur, U. et al., "A Comprehensive Review of ZnO Materials and Devices," Journal of Applied Physics, vol. 98, No. 4, 2005, pp. 041301-1-041301-103.
European Search Report re Application No. EP 08016225.8, dated Oct. 1, 2012.
Final Rejection re U.S. Appl. No. 13/011,128, dated Sep. 25, 2012.
Final Rejection re U.S. Appl. No. 13/011,142, dated Nov. 27, 2012.
Office Action re U.S. Appl. No. 12/184,388, dated Feb. 1, 2013.
Office Action re U.S. Appl. No. 12/542,068, dated Jan. 22, 2013.
Office Action re U.S. Appl. No. 12/950,300, dated Jan. 22, 2013.
Office Action re Chinese application No. CN 201010206738.5, dated Mar. 4, 2013.
Final Rejection re U.S. Appl. No. 12/184,432, dated Apr. 17, 2013.
Notice of Allowance re U.S. Appl. No. 12/184,401, dated Apr. 19, 2013.

* cited by examiner a heat treatment temperature dependency of a crystallinity of ZnO
(XRD (002) intensity gas using for forming ZnO: Ar/$O_2$=50/5sccm)

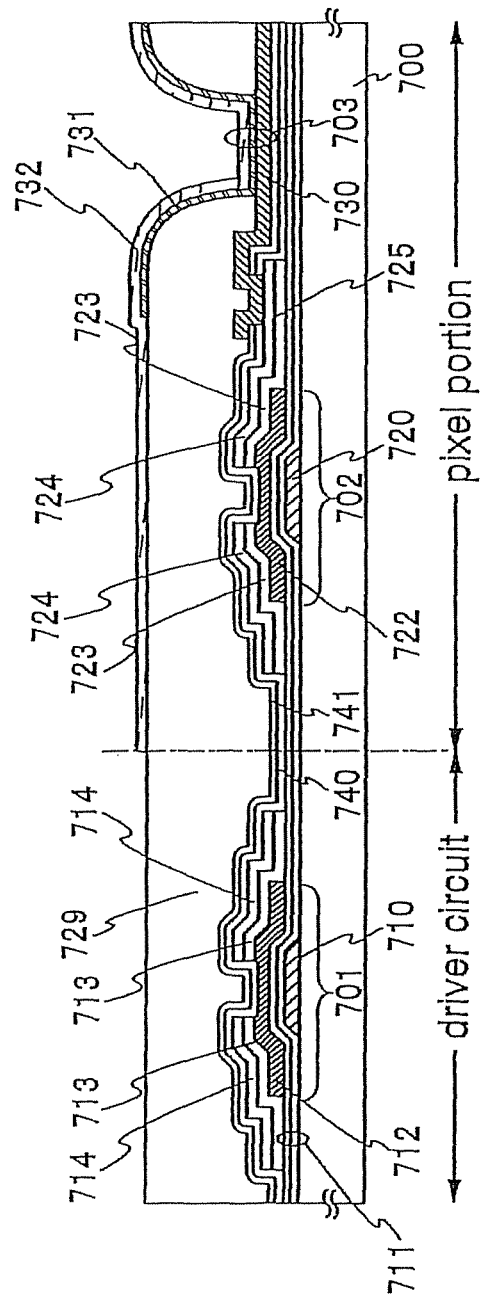

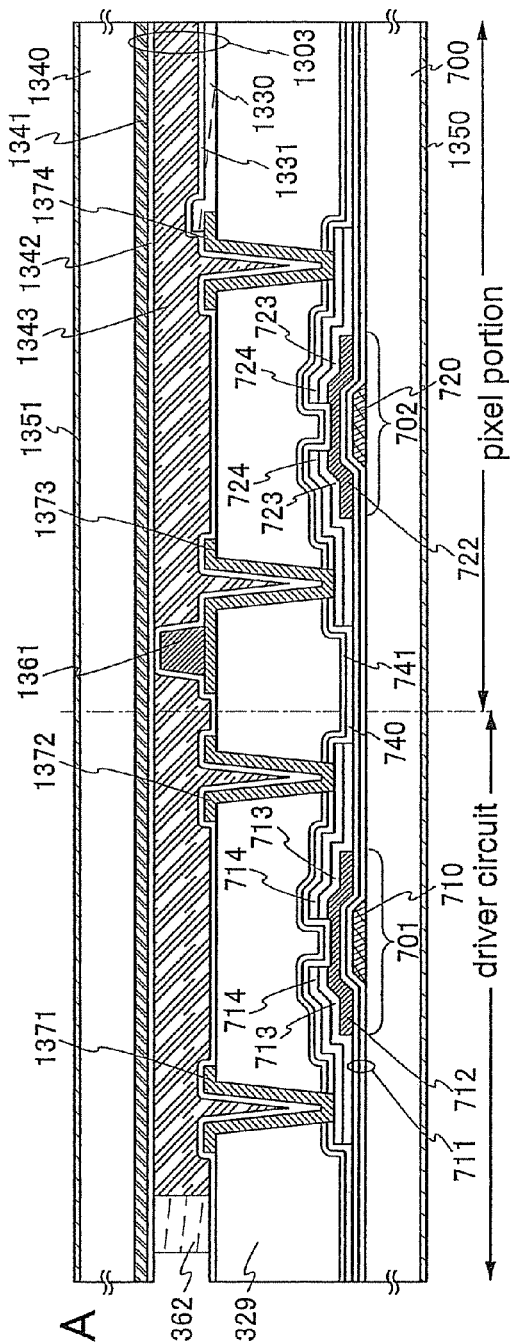
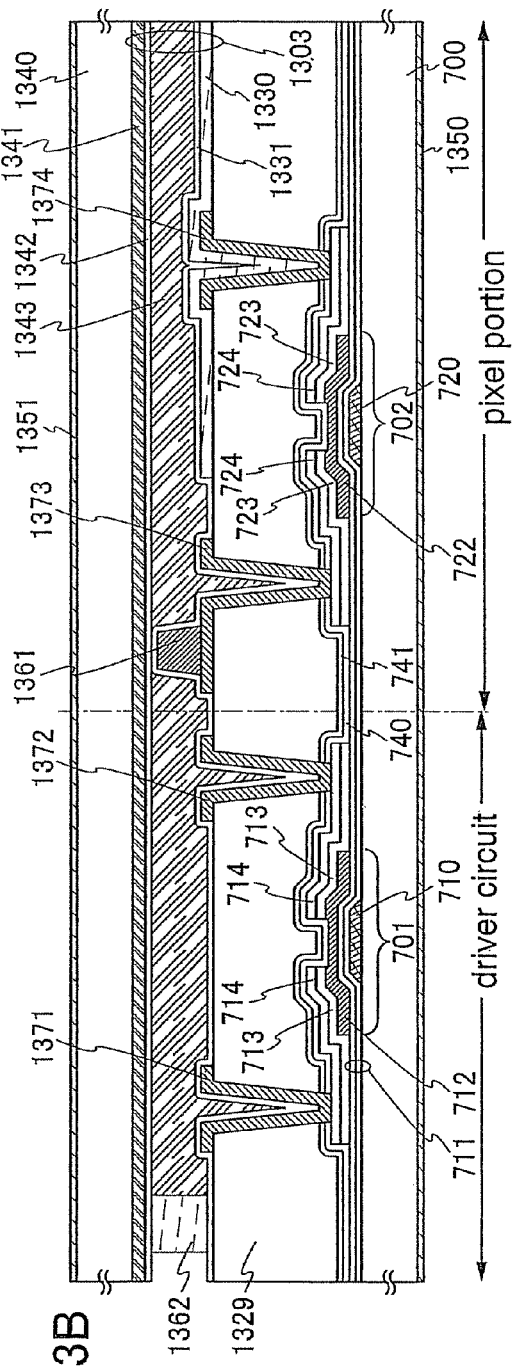
FIG. 13A
FIG. 13B pixel portion

SEMICONDUCTOR DEVICE AND MANUFACTURING METHOD THEREOF

This application is a continuation of copending U.S. application Ser. No. 12/184,388, filed on Aug. 1, 2008 which is a continuation of U.S. application Ser. No. 11/524,549, filed on Sep. 21, 2006 (now U.S. Pat. No. 7,674,650 issued Mar. 9, 2010).

BACKGROUND OF THE INVENTION

1. Field of the Invention

The present invention relates to a semiconductor device and a manufacturing method thereof and particularly relates to a semiconductor device using an oxide semiconductor. The present invention also relates to an electronic appliance equipped with the semiconductor device.

2. Description of the Related Art

Flat panel displays (FPD), typified by liquid crystal displays (LCD) and EL displays, have attracted attention as the display device replacing conventional CRTs. The development of large screen liquid crystal television mounted with an active matrix-driven large scale liquid crystal panel is particularly an important challenge which liquid crystal panel makers should focus on. In addition, large screen EL television is also being developed.

In the conventional liquid crystal device or electroluminescence display device (hereinafter referred to as a light emitting display device or an EL display device), a thin film transistor (hereinafter referred to as TFT) is used, which uses crystalline silicon or amorphous silicon as a semiconductor element driving each pixel.

A TFT using a crystalline silicon film has a higher mobility by two digits or more compared to a TFT using an amorphous silicon film, and has potential for high speed operation when it is used for a scanning line driver circuit for selecting a pixel of a light emitting display device, a signal line driver circuit for sending video signals to a selected pixel, or the like. However, using crystalline silicon for a semiconductor film complicates manufacturing steps because of crystallization of the semiconductor film compared to using amorphous silicon for the semiconductor film; therefore, there are drawbacks of yield decrease by that much and increase in cost. Further, a heating temperature for the crystallization is 550° C. or higher, and it is difficult to use a substrate made of a resin with a low melting point, a plastic substrate, or the like.

On the other hand, the TFT using amorphous silicon for a semiconductor film can be manufactured at low cost, since it is not heated at a high temperature and a resin substrate or a plastic substrate can be used. However, a mobility of only around 0.2 to 1.0 cm$^2$/V·s at most can be obtained with a TFT of which a channel forming region is formed with a semiconductor film formed of amorphous silicon, and it also has high power consumption.

A plasma CVD method is commonly used when an amorphous silicon film is formed over a substrate. Film formation by a plasma CVD method requires heating under high vacuum, and damage to a plastic substrate or an organic resin film over a substrate is a concern. In addition to the concern in forming the amorphous silicon film by a plasma CVD method, there is also a concern in forming the film by a sputtering method which is that a thin insulating film might be formed over a surface of an amorphous silicon film when the amorphous silicon film is exposed to atmospheric air.

As a material to replace a semiconductor made of such silicon, forming a TFT using an oxide semiconductor such as zinc oxide for a channel forming region has been reported in recent years (for example, refer to Patent Document 1: Japanese Patent Laid-Open No. 2000-150900, and Non-Patent document 1: Elvira M. C. Fortunato, et al. Applied Physics Letters, Vol. 85, No. 13, P2541 (2004)). Since the oxide semiconductor has mobility equal to or higher than that of a TFT formed with a semiconductor including amorphous silicon, further characteristic improvement is demanded.

SUMMARY OF THE INVENTION

In view of the foregoing problems, an object of the present invention is to provide a semiconductor device including a semiconductor element with improved characteristics and a manufacturing method thereof.

On another front, size increase in substrate has advanced for manufacturing a large-area device by a cheaper process, as in liquid crystal television. However, with the size increase in substrate, there is a problem of being easily effected by bending and warping. Also, when a substrate is heated to a high temperature during a heat treatment step, a size of the substrate becomes distorted due to warping and shrinking, and there is a problem of a decrease in precision of alignment in a photolithography step.

Consequently, an object of the present invention is to provide a technique that makes it possible to manufacture with good yield a semiconductor device over a large substrate, having for example a side longer than 1 meter, in a crystallization step of a semiconductor element used in a semiconductor device.

As mentioned above, an object of the present invention is to provide a semiconductor device including a semiconductor element with characteristics that are further improved, which can be manufactured at lower cost and more favorable productivity than before.

In the present invention, a compound semiconductor, more preferably an oxide semiconductor is used as a semiconductor. As the oxide semiconductor, for example, zinc oxide (ZnO), InGaO$_3$(ZnO)$_5$, magnesium zinc oxide (Mg$_x$Zn$_{1-x}$O), cadmium zinc oxide (Cd$_x$Zn$_{1-x}$O), cadmium oxide (CdO), an In—Ga—Zn—O based amorphous oxide semiconductor (a-IGZO), or the like is used. Also, the gist of the present invention is that by heating a gate electrode that is near the compound semiconductor by lamp rapid thermal annealing (LRTA; also simply called lamp heating), crystallization of the compound semiconductor is selectively promoted, and a TFT using a compound semiconductor having the region in which crystallization is promoted at least in a channel region can be manufactured.

One feature of the present invention is to have a gate electrode formed over a substrate, an insulating film formed covering the gate electrode, and an oxide semiconductor film formed over the insulating film. The oxide semiconductor film includes a first oxide semiconductor region and a second oxide semiconductor region, and the first oxide semiconductor region that is formed in a position which overlaps with the gate electrode has higher crystallinity than the second semiconductor region. Note that "crystallinity" expresses a degree of regularity of atomic arrangement inside of crystal, and when manufacturing a TFT using an oxide semiconductor film with favorable crystallinity (also expressed as having high crystallinity or with improved crystallinity), an electrical characteristic thereof is favorable.

One feature of the present invention is to have a gate electrode and an oxide semiconductor film over a substrate. In a region of the oxide semiconductor film which overlaps with the gate electrode via an insulating film, a portion of the region is crystallized.

One feature of the present invention is to have a gate electrode, an oxide semiconductor film, and a conductive film over a substrate. The conductive film is provided to be in contact with the oxide semiconductor film, and in a region of the oxide semiconductor film which overlaps with the gate electrode via an insulating film, a portion of the region is crystallized.

One feature of the present invention is to have a gate electrode over a substrate, an insulating film formed covering the gate electrode, and an oxide semiconductor film formed over the insulating film. The oxide semiconductor film is crystallized in at least a region which overlaps with the gate electrode. Note that "crystallization" refers to generation of crystal nuclei from an amorphous state, or growth of crystal grains from a state in which crystal nuclei have been generated.

One feature of the present invention is to have a gate electrode formed over a substrate, an insulating film formed covering the gate electrode, a conductive film formed over the insulating film, and an oxide semiconductor film formed over the insulating film and the conductive film. The oxide semiconductor film is crystallized in at least a region which overlaps with the gate electrode.

One feature of the present invention is to have a gate electrode formed over a substrate, an insulating film formed covering the gate electrode, a conductive film formed over the insulating film, and an oxide semiconductor film formed over the insulating film and the conductive film. The gate electrode has lower reflectivity with respect to a light source used for crystallization than the conductive film. Note that reflectivity comparison is used when the conductive film is a metal film or the like having a light shielding property.

One feature of the present invention is to have a gate electrode formed over a substrate, an insulating film formed covering the gate electrode, a conductive film formed over the insulating film, and an oxide semiconductor film formed over the insulating film and the conductive film. The gate electrode has higher heat absorption rate than the conductive film.

One feature of the present invention is to have a gate electrode formed over a substrate, an insulating film formed over the gate electrode, and an oxide semiconductor film formed over the insulating film, and by performing LRTA on the gate electrode, a portion of the oxide semiconductor film that overlaps with the gate electrode is crystallized.

One feature of the present invention is to have a gate electrode formed over a substrate, an insulating film formed covering the gate electrode, and an oxide semiconductor film formed over the insulating film. By performing LRTA on the gate electrode, a first oxide semiconductor region and a second oxide semiconductor region are formed inside of the oxide semiconductor film, and the first oxide semiconductor region that is formed in a position which overlaps with the gate electrode has higher crystallinity than the second oxide semiconductor region.

One feature of the present invention is to have a gate electrode formed over a substrate, an insulating film formed over the gate electrode, a conductive film formed over the insulating film, and an oxide semiconductor film formed over the insulating film and the conductive film. By performing LRTA on the gate electrode, a portion of the oxide semiconductor film is selectively crystallized.

One feature of the present invention is to have a gate electrode formed over a substrate, an insulating film formed covering the gate electrode, an oxide semiconductor film formed over the insulating film, and a conductive film formed over the oxide semiconductor film. By performing LRTA on the gate electrode, a portion of the oxide semiconductor film is selectively crystallized.

One feature of the present invention is to have agate electrode formed over a substrate, an insulating film formed covering the gate electrode, a conductive film formed over the insulating film, and an oxide semiconductor film formed over the insulating film and the conductive film. By performing LRTA on the gate electrode, a first oxide semiconductor region and a second oxide semiconductor region are formed inside of the oxide semiconductor film. At this time, the first oxide semiconductor region that is formed in a position which overlaps with the gate electrode has higher crystallinity than the second oxide semiconductor region.

One feature of the present invention is to have a gate electrode formed over a substrate, an insulating film formed covering the gate electrode, an oxide semiconductor film formed over the insulating film, and a conductive film formed over the oxide semiconductor film. By lamp heating the gate electrode, a first oxide semiconductor region and a second oxide semiconductor region are formed inside of the oxide semiconductor film. At this time, the first oxide conductive region that is formed in a position which overlaps with the gate electrode has higher crystallinity than the second oxide semiconductor region.

Note that the foregoing conductive film is formed with one element or a plurality of elements selected from Al, Ti, Cu, Au, Ag, Mo, Ni, Ta, Zr, and Co.

Note that it is favorable that the foregoing oxide semiconductor film includes at least zinc oxide (ZnO). For example, $InGaO_3(ZnO)_5$, $Mg_xZn_{1-x}O$, or $Cd_xZn_{1-x}O$ is given.

Note that the foregoing substrate is any one selected from an organic resin substrate, an inorganic resin substrate, a plastic substrate, and a glass substrate.

Note that the foregoing oxide semiconductor film is formed by a sputtering method.

Note that nitrogen may be added to the foregoing oxide semiconductor film. When adding nitrogen, nitrogen works as an acceptor impurity when the oxide semiconductor film shows an n-type semiconductor property. Consequently, a threshold voltage of a transistor manufactured using an oxide semiconductor film to which nitrogen is added, can be controlled.

One feature of the present invention is to use one of W, TaN, and Cr as a gate electrode, or an alloy including any one thereof.

One feature of the present invention is to perform crystallization of an oxide semiconductor film by irradiation with lamp light of a halogen lamp.

One feature of the present invention is to use light in a wavelength region of 800 nm to 2400 nm as lamp light. Also, wavelength in the visible light region or the infrared light region is used.

One feature of the present invention is a liquid crystal television or an EL television including the foregoing semiconductor device.

Also, in the present invention, a heating treatment may be performed by laser light irradiation instead of LRTA. For example, laser light irradiation may be performed using an infrared light laser, a visible light laser, an ultraviolet laser, or the like to selectively improve crystallinity of an oxide semiconductor film. Alternatively, laser light irradiation may be performed at the same time as performing lamp heating to selectively improve crystallinity of the oxide semiconductor film. When laser irradiation is used, a continuous wave laser beam (CW laser beam) or a pulsed laser beam (pulse laser beam) can be used. A laser beam that can be used here is one or a plurality of that which oscillates from a gas laser such as an Ar laser, Kr laser, or an excimer laser; a laser of which a medium is a monocrystalline YAG, YVO$_4$, forsterite (Mg$_2$SiO$_4$), YAlO$_3$, or GdVO$_4$ doped with one or more of Nd, Yb, Cr, Ti, Ho, Er, Tm, and Ta, or polycrystalline (ceramic) YAG, Y$_2$O$_3$, YVO$_4$, YAlO$_3$, or GdVO$_4$, doped with one or more of Nd, Yb, Cr, Ti, Ho, Er, Tin, and Ta; a glass laser; a ruby laser; an alexandrite laser; a Ti:sapphire laser; a copper vapor laser; and a gold vapor laser. By emitting a laser beam from the second harmonic to the fourth harmonic of the fundamental harmonic of such a laser beam, crystallinity can be made to be favorable. Note that it is preferable to use laser light having larger energy than a band gap of the oxide semiconductor film. For example, laser light emitted from a KrF, ArF, XeCl, or an XeF excimer laser oscillator may be used.

In the present invention, a semiconductor device refers to a device having a circuit including a semiconductor element (such as a transistor or a diode), and as the semiconductor device, an integrated circuit including a semiconductor element, a display device, a wireless tag, an IC tag, and the like are given. As the display device, a liquid crystal display device, a light emitting device, a DMD (digital micromirror device), a PDP (plasma display panel), an FED (field emission display), an electrophoresis display device (electronic paper), and the like are typically given.

In the present invention, a display device refers to a device using a display element, in other words, an image display device. Further, a module in which a connector, for example an FPC (flexible printed circuit), a TAB (tape automated bonding) tape, or a TCP (tape carrier package), is attached to a display panel; a module provided with a printed wiring board at an end of the TAB tape or the TCP; and a module in which an IC (integrated circuit) or a CPU is directly mounted on a display element by COG (chip on glass) method are all included as the display device.

In the present invention, it is acceptable as long as crystallization of an oxide semiconductor film is caused or crystallinity is improved in at least a channel forming region. Further, the entire channel forming region is not required to be crystallized, and it is acceptable as long as at least a portion of the channel forming region on a gate electrode side is crystallized.

Note that as the compound semiconductor, a nitride semiconductor or a carbide semiconductor may be used other than the oxide semiconductor. Further, a semiconductor having a light transmitting property with respect to visible light can also be used.

In the present invention, crystallinity of a channel forming region of an oxide semiconductor film is made to be favorable by heating a gate electrode by LRTA. As a result, the oxide semiconductor film is only heated locally; consequently, most of a substrate is not heated, and a crystallization step can be performed as shrinking and bending of the substrate are controlled. Consequently, a semiconductor device including a semiconductor element with improved mobility characteristic can be manufactured as the step is simplified.

Also, when forming a gate electrode over the substrate, forming an insulating film functioning as a gate insulating film over the gate electrode, forming a wiring having higher reflectivity with respect to a light source of LRTA than the gate electrode over the insulating film, and forming a oxide semiconductor film over the wiring, and then LRTA is performed towards a front surface or a rear surface of a substrate, the wiring is not heated as much as the gate electrode since it has higher reflectivity with respect to the light source of LRTA than the gate electrode. Therefore, a conductive film having a relatively low melting point such as copper, aluminum, or silver, which has low resistance, can be used for the wiring. As a result, an inexpensive semiconductor device can be provided.

Also, unlike the amorphous silicon film, an insulating film does not form over a surface of the oxide semiconductor film due to oxidation even if the surface is exposed to an atmosphere containing oxygen. Therefore, even if the oxide semiconductor film is exposed to atmospheric air after formation, there is little change to the film.

Further, when ZnO is used as the oxide semiconductor film, a heat treatment temperature in a crystallization step of the oxide semiconductor film can be around 350° C. or lower. This is because crystallization is sufficiently promoted for ZnO at a heat treatment temperature of around 350° C. or lower. As a result, even if a resin substrate is used, shrinking of the substrate can be suppressed. Also, lamp heating is performed on the gate electrode using a material having lower reflectivity with respect to light emitted from a lamp than a source wiring and a drain wiring. Consequently, while crystallinity of at least a channel forming region of ZnO is improved due to heat conducted from the gate electrode, the source wiring and the drain wiring are not easily heated; therefore, a material having a relatively low melting point can be used for the source wiring and the drain wiring. For example, since a heat treatment temperature of 350° C. or lower is sufficient when Al is used for the source wiring and the drain wiring, diffusion of Al to a semiconductor layer can be suppressed.

As in the above, since a semiconductor device can be manufactured by a low temperature heat treatment (around 350° C. or lower), it is inexpensive as a process.

Further, since the oxide semiconductor has a light transmitting property, by forming the source electrode, the drain electrode, and the like with a conductive film having a light transmitting property and then forming a pixel electrode thereover, an aperture ratio of a pixel portion can be improved. When zinc oxide is used as the oxide semiconductor, since resource of zinc oxide is more abundant than that of indium tin oxide (ITO) and since zinc oxide has lower resistance, a more inexpensive semiconductor device can be obtained by using zinc oxide instead of ITO as the pixel electrode. When silicon is used for a semiconductor film, in order to prevent the channel forming region from being irradiated with light, it is necessary to provide a light shielding film so as to overlap the channel forming region. As a result, a decrease in aperture ratio of a pixel portion is unavoidable. On the other hand, when zinc oxide is used for an oxide semiconductor film, since resource of zinc oxide is relatively abundant and since zinc oxide has a light transmitting property, by forming each of a source electrode, a drain electrode, and a pixel electrode using a transparent conductive material including indium tin oxide (ITO), ITSO made of indium tin oxide and silicon oxide, organic iridium, organic tin, zinc oxide, titanium nitride, or the like each having a light transmitting property, a large scale display with high aperture ratio in a transmissive type display panel can be obtained. Also, light from a backlight can be effectively used to save power. For example, by sticking a display panel over a window of a building or a windshield of an automobile, a train, an airplane, or the like, a head-up display in which an image or text information is directly displayed can be realized.

BRIEF DESCRIPTION OF DRAWINGS

In the accompanying drawings:

FIG. 7 is a cross sectional-view of a semiconductor device relating to the present invention;

FIGS. 13A and 13B are each a cross-sectional view of a semiconductor device relating to the present invention;

DETAILED DESCRIPTION OF THE INVENTION

Embodiment Mode

Figure 1A:
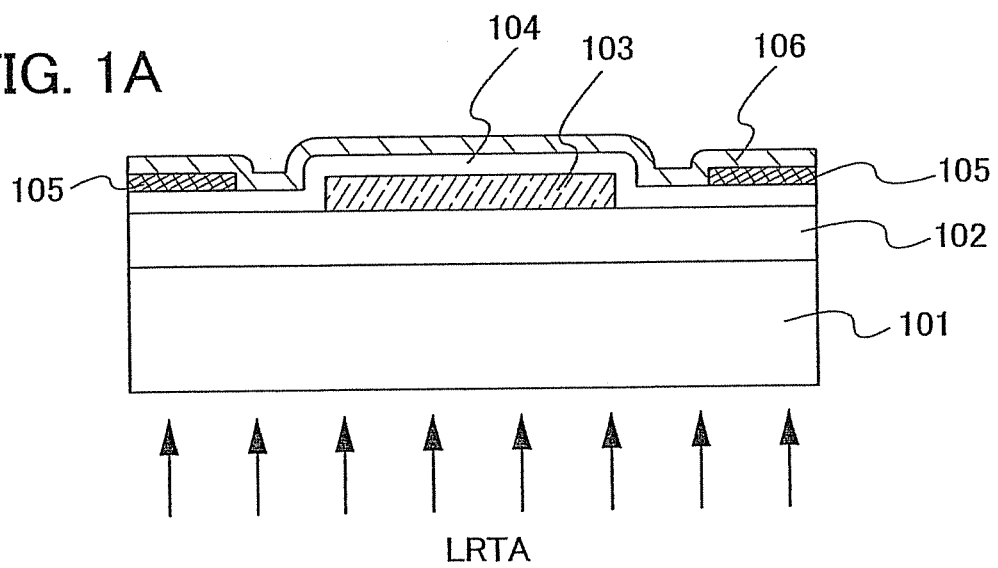
FIGS. 1A and B are each a cross-sectional view describing a manufacturing step of a semiconductor device relating to the present invention.

Embodiment modes of the present invention will hereinafter be described with reference to drawings. However, the invention is not limited to the following description, and it is easily understood by those skilled in the art that the modes and details can be changed in various ways without departing from the spirit and scope of the invention. Therefore, the invention is not interpreted limited to the following description of embodiment modes.

Embodiment Mode 1

In this embodiment mode, a manufacturing step of a TFT using a channel forming as a region of an oxide semiconductor film in which crystallinity is improved by LRTA, is described with reference to FIGS. 1A and 1B.

First, a base film 102 is formed over a substrate 101. For the substrate 101, glass, or plastic (synthetic resin) such as polyethylene terephthalate (PET), polyethylene naphthalate (PEN), polyether sulfone (PES), acrylic, or polyimide can be used.

As the base film 102, a single layer of an insulating film such as a silicon oxide film, a silicon nitride film, a silicon oxynitride film ($SiO_xN_y$) (x>y), or a silicon nitride oxide film ($SiN_xO_y$) (x>y), or stacked layers thereof are used. The base film 102 may be formed by a sputtering method or a CVD method. Note that the base film 102 is not always required to be provided, but it is preferable to form in the present invention. By forming the base film 102, conduction of heat generated from an electrode or a wiring formed over the base film 102 to the substrate 101 can be suppressed. As the base film 102, a silicon nitride oxide film with a thickness of 10 to 400 nm can be used, for example.

Subsequently, a gate electrode 103 is formed over the base film 102. The gate electrode 103 with a thickness of 100 to 200 nm may be formed by a sputtering method. The gate electrode 103 can be formed using an element selected from tantalum (Ta), tungsten (W), titanium (Ti), molybdenum (Mo), chromium (Cr), niobium (Nb), or the like, or an alloy material or a compound material mainly containing such an element. Further, the gate electrode 103 can also be formed with a semiconductor material typified by polycrystalline silicon doped with an impurity element such as phosphorous.

Subsequently, a gate insulating film 104 with a thickness of about 50 to 500 nm is formed to cover the gate electrode 103. The gate insulating film 104 may be formed to have a single layer structure of a film containing an oxide of silicon or a nitride of silicon, or as a stacked layer structure thereof, by a sputtering method or a variety of CVD methods such as a plasma CVD method. Specifically, a film containing silicon oxide ($SiO_x$), a film containing silicon oxynitride ($SiO_xN_y$), or a film containing silicon nitride oxide ($SiN_xO_y$) is formed as a single layer structure, or these films are appropriately stacked to form the gate insulating film 104. Also, the gate insulating film may be formed by performing high density plasma treatment on the gate electrode 103 under an atmosphere containing oxygen, nitrogen, or both oxygen and nitrogen and oxidizing or nitriding a surface of the gate electrode 103. The gate insulating film formed by a high density plasma treatment has excellent uniformity in its film thickness, film quality, and the like and the film can be formed to be dense. As the atmosphere containing oxygen, a mixed gas of a noble gas, oxygen ($O_2$), and nitrogen dioxide ($NO_2$), or dinitrogen monoxide ($N_2O$); or a mixed gas of a noble gas, hydrogen ($H_2$), and oxygen ($O_2$), nitrogen dioxide ($NO_2$), or dinitrogen monoxide ($N_2O$), can be used. Also, as the atmosphere containing nitrogen, a mixed gas of a noble gas and nitrogen ($N_2$) or ammonia ($NH_3$); or a mixed gas of a noble gas, hydrogen ($H_2$), and nitrogen ($N_2$) or ammonia ($NH_3$), can be used. By an oxygen radical (may also include an OH radical) or a nitrogen radical (may also include a NH radical) generated by the high density plasma treatment, the surface of the gate electrode 103 can be oxidized or nitrided.

When the gate insulating film 104 is formed by performing the high density plasma treatment, the insulating film with a thickness of 1 to 20 nm, preferably 5 to 10 nm, is formed covering the gate electrode 103. Since a reaction in this case is a solid-phase reaction, interface state density of between the gate insulating film 104 and the gate electrode 103 can be made to be extremely low. Further, since the gate electrode 103 is oxidized or nitrided directly, a thickness of the gate insulating film 104 to be formed can be uniform. Consequently, by solid-phase oxidation of the surface of the electrode by the high density plasma treatment shown here, an insulating film with favorable uniformity and low interface state density can be formed. Here, an oxide of an element selected from tantalum (Ta) tungsten (W), titanium (Ti), molybdenum (Mo), chromium (Cr), niobium (Nb), or the like; or an oxide of an alloy material or a compound material mainly containing the element functions as the gate insulating film 104.

Note that for the gate insulating film 104, just an insulating film formed by the high density plasma treatment may be used, or at least one of an insulating film of silicon oxide, silicon nitride containing oxygen, silicon oxide containing nitrogen, and the like may be stacked in addition thereover by a CVD method utilizing plasma or heat reaction. Either way, transistors each of which a gate insulating film is partially or entirely an insulating film formed by high density plasma can be made to have little variations in characteristic.

The gate insulating film 104 may use the following which have favorable compatibility with the oxide semiconductor film: alumina ($Al_2O_3$), aluminum nitride (AlN), titanium oxide ($TiO_2$), zirconia ($ZrO_2$), lithium oxide ($Li_2O$), potassium oxide ($K_2O$), sodium oxide ($Na_2O$), indium oxide ($In_2O_3$), yttrium oxide ($Y_2O_3$), or calcium zirconate ($CaZrO_3$); or a material including at least two thereof. The gate insulating film 104 may be formed as a single layer or as stacked layers of two or more layers.

Subsequently, a wiring 105 with a thickness of 50 to 200 nm is formed over the gate insulating film 104. As a wiring material, silver (Ag), aluminum (Al), gold (Au), copper (Cu), an alloy thereof, or the like is used. It is acceptable as long as the wiring material has higher reflectivity than that of the material used for the gate electrode 103, and the wiring material is appropriately combined and used taking into consideration the gate electrode 103. Note that the wiring may be formed to have a stacked layer structure. For example, aluminum and titanium may be stacked over the substrate in this order to form a wiring with a stacked layer structure. Titanium is effective in making an electrical contact property between the oxide semiconductor film and aluminum favorable. Titanium also takes on a role of suppressing diffusion of aluminum to the oxide semiconductor film. Also, the wiring may be formed with a transparent conductive film, such as for example indium tin oxide (ITO), indium tin oxide containing silicon oxide (ITSO), indium zinc oxide (IZO), indium oxide ($In_2O_3$), tin oxide ($SnO_2$), zinc oxide (ZnO), zinc oxide added with aluminum (AlZnO), zinc oxide added with gallium (GaZnO), or zinc oxide. Note that for the wiring 105, it is favorable to use a material having higher reflectivity or higher transmissivity (or lower heat absorption rate) with respect to lamp light than that of the gate electrode 103.

Next, an oxide semiconductor film 106 is formed over the gate insulating film 104 and the wiring 105. For the oxide semiconductor film 106, zinc oxide (ZnO) in an amorphous state, a polycrystalline state, or a microcrystalline state in which both amorphous and polycrystalline states exist, added with one type or a plurality of types of impurity elements selected from the following can be used: a Group 1 element (for example, lithium (Li), sodium (Na), potassium (K), rubidium (Rb), or cesium (Cs)), a Group 13 element (for example, boron (B), gallium (Ga), indium (In), or thallium (Tl)), a Group 14 element (for example, carbon (C), silicon (Si), germanium (Ge), tin (Sn), or lead (Pb)), a Group 15 element (for example, nitrogen (N), phosphorus (P), arsenic (As), antimony (Sb), or bismuth (Bi)), a Group 17 element (for example, fluorine (F), chlorine (Cl), bromine (Br), or iodine (I)), or the like. Alternatively, zinc oxide (ZnO) in an amorphous state, a polycrystalline state, or a microcrystalline state in which both amorphous and polycrystalline states exist, which is not added with any impurity element can also be used. Further, any of the following can also be used: $InGaO_3(ZnO)_5$, magnesium zinc oxide ($Mg_xZn_{1-x}O$), cadmium zinc oxide ($Cd_xZn_{1-x}O$), cadmium oxide (CdO), or an In—Ga—Zn—O based amorphous oxide semiconductor (a-IGZO). The oxide semiconductor film 106 is formed by forming a film with a thickness of 25 to 200 nm (preferably 30 to 150 nm) by a sputtering method under conditions of a pressure of 0.4 Pa and a flow rate of Ar (argon):$O_2$=50:5 (sccm) to form into a desired pattern, then subsequently etching the film using fluorinated acid diluted to 0:05%. Compared to a semiconductor film using an amorphous silicon film, the oxide semiconductor film 106 does not need to be formed under high vacuum since there is no concern for oxidation, and is inexpensive as a process. Note that since an oxide semiconductor film containing zinc oxide is resistant against plasma, a plasma CVD (also called PCVD or PECVD) method may be used to form the film. Among CVD methods, the plasma CVD method in particular uses a simple device, and has favorable productivity.

Figure 1B:
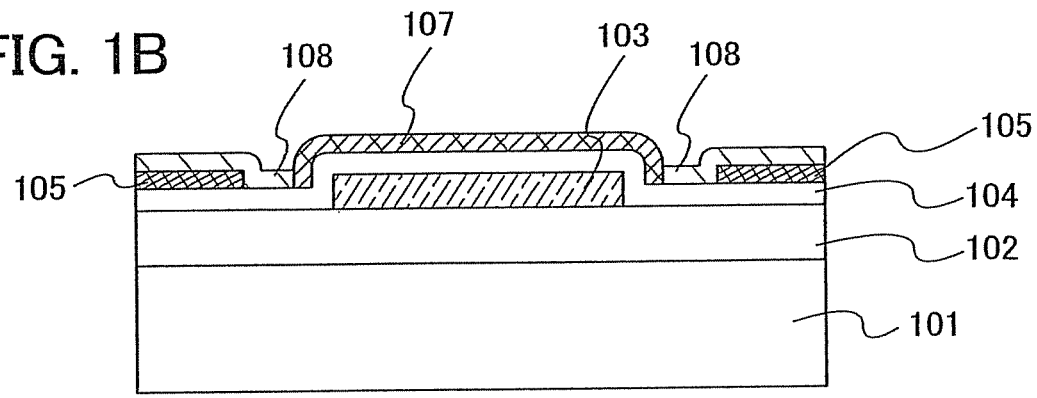

Subsequently, LRTA is performed towards a rear surface of the substrate 101 (FIG. 1A). LRTA is performed at 250° C. to 570° C. (preferably 300° C. to 400° C., more preferably 300° C. to 350° C.) for 1 minute to 1 hour, preferably 10 minutes to 30 minutes. LRTA is performed with radiation from one type or a plurality types of lamps selected from a halogen lamp, a metal halide lamp, a xenon arc lamp, a carbon arc lamp, a high pressure sodium lamp, and a high pressure mercury lamp. Since a heat treatment in a short amount of time is possible with an LRTA method, a material with a relatively low melting point can be used if reflectivity or transmissivity of the wiring 105 is higher than that of the gate electrode 103. For the LRTA method, light of a wavelength in the infrared light region, the visible light region, the ultraviolet light region, or the like can be used. Note that instead of LRTA, a heating treatment may be performed by laser light irradiation, and for example, laser light of an infrared light laser, a visible light laser, an ultraviolet laser, or the like may be used. Alternatively, LRTA and laser light irradiation may be combined to selectively improve crystallinity of the oxide semiconductor film. When laser irradiation is used, a continuous wave laser beam (CW laser beam) or a pulsed laser beam can be used. A laser beam that can be used here is one or a plurality of that which oscillates from a gas laser such as an Ar laser, Kr laser, or an excimer laser; a laser of which a medium is a monocrystalline YAG, $YVO_4$, forsterite ($Mg_2SiO_4$), $YAlO_3$, or $GdVO_4$ doped with one or more of Nd, Yb, Cr, Ti, Ho, Er, Tm, and Ta, or polycrystalline (ceramic) YAG, $Y_2O_3$, $YVO_4$, $YAlO_3$, or $GdVO_4$, doped with one or more of Nd, Yb, Cr, Ti, Ho, Er, Tm, and Ta; a glass laser; a ruby laser; an alexandrite laser; a Ti:sapphire laser; a copper vapor laser; and a gold vapor laser. By emitting a laser beam from the second harmonic to the fourth harmonic of the fundamental harmonic of such a laser beam, crystallinity can be made to be favorable. Note that it is preferable to use laser light having larger energy than a band gap of the oxide semiconductor film. For example, laser light emitted from a KrF, ArF, WeCl, or an XeF excimer laser oscillator may be used.

At this time, since the gate electrode 103 is formed with a material that has lower reflectivity with respect to lamp light and that which absorbs more heat than that of the wiring 105, the gate electrode 103 is heated to a higher temperature than the wiring 105. For this reason, the oxide semiconductor film 106 in a periphery of the gate electrode 103 is heated; consequently, a second oxide semiconductor region 108 and a first oxide semiconductor region 107 with more favorable crystallinity than the second oxide semiconductor region 108 are formed (see FIG. 1B). Here, the gate electrode 103 is irradiated with lamp light so as to be heated to around 300° C., and by that heat, the oxide semiconductor film 106 is crystallized to improve crystallinity. At this time, since a material with higher reflectivity or transmissivity with respect to lamp light than that of the gate electrode 103 is used, a temperature of the wiring 105 is 300° C. or less even if the oxide semiconductor film 106 is crystallized.

Figure 2:
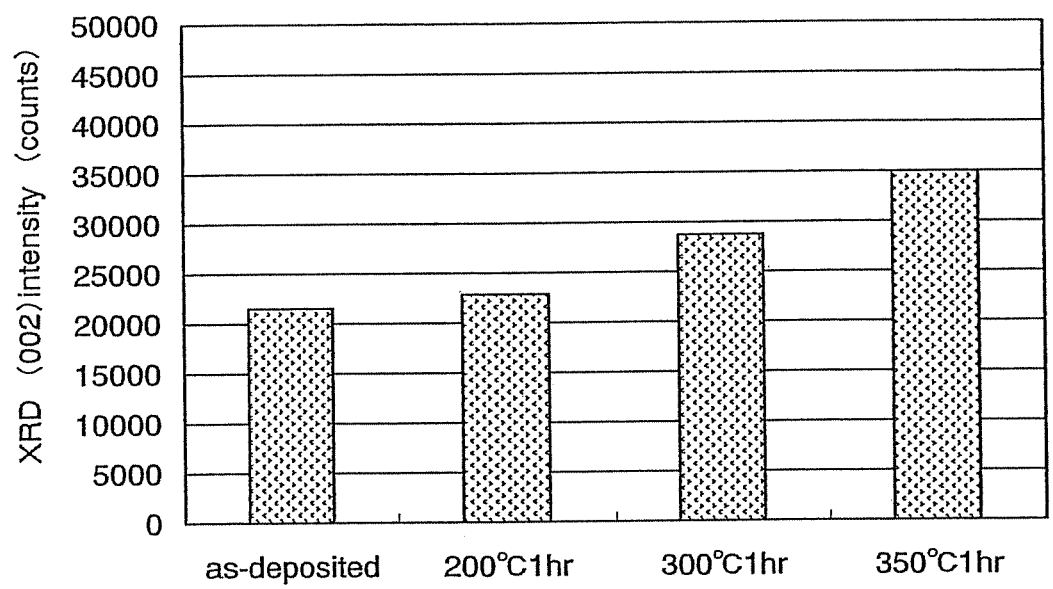
FIG. 2 is a diagram describing temperature dependency of crystallization of an oxide semiconductor film of the present invention.

Here, a heat treatment temperature dependency of a crystallinity of ZnO used as the oxide semiconductor film is shown in FIG. 2. FIG. 2 shows a result of measuring an X-ray intensity of a (002) surface in each of the following cases: a case where a deposition gas with a flow rate ratio of $Ar:O_2=50:5$ (sccm) is sprayed (as-deposited); and cases when the deposition gas is sprayed and then heated for 1 hour at each temperature of 200° C., 300° C., and 350° C. As heat treatment temperature rises, an intensity peak of the (002) surface is greater. Consequently, at least up to 35.0° C., crystallinity of ZnO increases as the heat treatment temperature rises. Since mobility increases in general as crystallization progresses, it is desirable to perform the heat treatment at around 350° C. Note that if there is no problem such as shrinking of the substrate, a heat treatment in which ZnO is heated to around 400° C. may be performed.

On the other hand in FIG. 1A, in a region in which the gate electrode 103 and the wiring 105 are not formed, in other words, in a region in which the substrate 101, the base film 102, the gate insulating film 104, and the oxide semiconductor film 106 are stacked, lamp light is transmitted through compared to a region in which the wiring 105 and the gate electrode 103 are formed; consequently, heat is not easily absorbed and a heating temperature is lower than that of the wiring 105. Consequently, since a large region of the substrate 101 is 350° C. or lower, shrinking does not occur easily. Note that the larger the region in which the gate electrode 103 is not formed, shrinking of the substrate 101 is suppressed.

Next, a semiconductor device is manufactured by forming an interlayer insulating film, a source electrode, a drain electrode, a pixel electrode, a light emitting element, and the like over the oxide semiconductor film 106.

In the present invention, when ZnO is used as a semiconductor, crystallinity of a ZnO layer is improved with a heat treatment temperature of about 300° C.; therefore, compared to when a crystalline silicon film is used as a semiconductor film, the heat treatment temperature is suppressed. Also, since an oxide semiconductor film having a high light transmitting property is used and a gate electrode is selectively heated by LRTA, most of a substrate is not heated and shrinking of the substrate can be suppressed. Further, since a material used for a wiring has higher reflectivity with respect to lamp light than that, of the gate electrode, crystallinity of the oxide semiconductor film can be improved even if a temperature to which the wiring is heated is suppressed to around 350° C. Therefore, an Al wiring which has a low melting point can be used. Also, formation of an insulating film due to diffusion of oxygen in the oxide semiconductor film to the Al can be prevented. Since the Al wiring is inexpensive and has low resistance, a semiconductor device with favorable performance can be manufactured at low cost and with favorable productivity.

Embodiment Mode 2

In this embodiment mode, a structure that is different from that in Embodiment Mode 1 is described with reference to FIGS. 3A to 3C. Note that steps of forming a base film 302, a gate electrode 303, and a gate insulating film 304 over a substrate 301 corresponds to the steps of forming the base film 102, the gate electrode 103, and the gate insulating film 104 over the substrate 101 of Embodiment Mode 1, respectively; therefore, refer to Embodiment Mode 1 for the steps.

A first oxide semiconductor film 305 is formed over the gate insulating film 304. For the oxide semiconductor film 305, zinc oxide (ZnO) in an amorphous state, a polycrystalline state, or a microcrystalline state in which both amorphous and polycrystalline states exist, added with one type or a plurality of types of impurity elements selected from Group 1 elements, Group 13 elements, Group 14 elements, Group 15 elements, and Group 17 elements can be used. Alternatively, zinc oxide (ZnO) in an amorphous state, a polycrystalline state, or a microcrystalline state in which both amorphous and polycrystalline states exist, which is not added with any impurity element can also be used. Further, any of the following can also be used: $InGaO_3(ZnO)_5$, magnesium zinc oxide ($Mg_xZn_{1-x}O$), cadmium zinc oxide ($Cd_xZn_{1-x}O$), cadmium oxide (CdO), or an In—Ga—Zn—O based amorphous oxide semiconductor (a-IGZO). Here, zinc oxide is formed to a thickness of 50 to 200 nm (preferably 100 to 150 nm) as the first oxide semiconductor film 305 by a sputtering method.

Figure 3A:
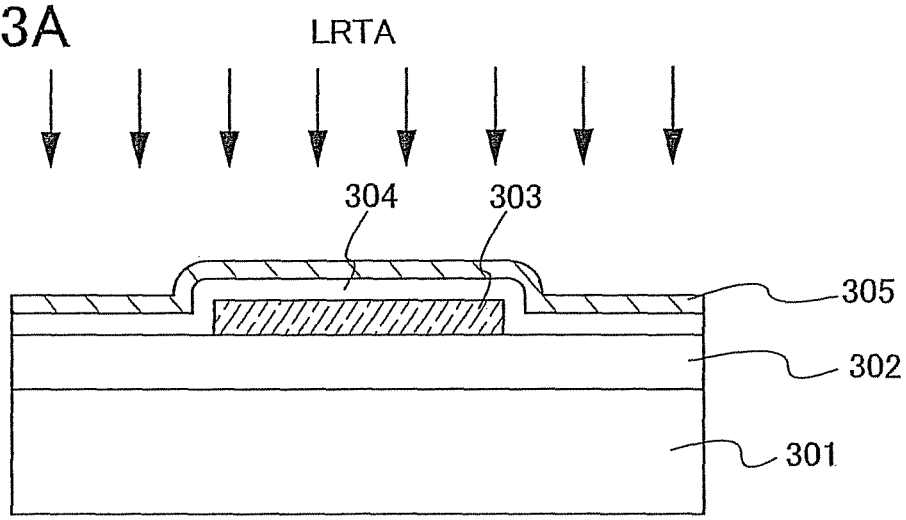
FIGS. 3A to 3C are each a cross-sectional view describing a manufacturing step of a semiconductor device relating to the present invention.
Figure 3B:
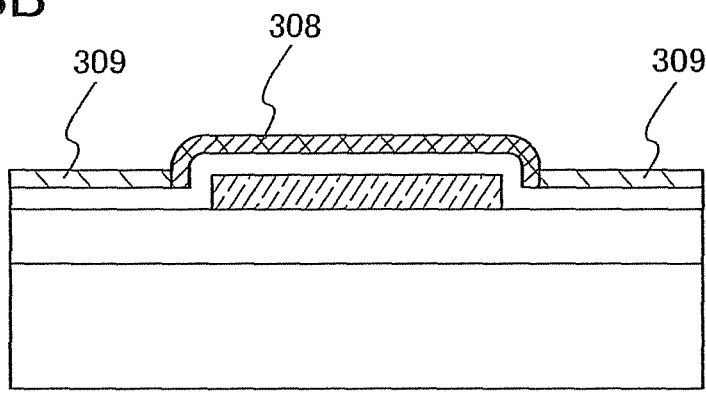
Figure 3C:
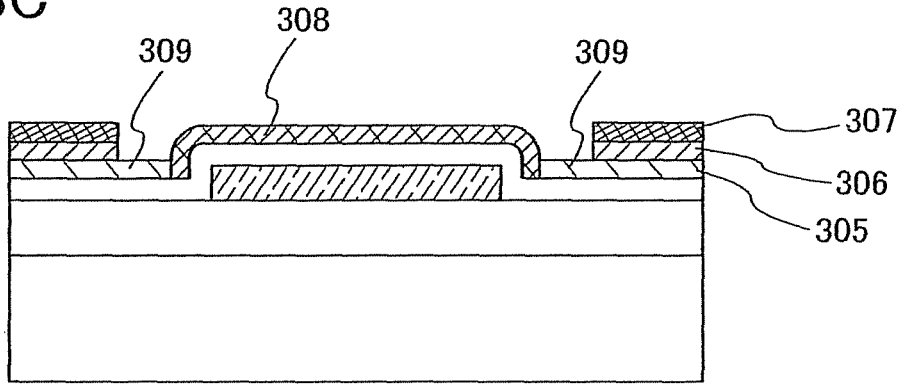

Subsequently, LRTA is performed towards a substrate surface to make crystallinity favorable (FIG. 3A). LRTA may be performed at 250° C. to 570° C. (preferably at 300° C. to 400° C., and more preferably at 300° C. to 350° C.) for 1 minute to 1 hour, preferably 10 minutes to 30 minutes. LRTA is performed with radiation from one type or a plurality of types of lamps selected from a halogen lamp, a metal halide lamp, a xenon arc lamp, a carbon arc lamp, a high pressure sodium lamp, and a high pressure mercury lamp. In this embodiment mode, lamp heating is performed on the gate electrode 303 for 30 minutes in an oxygen atmosphere so that the gate electrode becomes about 300° C., in order to improve crystallinity of a region of the first oxide semiconductor film 305 which overlaps the gate electrode 303 with the gate insulating film therebetween. Since the first oxide semiconductor film 305 has a light transmitting property, the gate electrode 303 is heated with priority, and crystallinity of the first oxide semiconductor film 305 increases from a periphery of the gate electrode 303 towards the outside. Then, as shown in FIG. 3B, a second oxide semiconductor film including a second oxide semiconductor region 309 and a first oxide semiconductor region 308 with more favorable crystallinity than the second oxide semiconductor region 309 are formed. Note that in FIG. 3A, although lamp heating is performed towards a front surface side of the substrate 301, LRTA may be performed towards a rear surface of the substrate. Since the oxide semiconductor film 305 has a light transmitting property, most region of the substrate is not easily heated even if LRTA is performed. Consequently, deformation such as shrinking of the substrate can be suppressed even if a resin with a low melting point or the like is used for the substrate. Note that crystallinity of a surface of the oxide semiconductor film and a periphery thereof may be improved directly by performing lamp heating towards the substrate surface with LRTA with increased output. Also, for the oxide semiconductor film overlapping with the gate electrode, a surface of the oxide semiconductor film on a gate insulating layer 304 side and a periphery thereof may be crystallized with priority when performing lamp heating towards the substrate surface, by adjusting wavelength of lamp light, reflectivity of the gate electrode, and film thickness of the oxide semiconductor film, so that lamp light reflecting off of the gate electrode is absorbed by the surface of the oxide semiconductor film on the gate insulating layer 304 side and the periphery thereof. Further, when a glass substrate is used for the substrate, lamp light used is of the visible light region to the infrared light region. Since light in these wavelength regions is not easily absorbed by the glass substrate, heating of the glass substrate can be suppressed to a minimum. Note that lamp heating may be performed a plurality of times. By performing lamp heating a plurality of times, heating time can be gained at the same time as suppressing a rise in a temperature of the substrate.

Note that instead of LRTA, crystallinity of the oxide semiconductor film may be selectively improved by laser light irradiation, ultraviolet irradiation, or by a combination thereof. When laser irradiation is used, a continuous wave laser beam (CW laser beam) or a pulsed laser beam (pulse laser beam) can be used. A laser beam that can be used here is one or a plurality of that which oscillates from a gas laser such as an Ar laser, Kr laser, or an excimer laser; a laser of which a medium is a monocrystalline YAG, $YVO_4$, forsterite $(Mg_2SiO_4)$, $YAlO_3$, or $GdVO_4$ doped with one or more of Nd, Yb, Cr, Ti, Ho, Er, Tm, and Ta, or polycrystalline (ceramic) YAG, $Y_2O_3$, $YVO_4$, $YAlO_3$, or $GdVO_4$, doped with one or more of Nd, Yb, Cr, Ti, Ho, Er, Tm, and Ta; a glass laser; a ruby laser; an alexandrite laser; a Ti:sapphire laser; a copper vapor laser; and a gold vapor laser. By emitting a laser beam from the second harmonic to the fourth harmonic of the fundamental harmonic of such a laser beam, crystallinity can be made to be favorable. Note that it is preferable to use laser light having larger energy than a band gap of the oxide semiconductor film. For example, laser light emitted from a KrF, ArF, XeCl, or an XeF excimer laser oscillator may be used.

Subsequently; over the first oxide semiconductor region 308 and the second oxide semiconductor region 309, Ti and Al are deposited by a sputtering method to form a Ti layer and an Al layer. After that, a wiring 306 and a wiring 307 are formed as a source wiring and a drain wiring by performing dry etching on the Ti layer and the Al layer using photolithography and $Cl_2$ gas (FIG. 3C). The wirings 306 and 307 are each formed to have a thickness of 10 to 200 nm by using an acceleration voltage of 1.5 kw, a pressure of 0.4 Pa, and Ar (flow rate of 30 sccm). Note that although the wirings 306 and 307 are formed as stacked layers, if materials used for the wiring 306 and 307 have favorable compatibility with the oxide semiconductor film 305, the wirings 306 and 307 may be formed in a single layer. As the material for each of the wirings 306 and 307, a metal such as aluminum (Al), tungsten (W), molybdenum (Mo), zirconium (Zr), hafnium (Hf), vanadium (V), niobium (Nb), tantalum (Ta), chromium (Cr), cobalt (Co), nickel (Ni), platinum (Pt), titanium (Ti), or neodymium (Nd), or an alloy or a metal nitride thereof can be appropriately used. Alternatively, a material having a light transmitting property such as indium tin oxide (ITO), indium zinc oxide (IZO), indium tin oxide containing silicon oxide (ITSO), indium oxide ($In_2O_3$), tin oxide ($SnO_2$), zinc oxide (ZnO), zinc oxide added with aluminum (AlZnO), zinc oxide added with gallium (GaZnO), or the like can be appropriately used.

Subsequently, a semiconductor device is manufactured by forming an interlayer insulating film, a wiring, a pixel electrode, a light emitting element and the like over the oxide semiconductor film 305, the wiring 306 and the wiring 307.

In this embodiment mode, a wiring is formed after performing LRTA on the oxide semiconductor film 305 to improve crystallinity. Therefore, a material having lower reflectivity with respect to lamp light than that of the gate electrode 303 may be used for the wiring 306, and the material for the wiring is not limited to those mentioned in Embodiment Mode 1 as long as it has favorable compatibility with the oxide semiconductor film 305.

Note that after the oxide semiconductor film 305 is formed, heating by LRTA may be performed before or after processing the oxide semiconductor film 305 into a desirable shape.

In the present invention, when zinc oxide is used for a semiconductor film, since crystallinity of the semiconductor film improves at a heat treatment temperature of around 300° C., heat treatment temperature can be suppressed and a crystallization step can be performed at low cost compared to when a crystalline silicon film is used as the semiconductor film. Further, since a gate electrode is selectively heated by LRTA using an oxide semiconductor film having a high light transmitting property, most of a substrate is not heated and shrinking of the substrate can be suppressed.

Embodiment Mode 3

An embodiment mode of the present invention is described with reference to FIGS. 4A to 5C. This embodiment mode is an example of a semiconductor device including a channel protective thin film transistor.

As a substrate 400, a glass substrate including barium borosilicate glass, alumino borosilicate glass, or the like; a silicon substrate; a plastic substrate having heat resistance; or a resin substrate is used. As the plastic substrate or the resin substrate, polyethylene terephthalate (PET), polyethylene naphthalate (PEN), polyether sulfone (PES), acrylic, polyimide, or the like can be used. Also, a surface of the substrate 400 may be polished by a CMP method so that the surface is planarized. Note that an insulating layer may be formed over the substrate 400. The insulating layer is formed to have a single layer structure or a stacked layer structure using at least one of an oxide material including silicon and a nitride material including silicon, by a known method such as a CVD method, a plasma CVD method, a sputtering method, or a spin coating method. This insulating layer is not necessarily formed, but it has effects of blocking contaminants and the like from the substrate 400, as well as suppressing conduction of heat to the substrate.

A conductive film 401 is formed over the substrate 400. The conductive film 401 is processed into a desired shape and becomes a gate electrode. The conductive film 401 is preferably formed by a method such as a printing method, an electrolytic plating method, or an evaporation method, using a material having a low reflectivity with respect to a wavelength of a light source used for LRTA heating (a material which easily absorbs heat, in other words, that which is easily heated). By using the material having a low reflectivity, a subsequent heating step becomes possible. As the conductive film 401, a metal such as tungsten (W), molybdenum (Mo), zirconium (Zr), hafnium (Hf), vanadium (V), niobium (Nb), tantalum (Ta), chromium (Cr), cobalt (Co), nickel (Ni), platinum (Pt), titanium (Ti), or neodymium (Nd), or an alloy or a metal nitride thereof can be appropriately used. Further, the conductive film 401 may have a stacked layer structure of a plurality of these layers. Typically, a tantalum nitride film may be stacked over a substrate surface, and then a tungsten film may be stacked thereover. Further, silicon added with an impurity element imparting one conductivity type may also be used. For example, an n-type silicon film of an amorphous silicon film including an impurity element imparting n-type such as phosphorus (P) can be used. The conductive film 401 is formed to have a thickness of 10 nm to 200 nm.

In this embodiment mode, the conductive film 401 is formed to have a thickness of 150 nm by a sputtering method using tungsten (W).

Figure 4A:
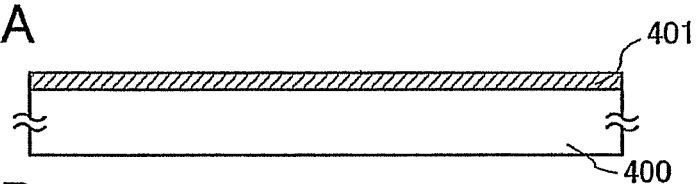
FIGS. 4A to 4H are each a cross-sectional view describing a manufacturing step of a semiconductor device relating to the present invention.
Figure 4B:
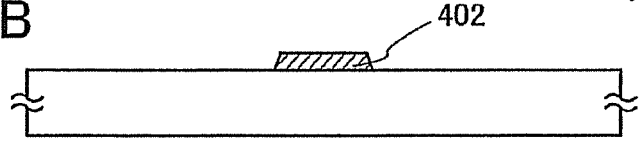
Figure 4C:
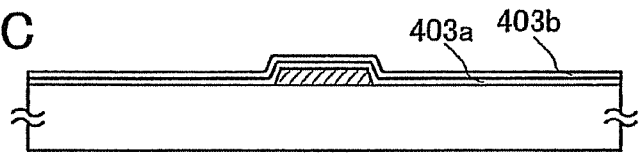

A mask made of a resist is formed over the conductive film 401 using a photolithography step; and the conductive film 401 is processed into a desired shape using the mask to form a gate electrode 402 (see FIG. 4B).

Subsequently, a gate insulating film 403a and a gate insulating film 403b are formed over the gate electrode 402 so as to have a stacked layer structure of two layers. The stacked insulating films may be formed consecutively in the same chamber without breaking a vacuum and under the same temperature, by changing reaction gases. By forming the insulating films consecutively without breaking the vacuum, contamination of an interface between the stacked films can be prevented.

For the gate insulating film 403a and the gate insulating film 403b, silicon oxide ($SiO_x$), silicon nitride ($SiN_x$), silicon oxynitride ($SiO_xN_y$) (x>y), silicon nitride oxide ($SiN_xO_y$) (x>y), or the like can be appropriately used. Also, instead of the gate insulating film 403a, the gate electrode 402 may be oxidized to form an oxide film. Note that to prevent diffusion of impurities and the like from the substrate, the gate insulating film 403a is preferably formed using silicon nitride ($SiN_x$), silicon nitride oxide ($SiN_xO_y$) (x>y), or the like. Further, the gate insulating film 403b is desirably formed using silicon oxide ($SiO_x$), silicon oxynitride ($SiO_xN_y$) (x>y), or the like. Note that in order to form a dense insulating film with little gate leak current at a low deposition temperature, it is favorable to include a noble gas element such as argon in a reaction gas so that the noble gas element is incorporated in the insulating film to be formed. In this embodiment mode, the gate insulating film 403a is formed using a silicon nitride film with a thickness of 50 nm to 140 nm that is formed with $SiH_4$ and $NH_3$ as reaction gases, and the gate insulating film 403b is formed using a silicon oxide film with a thickness of 100 nm that is formed with $SiH_4$ and $N_2O$ as reaction gases, and stacked thereover. Note that it is preferable that the gate insulating film 403a and the gate insulating film 403b each have a thickness of 50 nm to 100 nm.

Alternatively, the gate insulating film 403b may be formed using alumina ($Al_2O_3$) or aluminum nitride (AlN) each having favorable compatibility with an oxide semiconductor film to be subsequently formed. In this case, by using silicon oxide, silicon nitride, silicon oxynitride, silicon nitride oxide, or the like having a high insulating property for the gate insulating film 403a, and using alumina or aluminum nitride having a favorable interface property with respect to the oxide semiconductor film for the gate insulating film 403b, a high reliability gate insulating film can be formed. The gate insulating film may have three layers, and the third layer may be a gate insulating film using alumina or aluminum nitride.

Subsequently, an oxide semiconductor film 404 is formed over the gate insulating film 403b. The oxide semiconductor film 404 may be formed to have a thickness of 100 nm by a sputtering, method under the following conditions: a flow rate of $Ar:O_2$=50:5 (sccm), and a pressure of 0.4 Pa.

For the oxide semiconductor film 404, ZnO in an amorphous state, a polycrystalline state, or a microcrystalline state in which both amorphous and polycrystalline states exist, added with one type or a plurality of types of impurity elements selected from Group 1 elements, Group 13 elements, Group 14 elements, Group 15 elements, and Group 17 elements can be used. Alternatively, ZnO in an amorphous state, a polycrystalline state, or a microcrystalline state in which both amorphous and polycrystalline states exist which is not added with any impurity element can also be used. Further, any of the following can also be used: $InGaO_3(ZnO)_5$, magnesium zinc oxide ($Mg_xZn_{1-x}O$), cadmium zinc oxide ($Cd_xZn_{1-x}O$), cadmium oxide (CdO), or an In—Ga—Zn—O based amorphous oxide semiconductor (a-IGZO).

Note that when ZnO is used for the oxide semiconductor film 404, it is favorable that ZnO is added (doped) with nitrogen. ZnO normally shows an n-type semiconductor property. By adding nitrogen, since nitrogen works as an acceptor with respect to ZnO, a threshold voltage can be suppressed as a result.

Figure 4D:
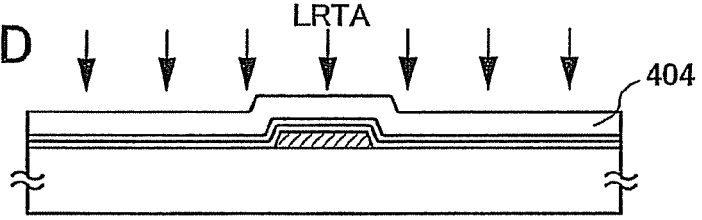
Figure 4E:
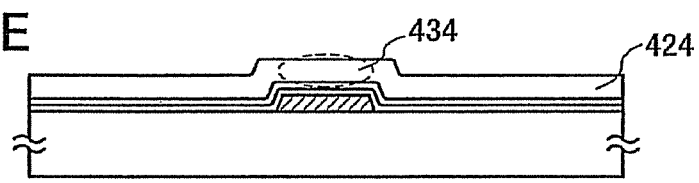

Subsequently, heating of the oxide semiconductor film 404 is performed towards a front surface or a rear surface of the substrate 400 by an LRTA method (see FIG. 4D). LRTA is performed with radiation from one or a plurality of lamps selected from a halogen lamp, a metal halide lamp, a xenon arc lamp, a carbon arc lamp, a high pressure sodium lamp, and a high pressure mercury lamp. LRTA is performed at 250° C. to 570° C. (preferably 300° C. to 400° C., more preferably 300° C. to 350° C.) for 1 minute to 1 hour, preferably 10 minutes to 30 minutes. In this embodiment mode, lamp heating is performed with a halogen lamp as a light source, and in an oxygen atmosphere at 300° C. for 30 minutes.

By performing LRTA, the gate electrode 402 is selectively heated in a short amount of time, and a first oxide semiconductor region with improved crystallinity is formed by heat thereof in a region 434 formed in a periphery of the gate electrode 402, which is indicated by a dotted line. On the other hand, a region 424 that is not the region 434 indicated by the dotted line is barely heated since there is little absorption of lamp light, and a second oxide semiconductor region having a different crystallinity from that of the first oxide semiconductor region (see FIG. 4E). Consequently, since only a region in which the gate electrode 402 is formed is selectively heated and the other region is not heated, shrinking and bending of the substrate 400 can be suppressed. Note that crystallinity in a periphery of the surface of the oxide semiconductor film may be improved directly by performing lamp heating towards the substrate surface with LRTA with increased output. Also, for the oxide semiconductor film overlapping with the gate electrode, a surface of the oxide semiconductor film on a gate insulating layer 403b side and a periphery thereof may be crystallized with priority when performing lamp heating towards the substrate surface, by adjusting wavelength of lamp light, reflectivity of the gate electrode, and film thickness of the oxide semiconductor film, so that lamp light reflecting off of the gate electrode is absorbed by the surface of the oxide semiconductor film on the gate insulating layer 403b side and the periphery thereof. Further, when a glass substrate is used for the substrate, lamp light used is of the visible light region to the infrared light region. Since light in these wavelength regions is not easily absorbed by the glass substrate, heating of the glass substrate can be suppressed to a minimum. Note that lamp heating may be performed a plurality of times. By performing lamp heating a plurality of times, heating time can be gained at the same time as suppressing a rise in a temperature of the substrate.

Note that instead of LRTA, crystallinity of the oxide semiconductor film may be selectively improved by laser light irradiation, ultraviolet irradiation, or by a combination thereof. When laser irradiation is used, a continuous wave laser beam (CW laser beam) or a pulsed laser beam (pulse laser beam) can be used. A laser beam that can be used here is one or a plurality of that which oscillates from a gas laser such as an Ar laser, Kr laser, or an excimer laser; a laser of which a medium is a monocrystalline YAG, YVO$_4$, forsterite (Mg$_2$SiO$_4$), YAlO$_3$, or GdVO$_4$ doped with one or more of Nd, Yb, Cr, Ti, Ho, Er, Tm, and Ta, or polycrystalline (ceramic) YAG, Y$_2$O$_3$, YVO$_4$, YAlO$_3$, or GdVO$_4$, doped with one or more of Nd, Yb, Cr, Ti, Ho, Er, Tm, and Ta; a glass laser; a ruby laser; an alexandrite laser; a Ti:sapphire laser; a copper vapor laser; and a gold vapor laser. By emitting a laser beam from the second harmonic to the fourth harmonic of the fundamental harmonic of such a laser beam, crystallinity can be made to be favorable. Note that it is preferable to use laser light having larger energy than a band gap of the oxide semiconductor film. For example, laser light emitted from a KrF, ArF, XeCl, or an XeF excimer laser oscillator may be used.

Figure 4F:
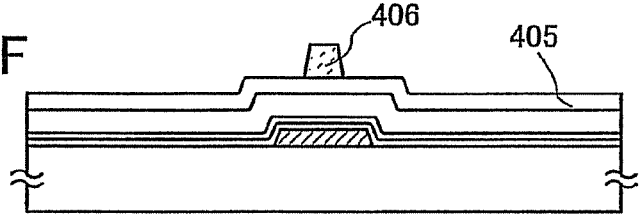
Figure 4G:
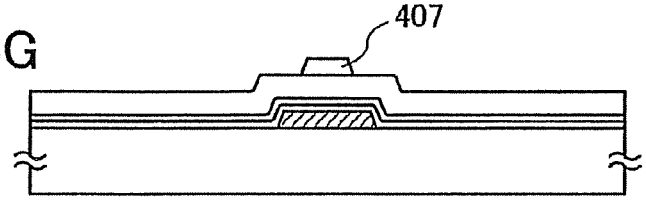
Figure 4H:
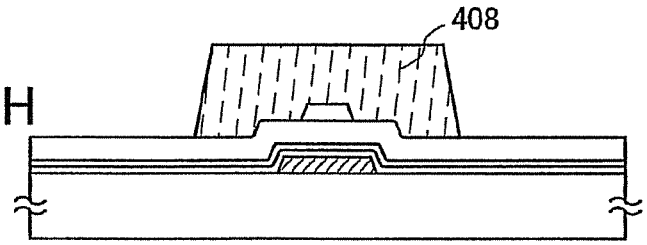

Subsequently, a protective film 405 is formed over the oxide semiconductor film 404, and a resist 406 is formed over the protective film 405 (see FIG. 4F). By a photolithography step using the resist 406 as a mask, the protective film 405 is processed into a desired shape to form a channel protective film 407. As the channel protective film, silicon oxide (SiO$_x$), silicon nitride (SiN$_x$), silicon oxynitride (SiO$_x$N$_y$) (x>y), silicon nitride oxide (SiN$_x$O$_y$) (x>y), or the like can be appropriately used. By forming the channel protective film 407, a semiconductor layer of a channel portion can be prevented from being etched when a source electrode and a drain electrode are formed. In this embodiment mode, silicon nitride is formed as the protective film 405, and then the channel protective film 407 is formed (see FIG. 4G).

Figure 5A:
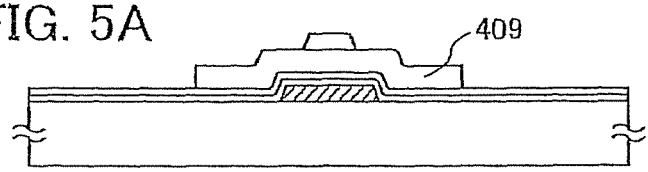
FIGS. 5A to 5C are each a cross-sectional view describing a manufacturing step of a semiconductor device relating to the present invention.
Figure 5B:
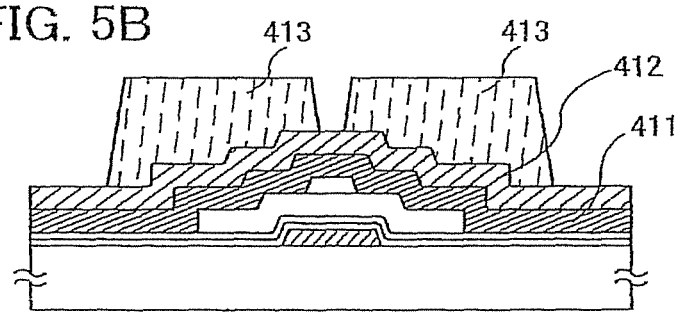
Figure 5C:
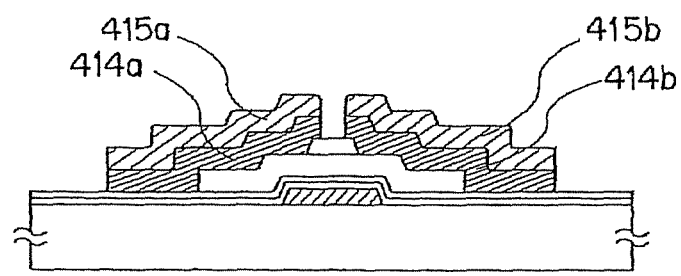

Subsequently, a mask 408 is manufactured with a resist (FIG. 4H), and etching is performed on the oxide semiconductor film 404 to process into a desired shape by a photolithography step using the mask 408, to form an oxide semiconductor film 409 (also called island-shaped oxide semiconductor film) (FIG. 5A). Note that diluted fluorinated acid is used for the etching. Subsequently, a first conductive film 411 and a second conductive film 412 are formed over the oxide semiconductor film 409, and a mask 413 is formed by a photolithography step with a resist (FIG. 5B). The first conductive film 411 and the second conductive film 412 are processed into desired shapes using the mask 413, and first conductive films 414a and 414b, and second conductive films 415a and 415b each functioning as a source electrode or a drain electrode are formed (FIG. 5C).

As the mask, a commercially available resist material including a photosensitizing agent may be used. For example, a typical positive type resist, such a novolac resin or a naphthoquinone diazide compound which is a photosensitizing agent; or a negative type resist, such as a base resin, diphenylsilanediol, or an acid generator may be used. In using any of the materials, surface tension and viscosity thereof is appropriately adjusted by adjusting a concentration of a solvent, or by adding a surfactant or the like. Also, when a conductive material including a photosensitive substance having photosensitivity is used for the conductive films, the conductive films can be processed into desired shapes by being subjected to direct laser light irradiation, exposure, and removal with an etchant, without forming a mask from resist. In this case, there is an advantage that a step is simplified since a mask is not required to be formed.

As the conductive material including a photosensitive substance, a material including a metal such as Ag, Au, Cu, Ni, Al, or Pt, or an alloy thereof; an organic high molecular compound resin; a photo polymerization initiator; a photopolymerization monomer; and a photosensitive resin made of a solvent or the like, may be used. As the organic high molecular resin, a novolac resin, an acrylic copolymer, a methacrylic copolymer, a cellulose derivative, a cyclic rubber resin, or the like is used.

Note that before forming the first conductive film 411, one more layer of a conductive film made of for example zinc oxide added with aluminum (AlZnO) or zinc oxide added with gallium (GaZnO) may be provided, as an n-type semiconductor, over the oxide semiconductor film 404. By forming the conductive film made of AlZnO or GaZnO, compatibility between the first conductive film 411 and the oxide semiconductor film 409 becomes favorable, and a contact resistance between the oxide semiconductor film 409 and a source electrode and a drain electrode can be reduced. Alternatively, for example, a stacked layer structure of forming Ti over GaZnO, or forming GaZnO over Ti may be provided.

As the first conductive films 414a and 414b and the second conductive films 415a and 415b, a metal such as aluminum (Al), tungsten (W), molybdenum (Mo), zirconium (Zr), hafnium (Hf), vanadium (V), niobium (Nb), tantalum (Ta), copper (Cu), chromium (Cr), cobalt (Co), nickel (Ni), platinum (Pt), titanium (Ti), or neodymium (Nd), or an alloy or a metal nitride thereof can be appropriately used. For example, the following combinations of the first conductive films 414a, 414b and the second conductive films 415a, 415b can be considered: Ti and Al; Ta and W; TaN and Al; and TaN and Cu; as the first conductive films and the second conductive films, respectively. Also, a combination of a third conductive film using Ti in addition to the first conductive films using Ti and the second conductive films using Al can be considered. Further, an AgPdCu alloy may be used for one of a first layer and a second layer. Furthermore, a structure may be a three-layer stacked layer structure of sequentially stacking W, an alloy of Al and Si (Al—Si), and TiN. Note that tungsten nitride, an alloy film of Al and Ti (Al—Ti), and Ti may be used instead of W, the alloy of Al and Si (Al—Si), and TiN, respectively. In order to improve heat resistance, an element such as titanium, silicon, scandium, neodymium, or copper may be added to aluminum at 0.5 to 5 atomic %.

As a conductive material to form the first conductive film 411 and the second conductive film 412, a material having a light transmitting property such as indium tin oxide (ITO), indium zinc oxide (IZO), indium tin oxide containing silicon oxide (ITSO), indium oxide (In$_2$O$_3$), tin oxide (SnO$_2$), or zinc oxide (ZnO), or an appropriate combination thereof may be used.

In this embodiment mode, the first conductive film 411 and the second conductive film 412 are formed after LRTA is performed on the oxide semiconductor film 305 and crystallinity thereof is improved. Therefore, a material having lower reflectivity with respect to lamp light than that of the gate electrode 402 may be used for the first, conductive film 411 and the second conductive film 412, and a conductive material for a wiring or an electrode is not limited to those mentioned in Embodiment Mode 1 as long as it has favorable compatibility with the oxide semiconductor film 305.

In this embodiment mode, either plasma etching (dry etching) or wet etching may be employed for an etching process; however, plasma etching is suitable for treating a substrate with a large area. As an etching gas, a fluorinated acid based gas such as CF$_4$, NF$_3$, SF$_6$, or CHF$_3$; a chlorine based gas typified by Cl$_2$, BCl$_3$, SiCl$_4$, CCl$_4$, or the like; or an O$_2$ gas may be used, to which an inert gas such as He or Ar may be appropriately added. Also, by applying an etching process using atmospheric pressure discharge, electric discharge machining is possible locally, and a mask layer is not required to be formed on the an entire surface of the substrate.

Before applying the resist in the photolithography step of this embodiment mode, an insulating film with a thickness of about several nm may be formed over a surface of the oxide semiconductor film. By this step, the oxide semiconductor film and the resist coming into direct contact with each other can be avoided, and entering of impurities included in the resist into the oxide semiconductor film can be prevented.

By the above steps, a bottom gate type (also called reverse staggered type) thin film transistor in which a semiconductor layer of a channel portion is not etched can be manufactured. Note that although a bottom gate type TFT is manufactured, in this embodiment mode, a top gate type TFT may be formed as long as crystallinity of at least a channel forming region of an oxide semiconductor film can be improved by heating a gate electrode that is formed over an oxide semiconductor film formed over a substrate, with a gate insulating film therebetween.

This embodiment mode can be appropriately combined with Embodiment Modes 1 and 2.

Embodiment Mode 4

An embodiment mode of the present invention is described with reference to FIGS. 6A to 6F. This embodiment mode is an example of a semiconductor device according to Embodiment Mode 3 having a channel etch type thin film transistor. Therefore, repeated description of the same portions or the portions having similar functions is omitted.

Figure 6A:
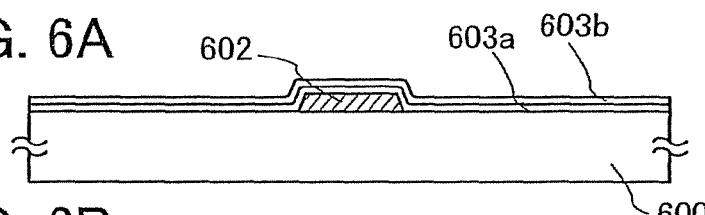
FIGS. 6A to 6F are each a cross-sectional view describing a manufacturing step of a semiconductor device relating to the present invention.
Figure 6B:
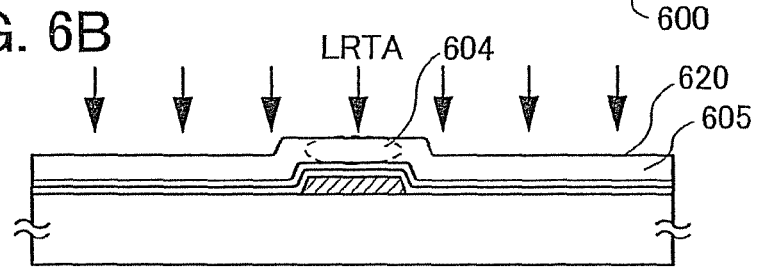
Figure 6C:
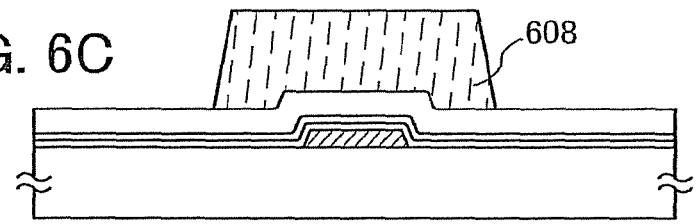
Figure 6D:
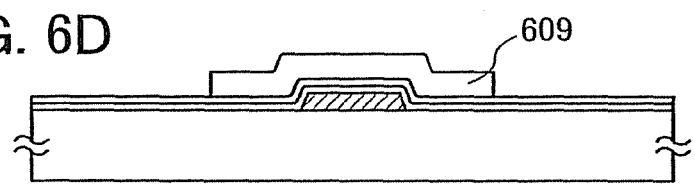
Figure 6E:
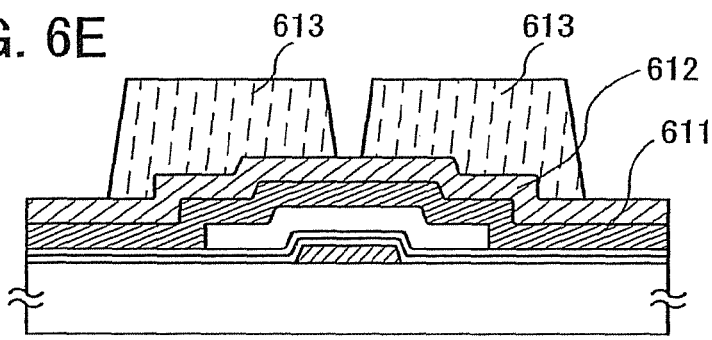

A gate electrode 602 is formed over a substrate 600, and a gate insulating film 603a and a gate insulating film 603b are formed covering the gate electrode 602 (FIG. 6A). An oxide semiconductor film 620 is formed over the gate insulating film 603b, and LRTA is performed towards a substrate surface to form an oxide semiconductor film 620 including a first oxide semiconductor region 604 with improved crystallinity in a region indicated by a dotted line, and a second oxide semiconductor region 605 in which crystallization is not as progressed as the first oxide semiconductor region 604 (see FIG. 6B). A mask 608 is provided over the oxide semiconductor film (FIG. 6C), and the oxide semiconductor film is processed into a desired shape by a photolithography step to form an oxide semiconductor film 609 (FIG. 6D).

Next, a first conductive film 611 and a second conductive film 612 are formed. Then, a mask 613 made of a resist is formed (see FIG. 6E). In this embodiment mode, conductive films containing, titanium and aluminum are formed by a sputtering method as each of the first conductive film 611 and the second conductive film 612.

Figure 6F:
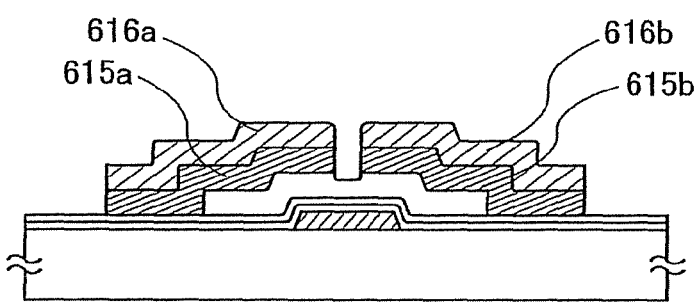

Subsequently, the first conductive film 611 and the second conductive film 612 are processed into a desired shape using the mask 613 by a photolithography step, and first conductive films 615a and 615b, and second conductive films 616a and 616b each functioning as a source electrode or a drain electrode are formed (FIG. 6F).

By the above steps, a thin film transistor in which a semiconductor layer of a part of a channel portion is etched can be manufactured.

Note that in this embodiment mode, one more layer of a conductive film made of for example zinc oxide added with aluminum (AlZnO) or zinc oxide added with gallium (GaZnO) may be provided as an n-type oxide semiconductor, between the oxide semiconductor film and the first conductive film 611. Alternatively, for example, a stacked layer structure of forming Ti over GaZnO, or forming GaZnO over Ti may be provided. By forming an n-type oxide semiconductor film, connection between the first conductive film 611 that becomes a source electrode or a drain electrode and the oxide semiconductor film can be made to be favorable, and a contact resistance can be reduced.

This embodiment mode can be appropriately combined with Embodiment Modes 1 to 3.

Embodiment Mode 5

In this embodiment mode, a light emitting device which a bottom gate type thin film transistor formed in Embodiment Mode 3 or Embodiment Mode 4 is connected to a pixel electrode is described with reference to FIG. 7. Note that a thin film transistor of this embodiment mode is a channel-etched type.

FIG. 7 shows a cross-sectional view of a TFT used in a driver circuit and a cross-sectional view of a TFT used in a pixel portion. A reference numeral 701 denotes a cross-sectional view of a TFT used in a driver circuit, a reference numeral 702 denotes a cross-sectional view of a TFT used in a pixel portion, and a reference numeral 703 denotes across-sectional view of a light emitting element provided with a current by the TFT 702. The TFTs 701 and 702 are bottom gate types.

The TFT 701 of the driver circuit includes a gate electrode 710 formed over a substrate 700; a gate insulating film 711 covering the gate electrode 710; and an oxide semiconductor film 712 containing zinc oxide which overlaps with the gate electrode 710 with the gate insulating film 711 interposed therebetween. Further, the TFT 701 includes first conductive films 713 each functioning as a source electrode or a drain electrode, and second conductive films 714 each functioning as a source electrode or a drain electrode. Note that the first conductive films 713 and the second conductive films 714 also function as wiring.

In FIG. 7, the gate insulating layer 711 is formed of two layers of insulating films; however, the present invention is not limited to this structure. The gate insulating film 711 may be formed with a single layer of an insulating film or three or more layers of insulating films.

The second conductive films 714 are formed with aluminum or an alloy containing aluminum. Also, the second conductive films 714 that are a pair face each other with a channel forming region of the oxide semiconductor film 712 in therebetween.

Further, the first conductive films 713 are formed with titanium. The first conductive films 713 are not required to be provided; however, electrical contact property of the second conductive film 711 with the oxide semiconductor film 712 becomes favorable. Also, the first conductive films 713 have a function as barrier layers for preventing diffusion of oxygen in the oxide semiconductor film 712 to the second conductive films 714. As a result, reliability of a TFT can be improved. Note that an oxide semiconductor film is known to show an n-type without performing anything thereto. Therefore, the first oxide semiconductor film in which a channel is formed may have its conductivity type controlled in advance so as to be close to an i-type (also called as an intrinsic-type that is defined as a conductivity type having an equal number of negative and positive charges) as much as possible, by adding an impurity imparting p-type conductivity.

The TFT 702 of the pixel portion includes a gate electrode 720 formed over the substrate 700, the gate insulating film 711 covering the gate electrode 720, and an oxide semiconductor film 722 which overlaps with the gate electrode 720 with the gate insulating film 711 interposed therebetween. Further, the TFT 702 includes first conductive films 723 each functioning as a source electrode or a drain electrode, and second conductive films 724 each functioning as a source electrode or a drain electrode.

The second conductive films 724 are formed with aluminum or an alloy containing aluminum. Also, the second conductive films 724 that are a pair face each other with a region in which a channel of the oxide semiconductor film 722 is formed in between.

Further, the first conductive films 723 are formed with titanium. The first conductive films 723 are not required to be provided; however, electrical contact property of the second conductive film 724 with the oxide semiconductor film 722 becomes favorable. Also, the first conductive films 723 have a function as barrier layers for preventing diffusion of oxygen in the oxide semiconductor film 722 to the second conductive films 724. As a result, reliability of a TFT can be improved. Note that an oxide semiconductor film is known to show an n-type without performing anything thereto. Therefore, the first oxide semiconductor film in which a channel is formed may have its conductivity type controlled in advance so as to be close to an i-type as much as possible, by adding an impurity imparting p-type conductivity.

Also, a first passivation film 740 and a second passivation film 741 each formed of an insulating film are formed covering the TFTs 701 and 702. The first passivation film 740 and the second passivation film 741 can be formed by a thin film formation method such as a plasma CVD method or a sputtering method, using an insulating material such as silicon nitride, silicon oxide, silicon nitride oxide, silicon oxynitride, aluminum oxynitride, aluminum oxide, diamond-like carbon (DLC), nitrogen-containing carbon (CN), or the like. The passivation films covering the TFTs 701 and 702 is not limited to two layers, and a single layer or three or more layers may be provided. For example, the first passivation film 740 and the second passivation film 741 can be formed of silicon nitride and silicon oxide, respectively. By forming a passivation film of silicon nitride or silicon nitride oxide, entering of impurities from outside into a semiconductor element can be prevented, and degradation of the TFTs 701 and 702 due to an effect of moisture or the like can be prevented. In this embodiment mode, the first passivation film 740 and the second passivation film 741 are consecutively formed in the same chamber by performing gas switching.

Next, one of the second conductive films 724 is connected to a pixel electrode of a light emitting element 703.

Subsequently, an insulating layer 729 (also called partition, or bank) is selectively formed. The insulating layer 729 is formed so as to have an opening portion over the pixel electrode 730 and so as to cover the second passivation film 741. In this embodiment mode, the insulating layer 729 is formed covering an entire surface, and then etched using a mask of a resist or the like to form into a desired shape.

The insulating layer 729 can be formed with an inorganic insulating material such as silicon oxide, silicon nitride, silicon oxynitride, aluminum oxide, aluminum nitride, or aluminum oxynitride; an inorganic siloxane based insulating material having an Si—O—Si bond among compounds made of silicon, oxygen, and hydrogen, using a siloxane based material as a starting material; or an organic siloxane based material, in which hydrogen bonded with silicon is substituted with an organic group such as methyl or phenyl. Also, the insulating layer 729 may be formed using a photosensitive or a non-photosensitive material such as an acrylic resin, or a polyimide resin. The insulating layer 729 preferably has a form of which a curvature radius changes continuously, so that coatability of an electric field light emitting layer 731 and an opposing electrode 732 are improved.

Subsequently, the electric field light emitting layer 731 is formed over the pixel electrode 730 so as to be in contact therewith. As the electric field light emitting layer 731, materials showing light emission of red (R), green (G), and blue (B), respectively, are each selectively formed by an evaporation method or the like using an evaporation mask. The materials showing light emission of red (R), green (G), and blue (B), respectively, are preferable since they can be formed by a droplet discharging method in a similar manner to a color filter (such as a low molecular compound or a high molecular compound), and in this case, RGB can be applied separately without using a mask. Note that other than a three-color combination of RGB, the combination may be with four colors by adding emerald green. Also, vermilion may be added. Further, a pixel including an EL element that emits white light may be combined.

The opposing electrode 732 is formed so as to be in contact with the electric field light emitting layer 731. Note that although the light emitting element 703 includes an anode and a cathode, one is used as a pixel electrode, and the other is used as an opposing electrode. In this way, a light emitting device having a display function using a light emitting element is completed.

In the present invention, since a channel forming region of an oxide semiconductor film includes at least a crystallized region, a TFT having higher mobility than that of a TFT using an amorphous silicon film can be obtained. Also, since a crystallization step is performed at a lower temperature than that of a TFT using a crystalline silicon film, it is inexpensive as a process.

This embodiment mode can be appropriately combined with Embodiment Modes 1 to 4.

Embodiment Mode 6

In this embodiment mode, a liquid crystal display device in which a semiconductor element made of the bottom gate type thin film transistor to which the present invention is applied and a pixel electrode are connected, is described with reference to FIGS. 13A to 18B. Note that Embodiment Mode 5 can be referred to regarding the formation up to the second passivation film 741; therefore, the same reference numerals are used as those of FIG. 7, and descriptions thereof are omitted.

As in FIG. 13A, after the second passivation film 741 is formed, an insulating layer 1329 is formed so as to cover the second passivation film 741.

Subsequently, wirings 1371, 1372, 1373, and 1374 connected to the second conductive films 714 and 724, respectively, are formed via contact holes. Then, the second conductive films 724 are electrically connected to a pixel electrode 1330 of a liquid crystal element 1303 via the wiring 1374. For the pixel electrode 1330, in a case of manufacturing a transmissive type liquid crystal display panel, indium oxide containing tungsten oxide, indium zinc oxide containing tungsten oxide, indium oxide containing titanium oxide, indium tin oxide containing titanium oxide, or the like can be used. Of course, indium tin oxide (ITO), indium zinc oxide (IZO), indium tin oxide added with silicon oxide (ITSO), or the like can be used. Also, in a case of manufacturing a reflective type display panel, as a metal thin film having a reflective property, a conductive film made of titanium, tungsten, nickel, gold, platinum, silver, aluminum, magnesium, calcium, lithium, an alloy thereof, or the like can be used. The pixel electrode 1330 can be formed by an evaporation method, a sputtering method, a CVD method, a printing method, a droplet discharging method, or the like.

Further, an orientation film 1331 is formed over the pixel electrode 1330 so as to be in contact therewith. Under a second substrate 1340 facing the first substrate 700 with the pixel electrode 1330 therebetween, an opposing electrode 1341 and an orientation film 1342 are stacked in this order. Also, a liquid crystal 1343 is provided between the pixel electrode 1330 and the orientation film 1331 and between the opposing electrode 1341 and the orientation film 1342, and a portion where the pixel electrode 1330, the liquid crystal 1343, and the opposing electrode 1341 overlap each other corresponds to a liquid crystal element 1303. Note that the pixel electrode 1330 may be formed to extend over the TFT 702, as shown in FIG. 13B. Since an oxide semiconductor film has a light transmitting property with respect to visible light when a transparent conductive film including indium tin oxide (ITO), ITSO made of indium tin oxide and silicon oxide, organic indium, organic tin, zinc oxide, titanium nitride, or the like each having a light transmitting property, an aperture ratio of a pixel portion can be improved.

Note that a distance (cell gap) between the pixel electrode 1330 and the opposing electrode 1341 is controlled by a spacer 1361. Although in FIG. 13A, the spacer 1361 is formed by processing an insulating film provided on a first substrate 700 side into a desired shape, spacers prepared separately may be dispersed over the orientation film 1331 to control the cell gap. A reference numeral 1362 denotes a sealant, and by the sealant 1362, the liquid crystal 1343 is sealed between the first substrate 700 and the second substrate 1340.

Further, on a surface of the first substrate 700 that is not the surface over which the TFT 701 and the TFT 702 are formed, a polarizing plate 1350 is provided. Also, on a surface of the second substrate 1340 that is not the surface over which the opposing electrode 1341 is formed, a polarizing plate 1351 is provided. Note that the number of orientation films and polarizing plates, and positions thereof in a liquid crystal display device of the present invention are not limited to those shown in a structure of FIG. 13A.

In the present invention, since at least crystallization of a channel forming region of an oxide semiconductor film is improved, a TFT having higher mobility than that of a TFT using an amorphous silicon film can be obtained. Also, since a crystallization step is performed at a lower temperature than that of a TFT using a crystalline silicon film, it is inexpensive as a process. Further, since crystallinity of the oxide semiconductor film is selectively increased by lamp heating, the time it takes for crystallization can be shortened compared to when the entire oxide semiconductor film is crystallized. Therefore, yield can be increased. Also, since crystallization is performed selectively and in a short amount of time, shrinking of a substrate does not occur easily, and a substrate having a relatively low melting point such as a resin substrate can be used. Consequently, a TFT can be manufactured at low cost.

Also, since the channel forming region does not absorb visible light, unnecessary photocarriers are not generated. Therefore, a TFT with excellent light resistance can be formed.

Figure 14A:
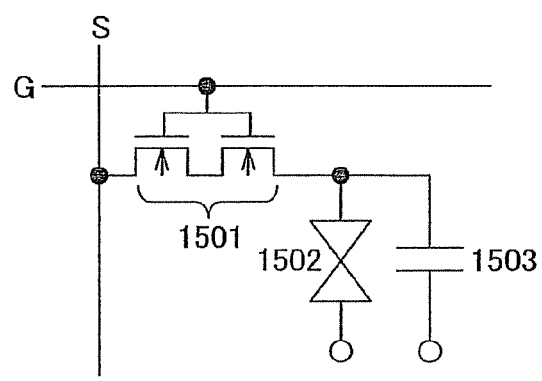
FIGS. 14A and 14B are each a circuit diagram and a cross-sectional view of a pixel in a semiconductor device of the present invention.

Subsequently, a different structure of a pixel included in a liquid crystal display device of the present invention is described. FIG. 14A shows one mode of a circuit diagram of the pixel, and FIG. 14B shows one mode of a cross-sectional structure of the pixel corresponding to FIG. 14A.

Figure 14B:
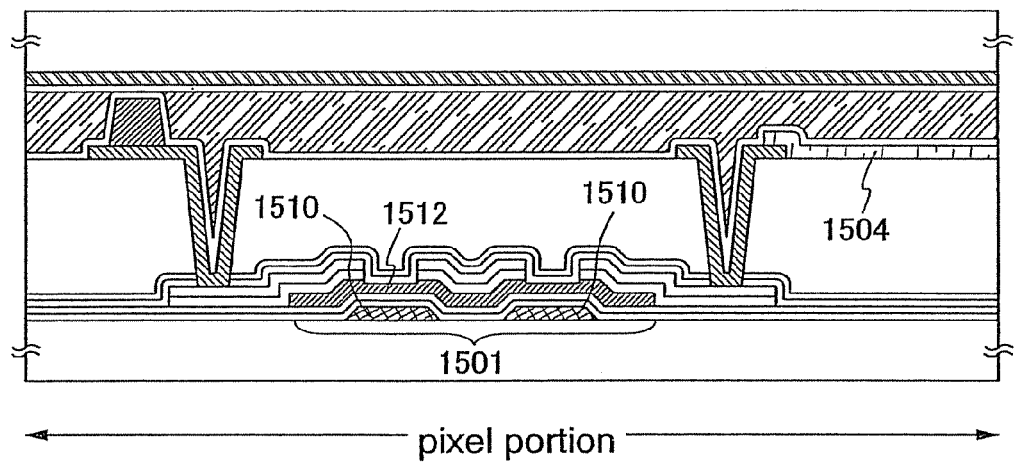

In FIGS. 14A and 14B, a reference numeral 1501 denotes a switching TFT for controlling input of video signal to the pixel, and a reference numeral 1502 denotes a liquid crystal element. Specifically, potential of a video signal that is input to the pixel via the switching TFT 1501 is supplied to a pixel electrode of the liquid crystal element 1502. Note that a reference numeral 1503 denotes a capacitor element for retaining voltage between the pixel electrode of the liquid crystal element 1502 and an opposing electrode when the switching TFT 1501 is turned off.

Specifically, gate electrodes of the switching TFT 1501 are connected to a scanning line G, and one of a source region and a drain region is connected to a signal line S, and the other is connected to a pixel electrode 1504 of the liquid crystal element 1502. One of two electrodes included in the capacitor element 1503 is connected to the pixel electrode 1504 of the liquid crystal element 1502, and the other is supplied with a constant potential, desirably a potential that is of the same level as that of the opposing electrode.

Figure 15:
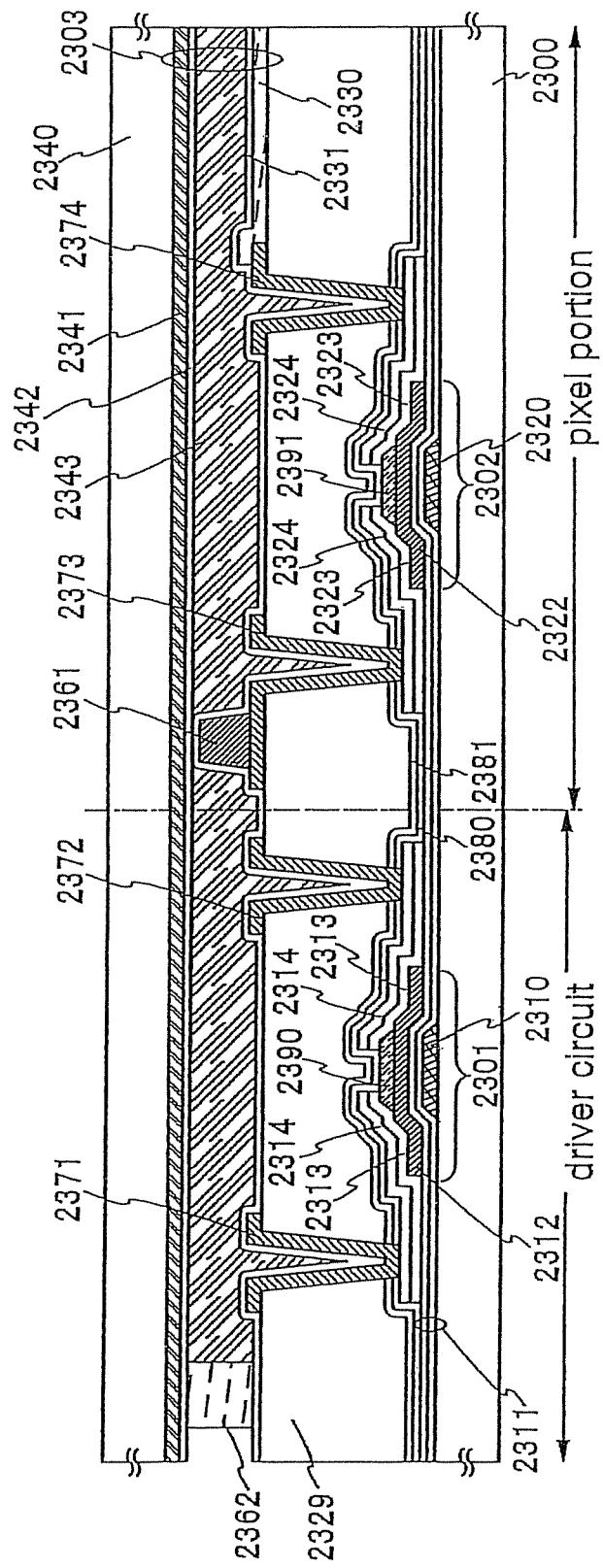
FIG. 15 is a cross-sectional view of a semiconductor device relating to the present invention.

Note that in FIGS. 14A and 14B, a structure is that of a multi-gate structure in which the switching TFT 1501 is serially connected and a plurality of TFTs to which gate electrodes 1510 are connected share an oxide semiconductor film 1512. By having the multi-gate structure, an off current of the switching TFT 1501 can be reduced. Specifically, although in FIGS. 14A and 14B, a structure of the switching TFT 1501 is that of two TFTs being serially connected to each other, it may be a multi-gate structure in which three or more TFTs are serially connected to each other, and in which the gate electrodes are also connected. Further, the switching TFT is not required to have a multi-gate structure, and it may be a TFT of a regular single-gate structure in which one gate electrode and one channel forming region are provided Next, a mode of a TFT included in a liquid crystal display device of the present invention that is different from that of FIGS. 13A to 14B is described. FIG. 15 shows a cross-sectional view of a TFT used in a driver circuit, and a cross-sectional view of a TFT used in a pixel portion. A reference numeral 2301 denotes the cross-sectional view of a TFT used in a driver circuit, a reference numeral 2302 denotes the cross-sectional view of a TFT used in a pixel portion, and a reference numeral 2303 denotes a cross-sectional view of a liquid crystal element.

The TFT 2301 of the driver circuit includes a gate electrode 2310 formed over a substrate 2300, a gate insulating film 2311 covering the gate electrode 2310, and an oxide semiconductor film 2312 including a crystallized region in at least a channel forming region, that overlaps with the gate electrode 2310 with the gate insulating film 2311 therebetween. Also, the TFT 2302 of the pixel portion includes a gate electrode 2320 formed over the substrate 2300, the gate insulating film 2311 covering the gate electrode 2320, and an oxide semiconductor film 2322 including a crystallized region in at least a channel forming region, that overlaps with the gate electrode 2320 with the gate insulating film 2311 therebetween. Further, channel protective films 2390 and 2391 formed of insulating films are formed so as to cover the channel forming regions of the oxide semiconductor films 2312 and 2322. The channel protective films 2390 and 2391 are provided to prevent the channel forming regions of the oxide semiconductor films 2312 and 2322 from getting etched during manufacturing steps of the TFT 2301 and 2302. Furthermore, the TFT 2301 includes first conductive films 2313 each functioning as a source electrode or a drain electrode and, second conductive films 2314 each functioning as a source electrode or a drain electrode; and the TFT 2302 includes first conductive films 2323 each functioning as a source electrode or a drain electrode and second conductive films 2324 each functioning as a source electrode or a drain electrode. Note that the first conductive films 2313 and 2323, and the second conductive films 2314 and 2324 function as wirings layers.

In FIG. 15, the gate insulating layer 2311 is formed of two layers of insulating films; however the present invention is not limited to this structure. The gate insulating film 2311 may be formed with a single layer of an insulating film or three or more layers of insulating films.

The second conductive films 2314 and 2324 are formed with aluminum or an alloy containing aluminum. Also, the second conductive films 2314 that are a pair and the second conductive films 2324 that are a pair face each other with a region in which a channel of the oxide semiconductor film 2322 is formed in between.

Further, the first conductive films 2313 and 2323 are formed with titanium. The first conductive films 2313 and 2323 are not required to be provided; however, electrical contact property of the second conductive films 2314 and 2324 with the oxide semiconductor films 2312 and 2322 becomes favorable. Also, the first conductive films 2313 and 2323 have a function as barrier layers for preventing diffusion of oxygen in the oxide semiconductor films 2312 and 2322 to the second conductive films 2314 and 2324. As a result, reliability of a TFT can be improved. Note that the oxide semiconductor films 2312 and 2322 are known to show an n-type without performing anything thereto. Therefore, the first oxide semiconductor films in which channels are formed may have their conductivity type controlled in advance so as to be close to an i-type as much as possible, by adding an impurity imparting p-type conductivity.

Also, a first passivation film 2380 and a second passivation film 2381 each formed of an insulating film are formed covering the TFTs 2301 and 2302. The first passivation film 2380 and the second passivation film 2381 can be formed by a thin film formation method such as a plasma CVD method or a sputtering method, using an insulating material such as silicon nitride, silicon oxide, silicon nitride oxide, silicon oxynitride, aluminum oxynitride, aluminum oxide, diamond-like carbon (DLC), nitrogen-containing carbon (CN), etc. The passivation films covering the TFTs 2301 and 2302 are not limited to two layers, and a single layer or three or more layers may be provided. For example, the first passivation film 2380 and the second passivation film 2381 can be formed with silicon nitride and silicon oxide, respectively. By forming a passivation film with silicon nitride or silicon nitride oxide, entering of impurities from outside into a semiconductor element can be prevented, and degradation of the TFTs 2301 and 2302 due to an effect of moisture or the like can be prevented. In this embodiment mode, the first passivation film 2380 and the second passivation film 2381 are consecutively formed in the same chamber by performing gas switching.

Subsequently, an insulating layer 2329 is formed covering the second passivation films 2381. Next, wirings 2371, 2372, 2373, and 2374 connected to the second conductive films 2314 and 2324, respectively, are formed via contact holes. Then, the conductive film 2324 is electrically connected to a pixel electrode 2330 of the liquid crystal element 2302 via the wiring 2374.

An orientation film 2331 is formed over the pixel electrode 2330 so as to be in contact there with. Under a second substrate 2340 facing the first substrate 2300 with the pixel electrode 2330 therebetween, an opposing electrode 2341 and an orientation film 2342 are stacked in this order. Also, a liquid crystal 2343 is provided between the pixel electrode 2330 and the orientation film 2331 and between the opposing electrode 2341 and the orientation film 2342, and a portion where the pixel electrode 2330, the liquid crystal 2343, and the opposing electrode 2341 overlap each other corresponds to a liquid crystal element 2303. Note that the pixel electrode may be formed to extend over the TFT. When a transparent conductive film including indium tin oxide (ITO), ITSO made of indium tin oxide and silicon oxide, organic indium, organic tin, zinc oxide, titanium nitride, or the like each having a light transmitting property is used for the first conductive film and the second conducive film, an aperture ratio of a pixel portion can be improved.

Note that a distance (cell gap) between the pixel electrode 2330 and the opposing electrode 2341 is controlled by a spacer 2361. Although in FIG. 15, the spacer 2361 is formed by processing an insulating film into a desired shape, spacers prepared separately may be dispersed over the orientation film 2331 to control the cell gap. A reference numeral 2362 denotes a sealant, and by the sealant 2362, the liquid crystal 2343 is sealed between the first substrate 2300 and the second substrate 2340.

Further, on a surface of the first substrate 2300 that is not the surface over which the TFT 2301 and the TFT 2302 are formed, a polarizing plate is provided (not shown). Also, on a surface of the second substrate 2340 that is not the surface over which the opposing electrode 2341 is formed, a polarizing plate is provided (not shown). Note that the number of orientation films and polarizing plates, and positions thereof in a liquid crystal display device of the present invention are not limited to those shown in a structure of FIG. 15.

Next, a structure of an element substrate used in a liquid crystal display device of the present invention is shown.

Figure 16:
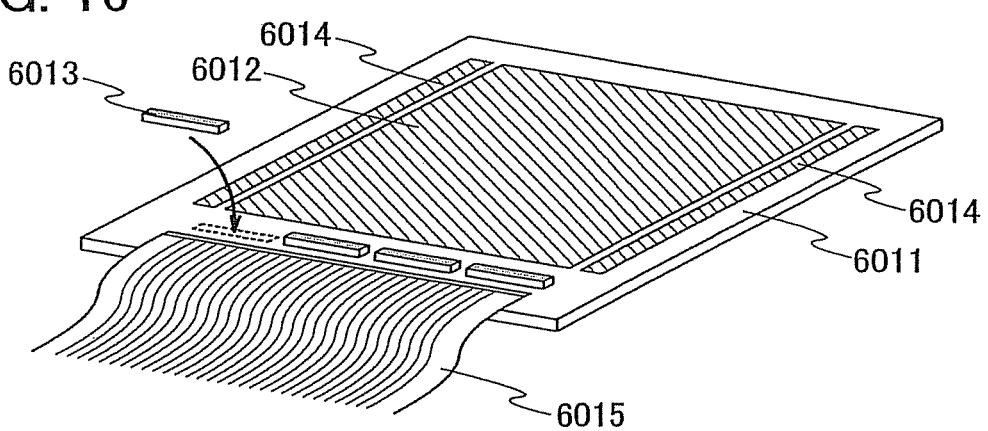
FIG. 16 is a diagram showing one mode of an element substrate in a semiconductor device of the present invention.

FIG. 16 shows a mode of an element substrate in which a pixel portion 6012 formed over a first substrate 6011 is connected to a separately formed signal line driver circuit 6013. The pixel portion 6012 and the scanning line driver circuit 6014 are each formed using a TFT including an oxide semiconductor film including a crystallized region in at least a channel forming region. By forming the signal line driver circuit with a transistor by which higher mobility can be obtained compared to that of a TFT using an amorphous silicon film, operation of the signal line driver circuit which demands higher driving frequency than that of the scanning line driver circuit can be stabilized. Note that the signal line driver circuit 6013 may be a transistor using a monocrystalline silicon semiconductor, a TFT using a polycrystalline semiconductor, or a transistor using SOI. The pixel portion 6012, the signal line driver circuit 6013, and the scanning line driver circuit 6014 are each supplied with potential of a power source, various signals, and the like via an FPC 6015.

Note that the signal driver circuit and the scanning line driver circuit may both be formed over the same substrate as that of the pixel portion.

Figure 17A:
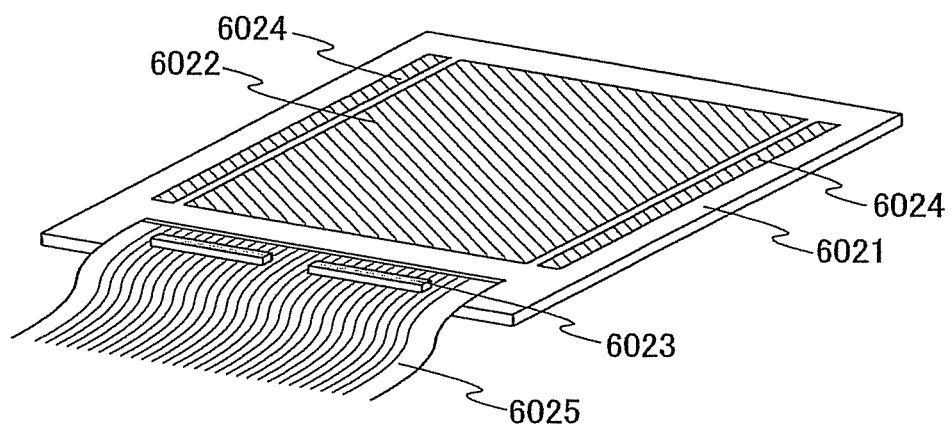
FIGS. 17A and 17B are each a diagram showing one mode of an element substrate in a semiconductor device of the present invention.

Also, when the driver circuit is separately formed, a substrate over which the driver circuit is formed is not always required to be stuck over a substrate over which the pixel portion is formed, and may be stuck for example over the FPC. FIG. 17A shows a mode of an element substrate in which a pixel portion 6022 formed over a first substrate 6021 is connected to a separately formed signal line driver circuit 6023. The pixel portion 6022 and the scanning line driver circuit 6024 are each formed with a TFT using an oxide semiconductor film including a crystallized region in at least a channel forming region. The signal line driver circuit 6023 is connected to the pixel portion 6022 via an FPC 6025. The pixel portion 6022, the signal line driver circuit 6023, and the scanning line driver circuit 6024 are each supplied with potential of a power source, a variety of signals, and the like via the FPC 6025.

Figure 17B:
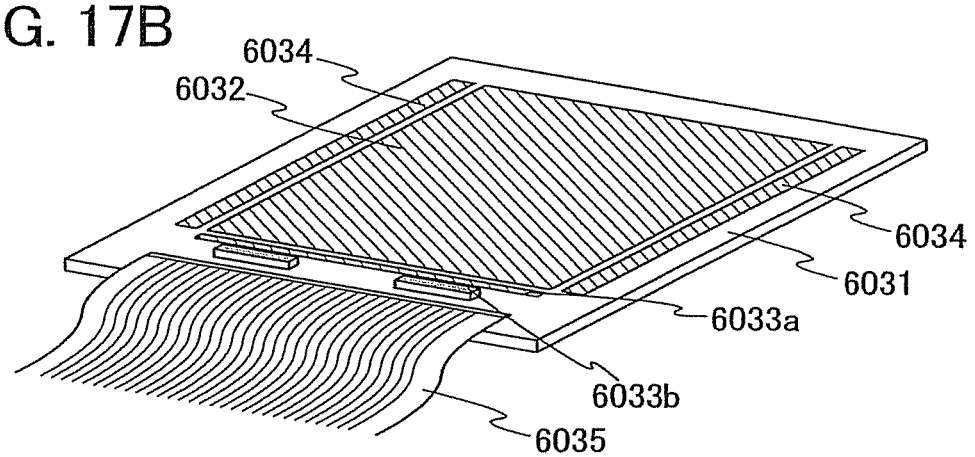

Also, just a portion of the signal line driver circuit or just a portion of the scanning line driver circuit may be formed over the same substrate as that of the pixel portion using the TFT including an oxide semiconductor film including a crystallized region in at least a channel forming region, and the rest may be formed separately to be electrically connected to the pixel portion. FIG. 17B shows a mode of an element substrate where an analog switch 6033a included in the signal driver circuit is formed over a first substrate 6031, which is the same substrate as that over which a pixel portion 6032 and a scanning line driver circuit 6034 are formed, and forming a shift register 6033b included in the signal line driver circuit over a different substrate separately and then sticking it over the substrate 6031. The pixel portion 6032 and the scanning line driver circuit 6034 are each formed using the TFT including an oxide semiconductor film including a crystallized region in at least a channel forming region. The shift register 6033b included in the signal line driver circuit is connected to the pixel portion 6032 via an FPC 6035. The pixel portion 6032, the analog switch 6033a and shift register 6033b included in the signal line drive circuit, and the scanning line driver circuit 6034 are each supplied with potential of a power source, a variety of signals, and the like via the FPC 6035.

As shown in FIG. 16 to FIG. 17B, in a liquid crystal display device of the present invention, an entire driver circuit or a portion thereof can be formed over the same substrate as that of a pixel portion, using the TFT including an oxide semiconductor film including a crystallized region in at least a channel forming region.

Note that a connection method of a separately formed substrate is not particularly limited, and a COG (chip on glass) method, a wire bonding method, a TAB (tape automated bonding) method or the like can be used. Further, a connection position is not limited to the position shown in FIGS. 18A and 18B, as long as electrical connection is possible. Also, a controller, a CPU, a memory, or the like may be formed separately and connected.

Note that a signal line driver circuit used in the present invention is not limited to a mode including only a shift register and an analog switch. In addition to the shift register and the analog switch, another circuit such as a buffer, a level shifter, or a source follower may be included. Also, the shift register and the analog switch is not always required to be provided, and for example a different circuit such as a decoder circuit by which selection of signal line is possible may be used instead of the shift register, and a latch or the like may be used instead of the analog switch.

Figure 18A:
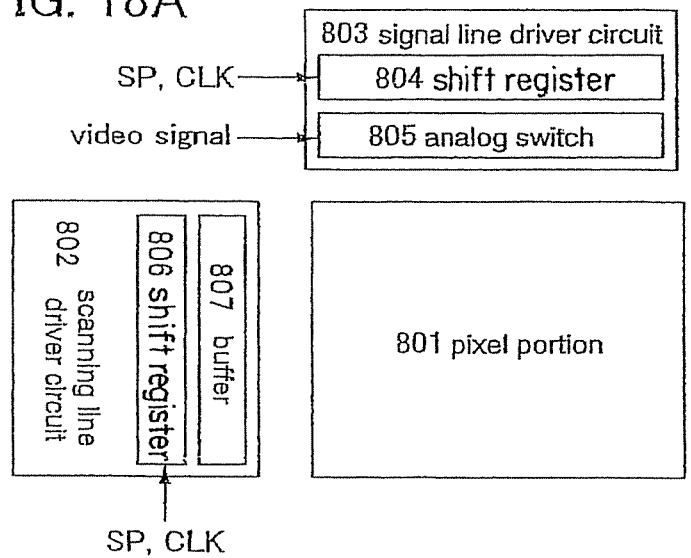
FIGS. 18A and 18B are each a block diagram showing a structure of a semiconductor device of the present invention.

FIG. 18A shows a block diagram of a liquid crystal display device to which the present invention is applied. The liquid crystal display device shown in FIG. 18A includes a pixel portion 801 including a plurality of pixels and provided with a liquid crystal element; a scanning line driver circuit 802 that selects each pixel; and a signal line driver circuit 803 that controls video signal input to a selected pixel.

In FIG. 18A, the signal line driver circuit 803 includes a shift register 804 and an analog switch 805. To the shift register 804, a clock signal (CLK) and a start pulse signal (SP) are input. When the clock signal (CLK) and the start pulse signal (SP) are input, timing signals are generated in the shift register 804, and the timing signals are input to the analog switch 805.

Also, the analog switch 805 is provided with video signals. The analog switch 805 samples the video signals according to the timing signals and distributes the video signals to a signal line of a latter stage.

Next, a structure of the scanning line driver circuit 802 is described. The scanning line driver circuit 802 includes a shift register and a buffer 807. Also, a level shifter may be included in some cases. In the scanning line driver circuit 802, by inputting the clock signal (CLK) and the start pulse signal (SP), a selection signal is generated. The generated selection signal is buffer amplified in the buffer 807, and then supplied to a corresponding scanning line. To the scanning line, gates of transistors in pixels of one line are connected. Further, since the transistors in the pixels of one line have to be turned on at the same time, a buffer to which a large current can be fed is used for the buffer 807.

In a full color liquid crystal display device, when a video signal corresponding to each of R (red), G (green), and B (blue) are sampled in sequence and each are supplied to a corresponding signal line, the number of terminals for connecting the shift register 804 and the analog switch 805 corresponds to about ⅓ of the number of terminals for connecting the analog switch 805 and the pixel portion 801. Consequently, by forming the analog switch 805 and the pixel portion 801 over the same substrate, terminals used for connecting separately formed substrates are not required as in a case of forming the analog switch 805 and the pixel portion over different substrates, and occurrence probability of poor connection can be suppressed, and yield can be increased.

Figure 18B:
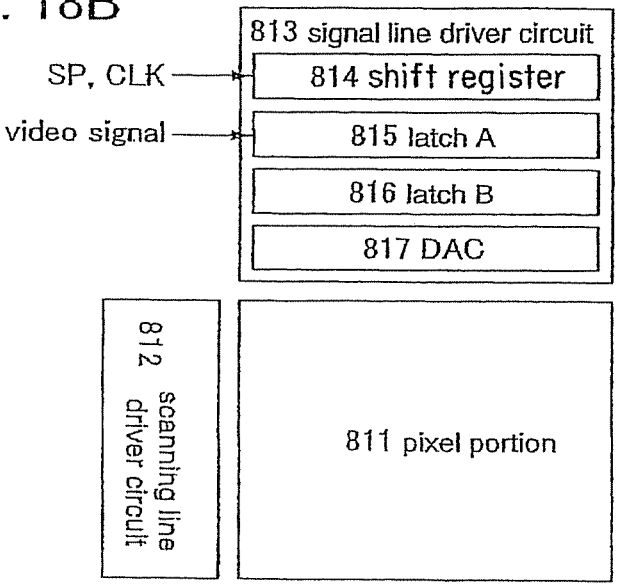

FIG. 18B shows a block diagram of a liquid crystal display device to which the present invention is applied that is different from that of FIG. 18A. In FIG. 18B, a pixel portion 811 is shown, and a signal line driver circuit 813 includes a shift register 814, a latch A 815, a latch B 816, and a D/A converter circuit (hereinafter referred to as a DAC 817). A scanning line driver circuit 812 is to have the same structure as that of the scanning line driver circuit 802 in FIG. 18A

To the shift register 814, the clock signal (CLK) and the start pulse signal (SP) are input. When the clock signal (CLK) and the start pulse signal (SP) are input, timing signals are generated in the shift register 814 to be input in sequence to the latch A 815 of a first stage. When the timing signals are input to the latch A 815, video signals are written to the latch A 815 in synchronism with the timing signals and retained. Note that in FIG. 18B, although it is assumed that the video signals are written to the latch A 815 in sequence, the present invention is not limited to this structure. A so called division drive in which a plurality of stages of the latch A 815 are divided into several groups, and video signals are input in parallel for each group. Note that the number of the groups at this time is called a division number. For example, when the latches are divided into groups in each of four stages, this is called division driving with four divisions.

The time it takes for a video signal writing to a latch of the latch A 815 in all of the stages to complete is called a line period. In practice, a line period sometimes includes the line period to which a horizontal retrace line period is added.

When one line period is completed, latch signals are supplied to the latch B 816 of a second stage, and video signals retained in the latch A 815 are written all at once in synchronism with the latch signals, and retained. To the latch A 815 which have sent the video signals to the latch B 816, subsequent video signals are written in sequence in synchronism with timings signals from the shift register 814. In this second round of the one line period, video signals written and retained in the latch B 816 are input to DAC 817.

The DAC 817 converts input video signals from digital to analog, and supplies the signals to a corresponding signal line.

Note that the configurations shown in FIGS. 18A and 18B are modes of a liquid crystal display device relating to this embodiment mode, and configurations of a signal line driver circuit and a scanning line driver circuit are not limited thereto.

Note that FIGS. 16 to 18B is not used just for a liquid crystal display device relating to this embodiment mode, and can be used for a light emitting device or other display devices.

Note that this embodiment mode can be appropriately combined with Embodiment Modes 1 to 4.

Embodiment 1

This embodiment describes a mode of a light emitting element used in the light emitting device described in Embodiment Mode 5, with reference to FIGS. 8A to 8F.

Figure 8A:
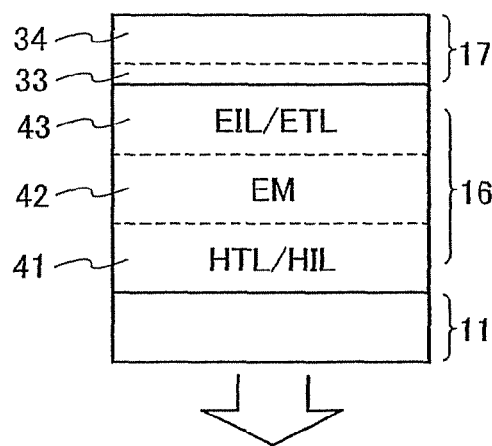
FIGS. 8A to 8F are each a diagram showing a mode of a light emitting element relating to the present invention.

FIG. 8A shows an example of forming a first pixel electrode 11 by using a conductive film having a light transmitting property and a high work function and forming a second pixel electrode 17 by using a conductive film having a low work function. The first pixel electrode 11 is formed of an oxide conductive material having a light transmitting property, typically, an oxide conductive material containing a silicon oxide at a concentration of 1 to 15 atomic % A layer containing a light emitting substance 16 composed of a hole injecting or transporting layer 41, a light emitting layer 42, an electron transporting or injecting layer 43 is formed over the first pixel electrode 11. The second pixel electrode 17 is composed of a first electrode layer 33 containing an alkali metal or an alkali earth metal such as LiF or MgAg and a second electrode layer 34 formed of a metal material such as aluminum. The pixel having such the structure can emit light from the first pixel electrode 11 side as indicated by arrow in the drawing.

Figure 8B:
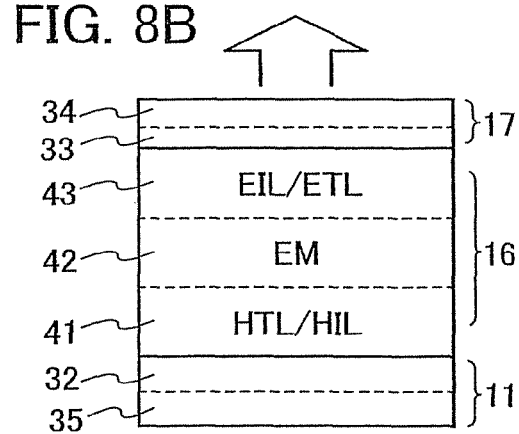

FIG. 8B shows an example of forming a first pixel electrode 11 by using a conductive film having a high work function and forming a second pixel electrode 17 by using a conductive film having a light transmitting property and a low work function. The first pixel electrode 11 is composed of a first electrode layer 35 formed of a metal such as aluminum or titanium, or the metal and a metal material containing nitrogen at a concentration of a stoichiometric composition ratio or less, and a second electrode layer 32 formed of an oxide conductive material containing silicon oxide at a concentration of 1 to 15 atomic %. A layer containing a light emitting substance 16 composed of a hole injecting or transporting layer 41, a light emitting layer 42, an electron transporting or injecting layer 43 is formed over the first pixel electrode 11. The second pixel electrode 17 is composed of a third electrode layer 33 containing an elemental substance of an alkali metal or an alkali earth metal such as LiF or CaF or a compound or an alloy thereof, and a fourth electrode layer 34 formed of a metal material such as aluminum. By forming each the third electrode layer 33 and the fourth electrode layer 34 to have a thickness of 100 nm or less to make it possible to permeate light, light can be emitted from a second pixel electrode 17 side as indicated by arrow in the drawing.

Figure 8C:
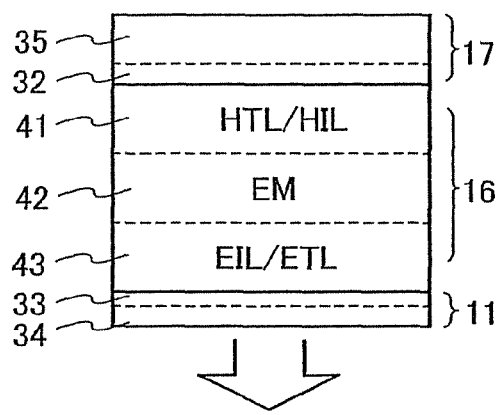
Figure 8D:
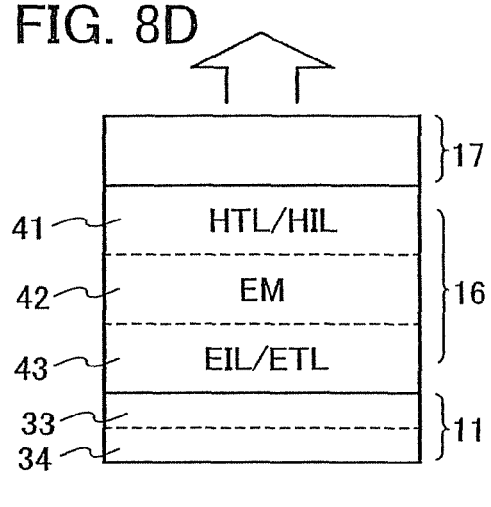
Figure 8E:
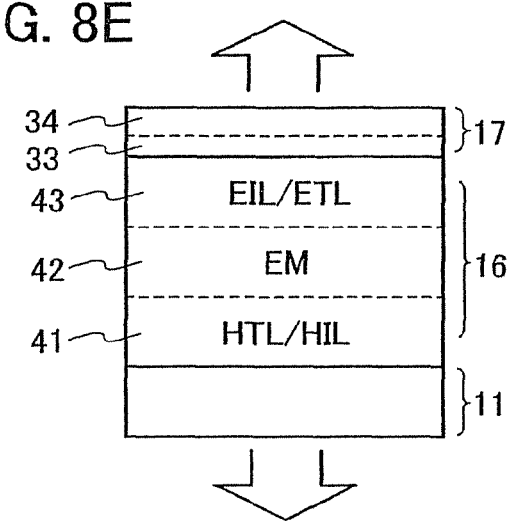

FIG. 8E shows an example of emitting light from both of a first electrode and a second electrode. A first pixel electrode 11 is formed by a conductive film having a light transmitting property and a high work function and a second pixel electrode 17 is formed by a conductive film having a light transmitting property and a low work function. Typically, the first pixel electrode 11 is formed of an oxide conductive material including a silicon oxide at a concentration of 1 to 15 atomic % and the second electrode 17 is composed of a third electrode layer 33 containing an elemental substance of an alkali metal or an alkali earth metal such as LiF or CaF or a compound of an alloy thereof, with a thickness of 100 nm or less and a fourth electrode layer 34 formed of a metal material such as aluminum with a thickness of 100 nm or less. Accordingly, light can be emitted from both of the first pixel electrode 11 and the second electrode 17 as indicated by an arrow in the drawing.

FIG. 8C shows an example of forming a first pixel electrode 11 by using a conductive film having a light transmitting property and a low work function and forming a second pixel electrode 17 by a conductive film having a high work function. A structure of a layer containing, a light emitting substance is illustrated as a stacked layer structure formed by stacking sequentially an electron transporting or injecting layer 43, a light emitting layer 42, and a hole injecting or transporting layer 41. The second pixel electrode 17 is composed of a second electrode layer 32 formed of an oxide conductive material containing silicon oxide at a concentration of 1 to 15 atomic %, and a first electrode layer 35 formed of a metal such as aluminum or titanium, or a metal and a metal material containing nitrogen at a concentration of a stoichiometric composition ratio or less. The first pixel electrode 11 is composed of a third electrode layer 33 containing an elemental substance of an alkali metal or an alkali earth metal such as LiF or MgAg or a compound of an alloy thereof, and a fourth electrode layer 34 formed of a metal material such as aluminum. By forming each the third electrode layer 33 and the fourth electrode layer 34 to have a thickness of 100 nm or less to make it possible to permeate light, light can be emitted from the first electrode 11 side as indicated by an arrow in the drawing.

FIG. 8D shows an example of forming a first pixel electrode 11 by using a conductive film having a low work function and forming a second pixel electrode 17 by using a conductive film having a light transmitting property and a high work function. A structure of a layer containing a light emitting substance is illustrated as a stacked layer structure formed by stacking sequentially an electron transporting or injecting layer 43, a light emitting layer 42, and a hole injecting or transporting layer 41. The first pixel electrode 11 is formed to have a similar structure to that illustrated in FIG. 8A and to have a thickness that enables it to reflect light generated in the layer containing a light emitting substance. The second pixel electrode 17 is formed of an oxide conductive material containing silicon oxide at a concentration of 1 to 15 atomic %. By forming a hole injecting layer by a metal oxide which is an inorganic material (typically, molybdenum oxide or vanadium oxide), oxygen which is introduced when forming the second electrode layer 32 is supplied and a hole injecting property is improved, accordingly, drive voltage can be reduced in this structure. By fanning the second electrode 17 by a conductive film having a light transmitting property, light can be emitted from one side of the second electrode 17 as indicated by an arrow.

Figure 8F:
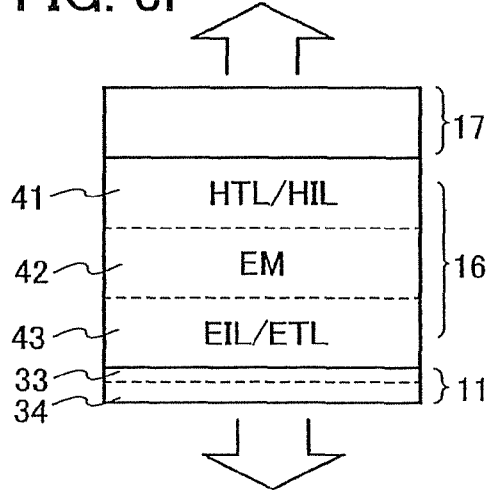

FIG. 8F shows an example of emitting light from both sides, that is, a first pixel electrode and a second pixel electrode. A first pixel electrode 11 is formed by a conductive film having a light transmitting property and a low work function and a second pixel electrode 17 is formed by a conductive film having a light transmitting property and a high work function. Typically, the first electrode 11 is composed of a third electrode layer 33 containing an elemental substance of an alkali metal or an alkali earth metal such as LiF or CaF or a compound or an alloy thereof, with a thickness of 100 nm or less and a fourth electrode layer 34 formed of a metal material such as aluminum with a thickness of 100 nm or less. The second pixel electrode 17 is formed of an oxide conductive material containing a silicon oxide at a concentration of 1 to 15 atomic %.

The layer containing a light emitting substance 16 can be formed by a charge injection transportation material and a light emitting material including an organic compound or an inorganic compound, can include one or a plurality types of layers selected from a low molecular organic compound, an intermolecular organic compound (which does not have a subliming property but have a molecular chain length of 10 μm or less as typified by dendrimer, oligomer, or the like), and a high molecular organic compound, and can be combined with an inorganic compound having an electron injecting transporting property or a hole injecting transporting property.

As a particularly high electron transporting material among charge injection transporting materials, for example, metal complexes having a quinoline skeleton or a benzoquinoline skeleton, such as tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), and bis(2-methyl-8-quinolinolato)-4-phenylphenolato-aluminum (abbreviation: BAlq) can be given.

As a high hole transporting material, for example, aromatic amine based compounds (i.e., one having a benzene ring-nitrogen bond), such as 4,4'-bis[N-(1-naphthyl)-N-phenylamino]biphenyl (abbreviation: α-NPD), 4,4'-bis[N-(3-methylphenyl)-N-phenylamino]biphenyl (abbreviation: TPD), 4,4',4"-tris(N,N-diphenylamino)triphenylamine (abbreviation: TDATA); and 4,4',4"-tris[N-(3-methylphenyl)-N-phenylamino]triphenylamine (abbreviation: MTDATA) can be given.

As a particularly high electron injecting material among charge injection transportation materials, compounds of alkali metal or alkaline earth metal such as lithium fluoride (LiF), cesium fluoride (CsF), and calcium fluoride ($CaF_2$) can be given. In addition, a mixture of a highly electron transporting material such as $Alq_3$ and alkaline-earth metal such as magnesium (Mg) may be used.

As a highly hole injecting material among charge injection transportation materials, for example, a metal oxide such as molybdenum oxide ($MoO_x$), vanadium oxide ($VO_x$), ruthenium oxide ($RuO_x$), tungsten oxide ($WO_x$), or manganese oxide ($MnO_x$) can be given. Besides these, phthalocyanine based compounds such as phthalocyanine ($H_2Pc$) and copper phthalocyanine (CuPc) can be given.

Light emitting layers 42 having different light emission wavelength bands may be each formed in pixels so as to perform color display. Typically, light emitting layers corresponding to respective luminescent colors of R (red), G (green), and B (blue) are formed. In this case, color purity can be improved and specular reflection (glare) of a pixel portion can be prevented by providing a filter (coloring layer) that transmits light of a certain light emission wavelength band on a light emission side of the pixels. By providing the filter (coloring layer), a circular polarizing plate or the like, which has been conventionally thought to be required, can be omitted, thereby reducing loss of light emitted from the light emitting layers. In addition, a change in hue, which is caused in the case where a pixel portion (a display screen) is seen obliquely, can be reduced.

There are various kinds of light emitting materials that can be used for forming the light emitting layers 42. With respect to low molecular organic light emitting materials, the following substances can be used: 4-dicyanomethylene-2-methyl-6-[2-(1,1,7,7-tetramethyljulolidine-9-yl)ethenyl]-4H-pyran (abbreviation: DCJT); 2-tert-butyl-4-dicyanomethylene-6-[2-(1,1,7,7-tetramethyljulolidine-9-yl)ethenyl]-4H-pyran (abbreviation: DCJTB); periflanthene; 2,5-dicyano-1,4-bis [2-(10-methoxy-1,1,7,7-tetramethyljulolidine-9-yl)ethenyl] benzene, N,N'-dimethylquinacridone (abbreviation: DMQd); coumarin 6; coumarin 545T; tris(8-quinolinolato)aluminum (abbreviation: $Alq_3$); 9,9'-bianthryl; 9,10-diphenylanthracene (abbreviation: DPA); 9,10-bis(2-naphthyl)anthracene (abbreviation: DNA); and the like. Also, another substance may be used.

On the other hand, a high molecular organic light emitting material has higher physical strength than that of a low molecular organic light emitting material, and so a light emitting element formed of a high molecular organic material has high durability. Since a high molecular organic light emitting material can be formed into a film by coating, manufacturing an element is relatively easy. A light emitting element structure using the high molecular organic light emitting material is basically the same as that formed by a low molecular organic light emitting material formed by stacking sequentially a cathode, a layer containing a light emitting substance, and an anode. However, a stacked layer structure which is formed in the case of using a low molecular organic light emitting material is difficult to be formed as a stacked layer structure composed of a layer containing a light emitting substance formed of a high molecular organic light emitting material. Most cases, the layer containing a light emitting substance is formed to have two stacked layers. Specifically, a structure is composed sequentially of a substrate, a layer containing a light emitting substance, a hole transporting layer, and an anode.

Since emission color is determined by a material for forming the light emitting layer, a desired light emitting element exhibiting desired light emission can be formed by selecting the material. As a high molecular light emitting material which can be used for forming the light emitting layer, polyparaphenylene vinylene based, polyparaphenylene based, polythiophene based, and polyfluorene based materials can be given.

As the polyparaphenylene vinylene based material, a derivative of poly(paraphenylenevinylene) (PPV): poly(2,5-dialkoxy-1,4-phenylenevinylene) (RO-PPV); poly(2-(2'-ethyl-hexoxy)-5-methoxy-1,4-phenylenevinylene) (MEH-PPV); poly(2-(dialkoxyphenyl)-1,4-phenylenevinylene) (ROPh-PPV); or the like can be given. As the polyparaphenylene based material, a derivative of polyparaphenylene (PPP): poly(2,5-dialkoxy-1,4-phenylene) (RO-PPP); poly(2, 5-dihexoxy-1,4-phenylene); or the like can be given. As the polythiophene based material, a derivative of polythiophene (PT): poly(3-alkylthiophene) (PAT); poly(3-hexylthiophene) (PHT); poly(3-cyclohexylthiophene) (PCHT); poly(3-cyclohexyl-4-methylthiophene) (PCHMT); poly(3,4-dicyclohexylthiophene) (PDCHT); poly[3-(4-octylphenyl)-thiophene] (POPT); poly[3-(4-octylphenyl)-2,2bithiophene) (PTOPT); or the like can be given. As the polyfluorene based material, a derivative of polyfluorene (PF): poly(9,9-dialkylfluorene) (PDAF); poly(9,9-dioctylfluorene) (PDOF); or the like can be given.

In the case that a high molecular organic light emitting material having a hole transporting property is interposed between an anode and a high molecular organic light emitting material having a light emitting property, a hole injecting property of the anode can be improved. Generally, the one which is dissolved with an acceptor material into water is applied by a spin coating method or the like. Since the high molecular organic light emitting material having the hole transporting property is insoluble in an organic solvent, the foregoing material can be stacked over the above mentioned light emitting material having a light emitting property. As the high molecular organic light emitting material having a hole transporting property, a mixture of PEDOT and camphor sulfonic acid (CSA) as an acceptor material; a mixture of polyaniline (PANI) and polystyrenesulfonic acid (PSS) as an acceptor material; or the like can be given.

The light emitting layers 42 can be formed to have a structure exhibiting a single color emission or white emission. In the case of using a white light emitting material, color display can be realized by providing a filter (coloring layer) transmitting light at a specified wavelength at a light emission side of a pixel.

In order to form a light emitting layer emitting white emission, $Alq_3$, $Alq_3$ doped partly with Nile red which is a red emission coloring matter, $Alq_3$, p-EtTAZ, and TPD (aromatic diamine) are stacked sequentially by a vapor deposition method. In the case of forming a light emitting layer by a coating method using spin coating, the foregoing material is preferably coated and baked by vacuum heating. For example, an aqueous solution of polyethylene dioxythiophene)/poly(styrenesulfonic acid) (PEDOT/PSS), which functions as a hole injecting layer, may be applied over an entire surface of a substrate and baked. Afterwards, a solution of polyvinyl carbazole (PVK) doped with a luminescence center pigment (such as 1,1,4,4-tetraphenyl-1,3-butadiene (TPB), 4-dicyanomethylene-2-methyl-6-(p-dimethylamino-styryl)-4H-pyran (DCM1), Nile red, or coumarin 6), which serves as a light emitting layer, may then be applied over the entire surface and baked.

The light emitting layer can be formed by a single layer. 1,3,4-oxadiazole derivatives (PBD) having an electron transporting property can be dispersed to polyvinylcarbazole (PVK) having a hole transporting property. Further, white emission can be obtained by dispersing PBD of 30 wt % as an electron transporting agent and dispersing an appropriately amount of four kinds coloring matters (TPB, coumarin 6, DCM1, and Nile red). Besides the light emitting element exhibiting white emission, light emitting elements exhibiting red emission, green emission, or blue emission can be manufactured by appropriately selecting a material of the light emitting layer.

In the case that a high molecular organic material having a hole transporting property is interposed between an anode and a high molecular organic material having a light emitting property, a hole injecting property of the anode can be improved. Generally, a high molecular organic material having a hole transporting property dissolved in water together with an acceptor material is coated by a spin coating method. Since the high molecular organic material having a hole transporting property is insoluble in an organic solvent, the foregoing material can be stacked over the above mentioned light emitting material having a light emitting property. As the high molecular organic material having a hole transporting property, a mixture of PEDOT and camphor sulfonic acid (CSA) as an acceptor material; a mixture of polyaniline (PANI) and polystyrenesulfonic acid (PSS) as an acceptor material; or the like can be given.

As a material for the light emitting layers 42, a triplet excited material including metal complexes can be used besides a singlet excited light emitting material. For example, a red luminescent pixel which has a relatively short half-brightness life is formed by a triplet excited light emitting material among the red luminescent pixel, a green luminescent pixel, and blue luminescent pixel; and the other pixels are formed by a singlet excited light emitting material. Since a triplet excited light emitting material has good emission efficiency, there is an advantage of obtaining luminescence which can be obtained in the case of using a singlet excited light emitting material at low power consumption. That is, reliability can be improved since a light emitting element can be operated at a small amount of current in the case of apply-ing a triplet excited light emitting material for a red emission pixel. In order to reduce power consumption, a red luminescent pixel and a green luminescent pixel are formed by a triplet excited light emitting material, and a blue luminescent pixel can be formed by a singlet excited light emitting material. By forming a green luminescent pixel which is well visible for human by a triplet excited light emitting material, power consumption can be further reduced.

As an example of a triplet excited light emitting material, a material using metal complexes as a dopant can be nominated. The following are known as the foregoing metal complexes: metal complexes having platinum which is the third transition series element as a central metal, metal complexes having iridium as a central metal, or the like. These compounds are not limited as a triplet excited light emitting material. A compound having the foregoing structure and a compound having Group 8 to Group 10 elements as a central metal can be used.

The following materials for forming the foregoing layer containing a light emitting substance are illustrative only. A light emitting element can be formed by appropriately stacking functional each layer such as a hole injecting transporting layer, a hole transporting layer, an electron injecting transporting layer, an electron transporting layer, a light emitting layer, an electron blocking layer, or a hole blocking layer. Further, a mixed layer or mixed junction can be formed by combining each of the foregoing layers. A layer structure of the light emitting layer is variable. Instead of not providing a specific electron injection region or light emitting region, various changes and modifications such as providing an electrode or a dispersed luminescent material for being used only for the electron injection region or the light emitting region are permissible unless otherwise such changes and modifications depart from the scope of the present invention.

Embodiment 2

In this embodiment, a pixel circuit of a display panel of a light emitting device relating to the present invention and an operational configuration thereof is described with reference to FIGS. 9A to 9F. For the operational configuration of the display panel in a display device in which video signals are digital, there is a configuration in which video signals to be input to a pixel is regulated by voltage, and a configuration in which they are regulated by current. As the configuration in which video signals are regulated by voltage, there is one where voltage applied to a light emitting element is constant (CVCV), and one where current applied to the light emitting element is constant (CVCC). Also, as the configuration in which video signals are regulated by current, there is one where voltage applied to the light emitting element is constant (CCCV), and one where current applied to the light emitting element is constant (CCCC). This embodiment describes a pixel of a CVCV operation with reference to FIGS. 9A and 9B. Further, a pixel of a CVCC operation is described with reference to FIGS. 9C to 9F.

Figure 9A:
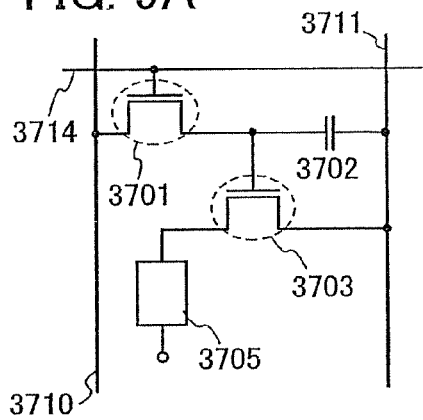
FIGS. 9A to 9F are each a diagram describing a pixel circuit of a display panel relating to the present invention and an operation configuration thereof.
Figure 9B:
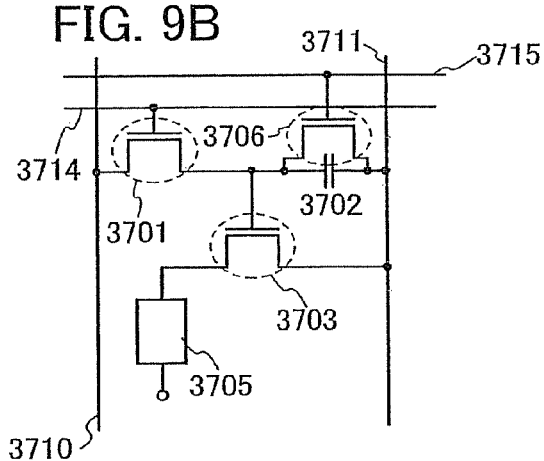

In the pixel shown in each of FIGS. 9A and 9B, a signal line 3710 and a power source line 3711 are arranged in a column direction and a scanning line 3714 is arranged in a row direction. Also, a switching TFT 3701, a driving TFT 3703, a capacitor element 3702, and a light emitting element 3705 are included.

Note that the switching TFT 3701 and the driving TFT 3703 are operated in a linear region when they are turned on. Also, the driving TFT 3703 has a role of controlling whether voltage is applied to the light emitting element 3705. It is favorable in terms of a manufacturing step if both TFTs have the same conductivity type. In this embodiment, the switching TFT 3701 is formed as an n-channel type TFT, and the driving TFT 3703 is formed as a p-channel type TFT. Also, as the driving TFT 3703, a depletion type TFT may be used in addition to an enhancement type TFT. Further, a ratio (W/L) of a channel width W and a channel length L of the driving TFT 3703 is preferably 1 to 1000, even though it depends on a mobility of the TFT. As W/L gets larger, an electrical property of the TFT is improved.

In the pixel shown in each of FIGS. 9A and 9B, the switching TFT 3701 controls input of video signals to the pixel, and when the switching TFT 3701 is turned on, video signals are input inside the pixel. Then, voltage of the video signals is retained in the capacitor element 3702.

In FIG. 9A, in a case where the power source line 3711 is Vss and an opposing electrode of the light emitting element 3705 is Vdd, as in FIGS. 8C and 8D, the opposing electrode of the light emitting element is an anode, and an electrode connected to the driving TFT 3703 is a cathode. In this case, luminance irregularity due to characteristic variation of the driving TFT 3703 can be suppressed.

In FIG. 9A, in a case where the power source line 3711 is Vdd and the opposing electrode of the light emitting element 3705 is. Vss, as in FIGS. 8A and 8B, the opposing electrode of the light emitting element is a cathode, and the electrode connected to the driving TFT 3703 is an anode. In this case, by inputting video signals having higher voltage than Vdd to the signal line 3710, voltage of the video signals are retained in the capacitor element 3702 and the driving TFT 3703 operated in the linear region; consequently, luminance irregularity due to variation of the TFT can be improved.

The pixel shown in FIG. 9B has the same pixel configuration as that shown in FIG. 9A except that in FIG. 9B, a TFT 3706 and a scanning line 3715 are added.

Turning on or off of the TFT 3706 is controlled by the newly placed scanning line 3715. When the TFT 3706 is turned on, a charge retained in the capacitor element 3702 is discharged, and the driving TFT 3703 is turned off. In other words, according to a placement of the TFT 3706, a state in which current is not fed to the light emitting element 3705 can be created forcefully. Therefore, the TFT 3706 can be called an erasing TFT. Consequently, in the configuration in FIG. 9B, a duty ratio of light emission can be improved since a lighting period can be started at the same time as or right after a start of a writing period, without waiting for signals to be written to all pixels.

In a pixel having the foregoing operational configuration, a current value of the light emitting element 3705 can be determined by the driving TFT 3703 which operates in the linear region. By the foregoing configuration, characteristic variation of TFTs can be suppressed, luminance irregularity of light emitting elements due to the characteristic variations of the TFTs can be improved, and a display device with improved image quality can be provided.

Next, a pixel of a CVCC operation is described with reference to FIGS. 9C to 9F. The pixel shown in FIG. 9C has a pixel configuration shown in FIG. 9A with a power source line 3712 and a current control TFT 3704 provided in addition.

Figure 9C:
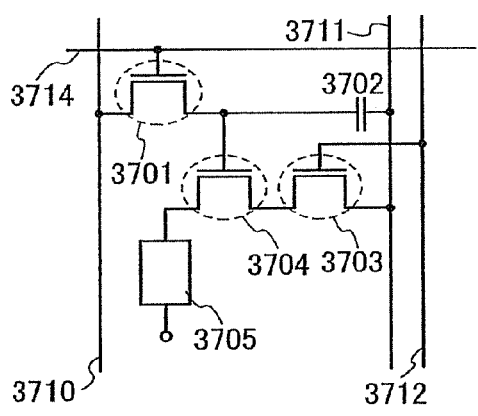
Figure 9D:
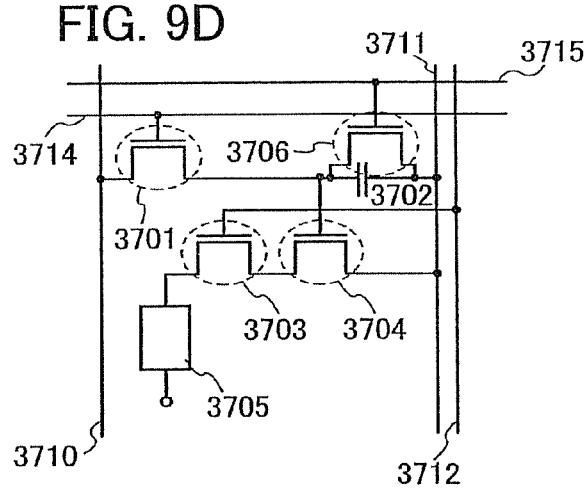
Figure 9E:
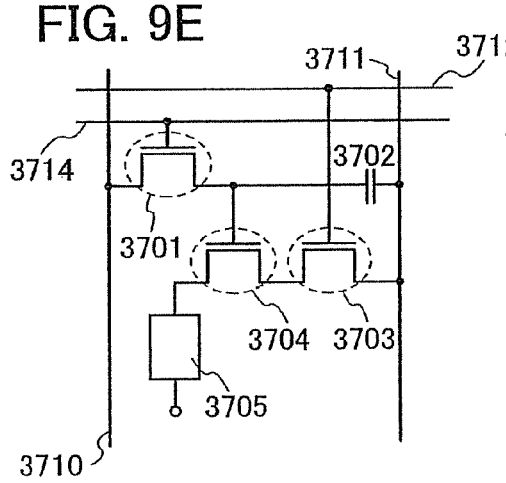

The pixel shown in FIG. 9E has the same configuration as the pixel shown in FIG. 9C, except that a gate electrode of the driving TFT 3703 is connected to the power supply line 3712 arranged in a row direction. In other words, both pixels shown in FIGS. 9c and 9E show the same equivalent circuit schematic. However, the power supply line 3712 arranged in a column direction (FIG. 9C) is formed with a conductive film formed in a different layer from that of the power supply line 3712 arranged in a row direction (FIG. 9E). Here, wirings to which the gate electrode of the driving TFT 3703 are connected is given focus, and in order to show that layers for manufacturing the wirings are different, they are separately described in FIGS. 9C and 9E.

Note that the switching TFT 3701 operates in the linear region, and the driving TFT 3703 operates in a saturation region. Also, the driving TFT 3703 has a role of controlling a current value fed to the light emitting element 3705, and the current control TFT 3704 operates in the saturation region has a role of controlling supply of current to the light emitting element 3705.

Figure 9F:
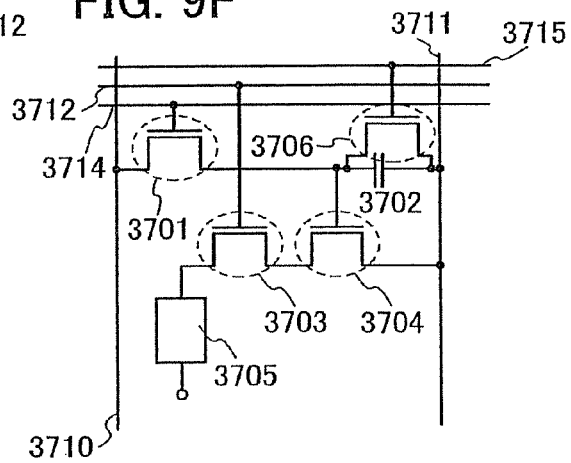

The pixel shown in each of FIGS. 9D and 9F have the same pixel configuration as the pixel shown in each of FIGS. 9C and 9E, respectively, except that they are each provided with an erasing TFT 3706 and the scanning line 3715 in addition.

Note that in the pixels shown in FIGS. 9A and 9B, CVCC operations are also possible. Also, for pixels having the operational configurations shown in FIGS. 9C to 9F, respectively, similarly to FIGS. 9A and 9B, Vdd and Vss can be appropriately changed depending on a direction in which current of a light emitting element flows.

In a pixel having the foregoing configuration, since the current control TFT 3704 operates in the linear region, a small shift in Vgs of the current control TFT 3704 does not have an effect on the current value of the light emitting element 3705. In other words, the current value of the light emitting element 3705 can be determined by the driving TFT 3703 which operated in the saturation region. By the foregoing configuration, luminance irregularity of light emitting elements due to characteristic variations of TFTs can be improved, and a display device with improved image quality can be provided.

Note that although a configuration in which the capacitor element 3702 is provided is shown, the present invention is not limited thereto, and in a case where a capacity for retaining video signals can be covered by a gate capacitance, the capacitor element 3702 is not required to be provided.

By such an active matrix type display device, in a case where pixel density is increased, low voltage drive is possible since a TFT is provided in each pixel, and this is considered to be advantageous.

Further, in a display device relating to the present invention, a driving method of a screen display is not particularly limited, and for example, a dot sequential driving method, a line sequential driving method, an area sequential driving method, or the like may be used. Typically, the line sequential driving method is used, and a time division gray scale driving method or an area gray scale driving method may be appropriately used. Further; image signals input to a source line of the display device may be analog signals, or digital signals, and a driver circuit and the like may be designed appropriately according to the image signals.

Embodiment 3

In this embodiment, mounting of a driver circuit relating to the present invention is described with reference to FIGS. 10A to 10C.

Figure 10A:
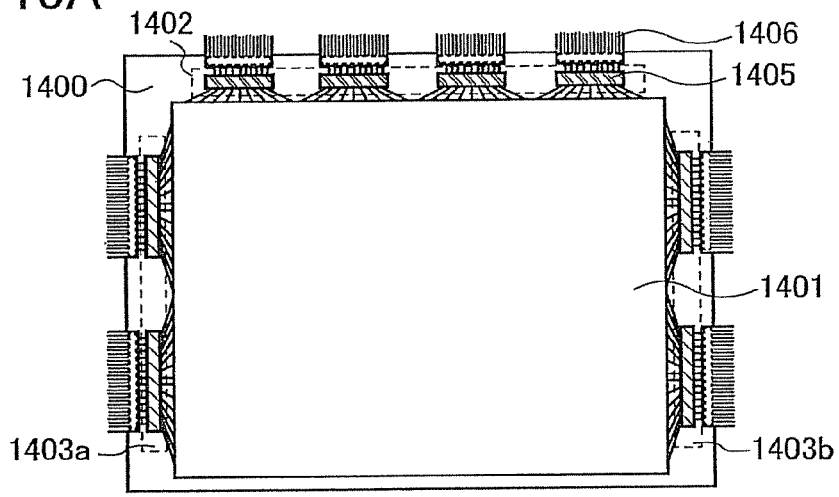
FIGS. 10A to 10C are each a diagram describing mounting of a driver circuit relating to the present invention.

As shown in FIG. 10A, a signal line driver circuit 1402 and scanning line driver circuits 1403a and 1403b are mounted on a periphery of a pixel portion 1401. In FIG. 10A, as the signal line driver circuit 1402 and the scanning line driver circuits 1403a and 1403b, an IC chip 1405 is mounted on a substrate 1400 by a known mounting method such as a method using an anisotropic conductive adhesive or an anisotropic conductive film, a COG method, a wire bonding, a reflow treatment using a solder bump, or the like. Here, the IC chip 1405 is mounted by a COG method, and connected to an external circuit through an FPC (flexible printed circuit) 1406.

Figure 10B:
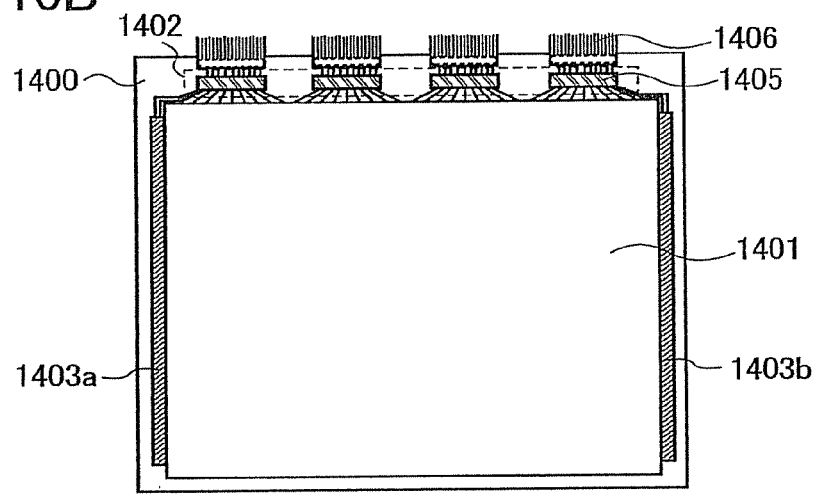

In a case where a semiconductor element typified by a TFT is formed with an oxide semiconductor as shown in FIG. 10B, the pixel portion 1401, the scanning line driver circuits 1403a and 1403b, and the like may be integrated over the substrate while the signal line driver circuit 1402 and the like may be separately mounted as IC chips. In FIG. 10B, the IC chip 1405 as the signal line driver circuit 1402 is mounted on the substrate 1400 by a COG method. The IC chip 1405 is connected to an external circuit through the FPC 1406.

Figure 10C:
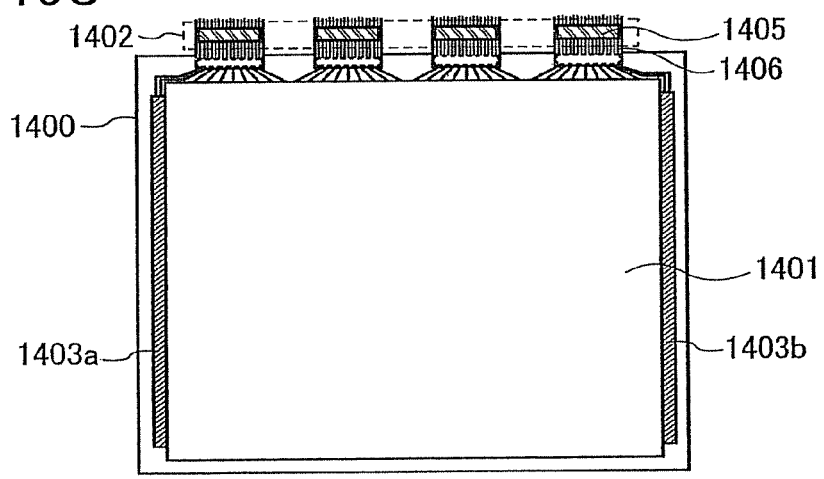

Further, as shown in FIG. 10C, there is a case where the signal line driver circuit 1402 and the like are mounted by a TAB method instead of a COG method. The IC chip is connected to an external circuit through the FPC 1406. Although the signal line driver circuit is mounted by a TAB method in FIG. 10C, the scanning line driver circuit may be mounted by a TAB method.

When the IC chip is mounted by a TAB method, the pixel portion can occupy a large area in the substrate, leading to a narrower frame.

Instead of an IC chip formed over a silicon wafer, an IC (hereinafter referred to as a driver IC) formed over a glass substrate may be provided. Since an IC chip is formed over a circular silicon wafer, the shape of a mother substrate is limited. Meanwhile, a driver IC is formed over a glass substrate whose shape is not limited, which results in increased productivity. Accordingly, the shape and size of a driver IC can be set freely. For example, when forming a driver IC with a long side of 15 to 80 mm, a smaller number of driver ICs are required as compared to the case of mounting IC chips. As a result, the number of connection terminals can be reduced and productive yield can be increased.

A driver IC can be formed using a crystalline semiconductor formed over a substrate, and the crystalline semiconductor may be formed by continuous wave laser light irradiation. A semiconductor film obtained by continuous wave laser light irradiation has few crystal defects and large crystal grains. Accordingly, a transistor having such a semiconductor film is improved in mobility and response speed, capable of high speed driving, and suitable for a driver IC. A driver IC may be formed using an oxide semiconductor film of the present invention in which crystallinity of at least a channel forming region is improved.

Embodiment 4

Figure 11:
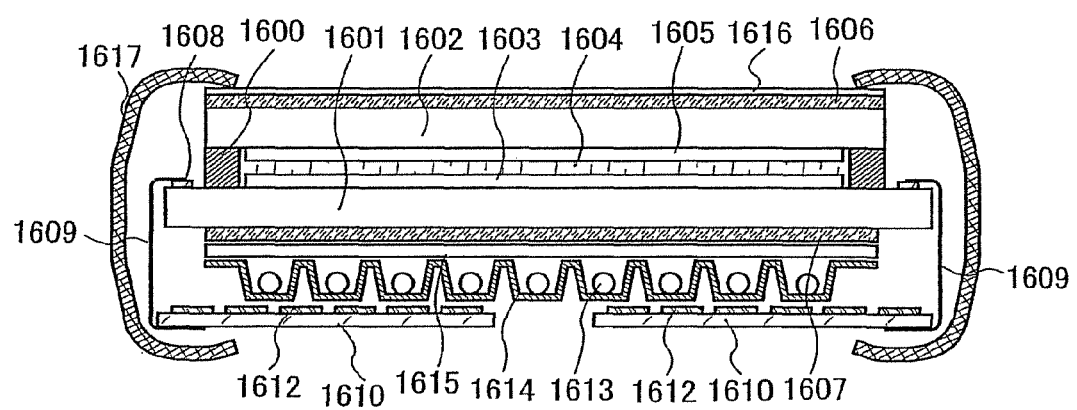
FIG. 11 is a diagram describing a display module relating to the present invention.

In this embodiment, a display module relating to the present invention is described. Here, as one example of the display module, a liquid crystal module is described with reference to FIG. 11.

A substrate 1601 and an opposing substrate 1602 are stuck together by, a sealant 1600, and a pixel portion 1603 and a liquid crystal layer 1604 are provided therebetween to form a display region.

A coloring layer 1605 is required in a case of performing color display, and in a case of an RGB method, a coloring layer corresponding to each of red, green and blue are provided corresponding to each pixel. On the outsides of the substrate 1601 and the opposing substrate 1602, polarizing plates 1606 and 1607 are provided, respectively. Also, on a surface of the polarizing plate 1606, a protective film 1616 is formed, and alleviates impact from the exterior.

A wiring substrate 1610 is connected to a connection terminal 1608 provided over the substrate 1601 via an FPC 1609. External circuits 1612 such as a pixel driver circuit (an IC chip, a driver IC, or the like); a control circuit, a power source circuit or the like is incorporated to the wiring substrate 1610.

A cold cathode tube 1613, a reflecting plate 1614, and an optical film 1615 are a backlight unit, and these become a light source to emit light to a liquid crystal display panel. A liquid crystal panel, the light source, the wiring substrate, the FPC, and the like are retained and protected in a bezel 1617.

Embodiment 5

In this embodiment mode, as an electronic appliance relating to the present invention, a television device (also simply called a TV, or a television receiving device), a digital camera, a digital video camera, a mobile phone device (also simply called a cellular phone device or a cellular phone), a mobile information terminal such as a PDA, a mobile game machine, a monitor for a computer, a computer, an audio reproducing device such as a car audio component, an image reproducing device such as a home-use game machine provided with a recording medium, or the like, is described with reference to drawings.

Figure 12A:
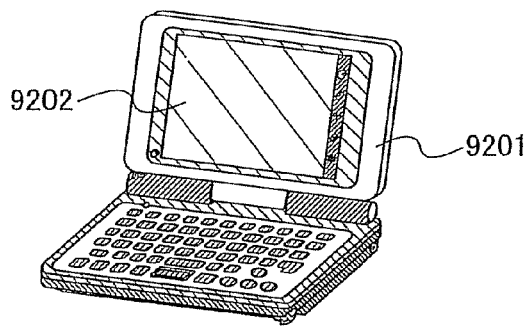
FIGS. 12A to 12F are each a diagram describing one example of an electronic appliance.

The mobile information terminal shown in FIG. 12A includes a main body 9201, a display portion 9202, and the like. By using a display device that is one feature of the present invention, the mobile information terminal can be provided inexpensively.

Figure 12B:
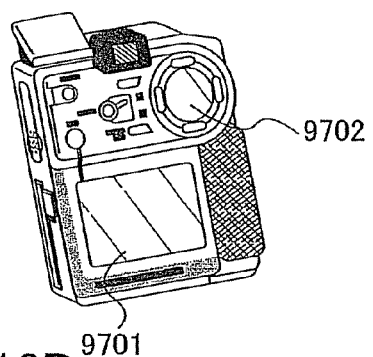

The digital video camera shown in FIG. 12B includes a display portion 9701, a display portion 9702, and the like. By using the display device that is one feature of the present invention, the digital video camera can be provided inexpensively.

Figure 12C:
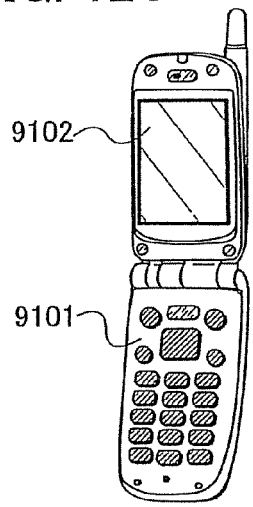

The mobile terminal shown in FIG. 12C includes a main body 9101, a display portion 9102, and the like. Embodiment Modes 1 to 5, and embodiments 1 to 4 can be applied to the display portion 9102. By using the display device that is one feature of the present invention, the mobile terminal can be provided inexpensively.

Figure 12D:
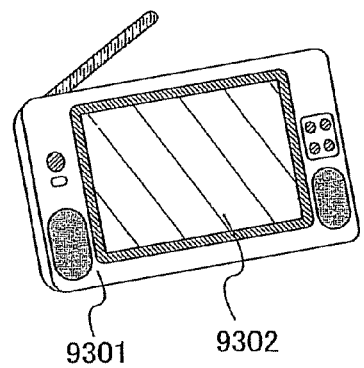

The mobile type television device shown in FIG. 12D includes a main body 9301, a display portion 9302, and the like. By using the display device that is one feature of the present invention, the mobile type television device can be provided inexpensively. The present invention can be widely applied to a small scale television device such as a television device mounted on a mobile terminal such as a cellular phone, a medium scale television device that can be carried around, and a large scale television device (for example, 40-inch or larger).

Figure 12E:
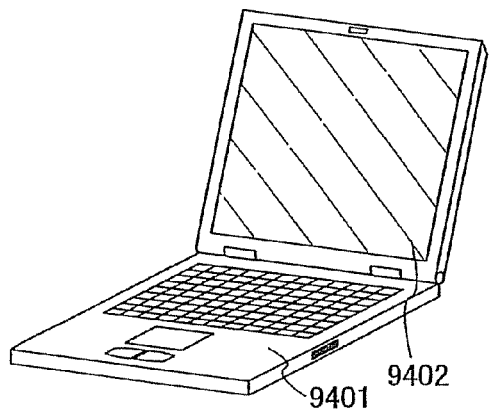

The mobile type computer shown in FIG. 12E includes a main body 9401, a display portion 9402, and the like. By using the display device that is one feature of the present invention, the mobile type computer can be provided inexpensively.

Figure 12F:
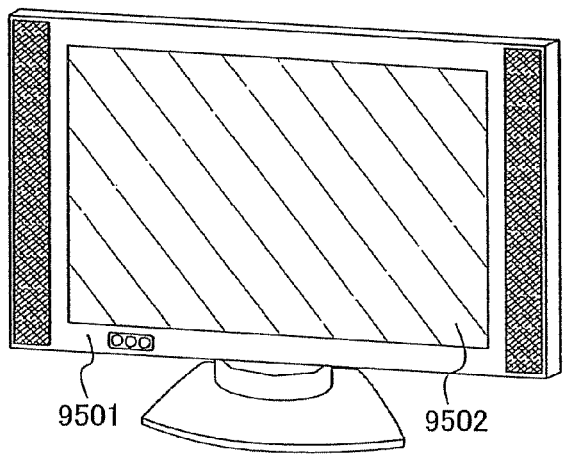

The television device shown in FIG. 12F includes a main body 9501, a display portion 9502, and the like. By using the display device that is one feature of the present invention, the television device can be provided inexpensively.

Among the foregoing electronic appliances, that which uses a secondary battery can have a longer operating time by how much power consumption is reduced, and a need for recharging the secondary battery can be cut out.

Embodiment 6

In this embodiment, a structure of an LRTA device used in the present invention is described with reference to FIGS. 19A and 19B.

Figure 19A:
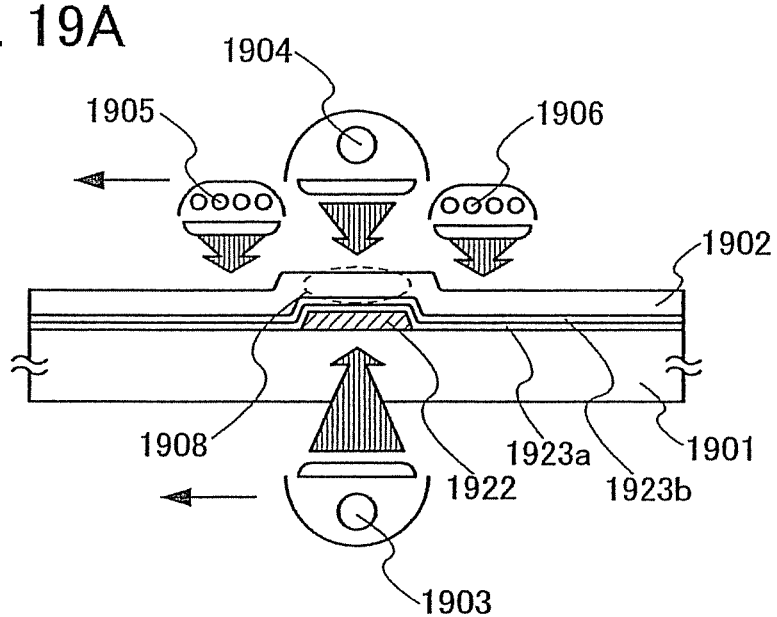
FIGS. 19A and 19B are each a diagram showing a structure of an LRTA device relating to the present invention.

In FIG. 19A, a gate electrode 1922, a gate insulating films 1923a and 1923b, and an oxide semiconductor film 1902 are formed over a glass substrate 1901. Also, on a lower surface side of the substrate and on an upper surface side of the substrate, an infrared light lamp 1903 and an ultraviolet light lamp 1904 are provided, respectively. And, a first infrared light auxiliary lamp 1905, and a second infrared light auxiliary lamp 1906 are provided in parallel with the ultraviolet light lamp 1904. Note that the first infrared light auxiliary lamp 1905 and the second infrared light auxiliary lamp 1906 are not required to be provided.

Also, this embodiment mode has a structure in which the first infrared light auxiliary lamp 1905 and the second infrared light auxiliary lamp 1906 are placed in front and in back (with respect to a moving direction of the substrate) of the ultraviolet light lamp 1904, respectively. However, the structure may be that both are placed in the front or in the back.

In a structure such as the above, each lamp (the infrared light lamp 1903, the ultraviolet light lamp 1904, the first infrared light auxiliary lamp 1905, and the second infrared light auxiliary lamp 1906) moves in a direction of an arrow in FIG. 19A, and scans a linear light. In the structure of this embodiment, a region 1908 shown by a dotted line in the oxide semiconductor film 1902 that overlaps with the gate electrode 1922 with the gate insulating films 1923a and 1923b therebetween is irradiated with infrared light from the first infrared light auxiliary lamp 1905 to be heated. Note that each lamp is moved when lamp irradiation is performed on the substrate; however, the glass substrate may be moved, or both the lamp and the substrate may be moved.

After irradiation is performed on the first infrared light auxiliary lamp 1905, the upper surface side of the substrate is irradiated with ultraviolet light from the ultraviolet light lamp 1904, as well as the lower surface side of the substrate is irradiated, with infrared light from the infrared light lamp 1903, and the region 1908 of the oxide semiconductor film 1902 that overlaps with the gate electrode 1922 is heated. In this embodiment, crystallization of the oxide semiconductor film 1902 is performed with this region 1908 having priority.

The region 1908 heated by irradiation with the ultraviolet light lamp 1904 and the infrared light lamp 1903 is heated with infrared light from the second infrared light auxiliary lamp 1906 that is placed in back of the ultraviolet light lamp 1904. Irradiation with infrared light from the second infrared light auxiliary lamp 1906 is provided to further heat the region 1908 in which crystallization is promoted.

As in the foregoing, the region 1908 of the oxide semiconductor film 1902 (the region that becomes a crystalline oxide semiconductor film by a crystallization step) that overlaps with the gate electrode 1922 appears to move to the front along with a movement of the substrate.

Figure 19B:
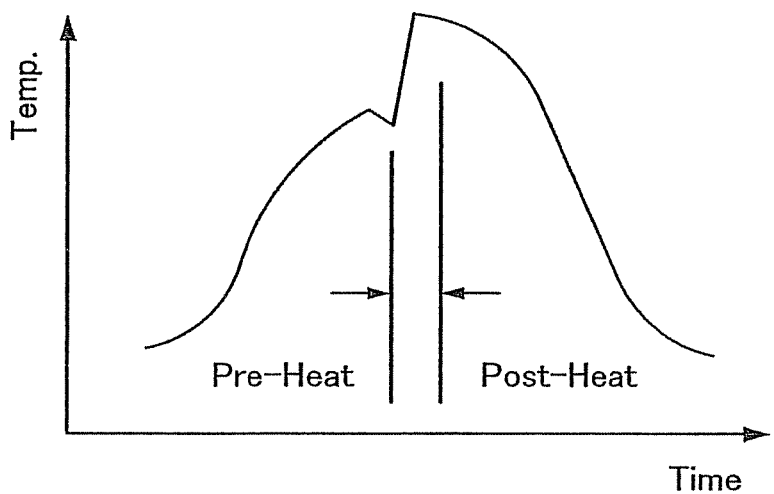

FIG. 19B shows a graph showing a relationship between time (Time) and temperature (Temp.) of the region 1908 of the oxide semiconductor film 1902. As shown in FIG. 19B, the region 1908 comes to a preheating state, then continues on to a main heating state, and a post heating state, with passing of time.

As clear from FIG. 19B, in the preheating state, a temperature is raised to a certain degree so that a temperature gradient with the subsequent main heating state is alleviated. This is so that accumulation of warping energy and the like in the oxide semiconductor film due to being heated suddenly in the main heating state, is prevented.

Therefore, it is desirable that output energy of the first infrared light auxiliary lamp 1905 is set to be smaller than output energy of the infrared light lamp 1903. At this time, a practitioner may decide how adjustment is to be made to form the appropriate temperature gradient.

Next, after the preheating state, infrared light irradiation is performed towards a lower surface side of the substrate, and the oxide semiconductor film 1902 is brought to the main heating state in which a film surface temperature is raised to 250° C. to 570° C. At this state, crystallinity of the region 1908 in the oxide semiconductor film 1902 becomes favorable. Note that ultraviolet light emitted at the same time contributes to electron excitation; therefore, it does not contribute to change in terms of heat.

The region 1908 with improved crystallinity obtained in the main heating state is heated by the second infrared auxiliary lamp 1906 placed in back of the ultraviolet light lamp 1904. This post heating state has a role of preventing a completion of crystallization in a state where thermal equilibrium is deteriorated by sudden cooling in the main heating state. This is a device for obtaining the most stable bond state by providing allowance in a time period required for crystallization.

Accordingly, it is desirable that output energy of the second infrared light auxiliary lamp 1906 is also set to be smaller than that of infrared light lamp 1903 placed under a substrate surface, and adjusted so that a temperature gradient is formed in which the temperature is gradually lowered.

By a structure as in the foregoing, shrinking of a substrate can be suppressed since a portion of an oxide semiconductor film that overlaps with a gate electrode is heated. Also, by performing crystallization by moving each lamp or substrate, throughput can be increased. Also, occurrence of a crystal defect such as stress warping, a dangling bond, or the like that can occur due to sudden heating of an oxide semiconductor film or sudden cooling of a crystalline oxide semiconductor film can be suppressed, and the oxide semiconductor film including the region 1908 with excellent crystallinity can be obtained.

Also, by performing irradiation heating without providing the first infrared light auxiliary lamp 1905 and the second infrared light auxiliary lamp 1906, heating of the substrate may be suppressed.

Note that in this embodiment, a structure of an LRTA device using a linear lamp is described; however, a planar lamp may be used to perform the crystallization step.

Embodiment 7

In this embodiment, an example of applying a semiconductor device relating to the present invention to an electrophoresis display device is described with reference to FIG. 20.

Figure 20:
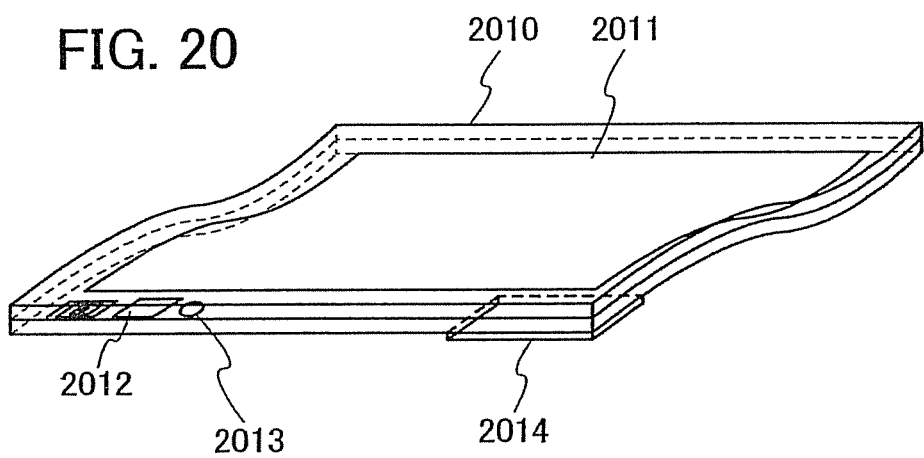
FIG. 20 describes one example of an electronic appliance relating to the present invention.

The electrophoresis display device shown in FIG. 20 includes a main body 2010, a pixel portion 2011 displaying an image, a driver IC 2012, a receiving device 2013, a film battery 2014, and the like. Each of the driver IC 2012, the receiving device 2013, and the like may be mounted with a semiconductor part. The semiconductor device of the present invention can be used for the pixel portion 2011 and the driver IC 2012. Note that the pixel portion 2011 has a structure where a display layer in which microcapsules, Gyricon beads, and the like are arranged and a driver layer controlling the display layer are stacked. The display layer and the driver layer are interposed between two plastic films.

Such an electrophoresis display device is also called an electronic paper, and it is extremely light weight, and since it has a flexible property, it can be rolled up in a tubular form; consequently, it is extremely advantageous in carrying around. Therefore, a display medium of a large screen can be freely carried around. Also, since the semiconductor of the present invention is used for the pixel portion 2011 and the like, an inexpensive display device can be provided.

A variety of modes can be considered as an electrophoresis display device of this embodiment, but the electrophoresis display device of this embodiment is a device in which a plurality of microcapsules each including first particles having a positive charge and second particles having a negative charge are dispersed in a solvent or a solute, and an electrical field is applied to the microcapsules so that the particles in the microcapsules move in opposite directions of each other, and only a color of the particles gathered on one side is displayed. Note that the first particles or the second particles includes a colorant, and does not move in a case where there is not electric field. Also, a color of the first particles is different from a color of the second particles (the particles may also be colorless). That which microcapsules are dispersed in a solvent is called an electronic ink, and this electronic ink can be printed on a surface such as glass, plastic, fabric, paper, and the like.

Also, in a semiconductor device of the present invention, in addition to an oxide semiconductor film having a light transmitting property with respect to visible light, a transparent conductive film including indium tin oxide (ITO), ITSO made of indium tin oxide and silicon oxide, organic indium, organic tin, zinc oxide, titanium nitride, or the like each having a light transmitting property with respect to visible light for a source electrode, a drain electrode, and the like. If a conventional amorphous silicon or polysilicon is used for a TFT used in a driver layer, to prevent a channel forming region from being irradiated with light, it is necessary that a light shielding film is provided to overlap the channel forming region. However, as in the present invention, by manufacturing the driver layer using the oxide semiconductor film, the source electrode, and the drain electrode each having a light transmitting property with respect to visible light, an electrophoresis display device of a double-sided display can be obtained.

Note that the semiconductor device of the present invention can be used as a means for displaying mainly still images for a navigation system, an audio reproducing device (such as a car audio component, or an audio component), a personal computer, a game machine, a mobile information terminal (such as a mobile computer, a cellular phone, a mobile game machine, or an electronic book), and in addition, the semiconductor device can be used for household appliances such as a refrigerator, a washing machine, a rice cooker, a fixed telephone, a vacuum cleaner, and a clinical thermometer, as well as for a hanging poster in a train, and a large-sized information display such as an arrival and departure guide board in a railroad station and an airport.

Embodiment 8

In this embodiment, a digital audio player relating to the present invention is described with reference to FIG. 21.

Figure 21:
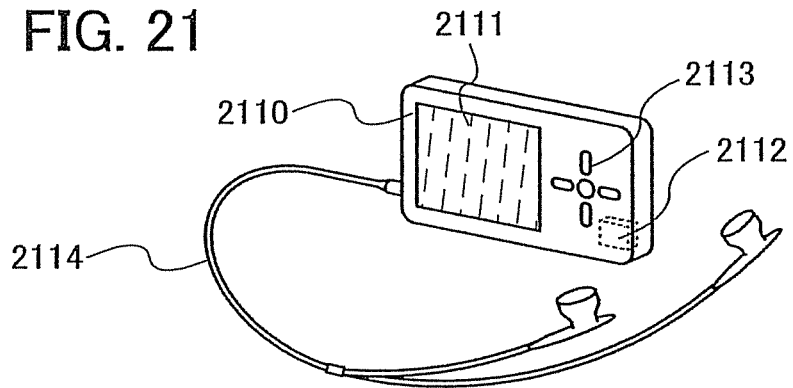
FIG. 21 describes one example of an electronic appliance relating to the present invention.

The digital audio player shown in FIG. 21 includes a main body 2110, a display portion 2111, a memory portion 2112, an operation portion 2113, a pair of earphones 2114, and the like. Note that instead of the pair of earphones 2114, a pair of headphones, or a wireless pair of earphones can be used. As the display portion 2111, liquid crystal, organic EL, or the like can be used. As the memory portion 2112, a flash memory with a recording capacity of 200 megabytes (MB) to 200 gigabytes (GB) is used, and by operating the operation portion 2113, an image or a sound (music) can be recorded and reproduced.

Since a channel forming region of an oxide semiconductor film of a TFT included in a semiconductor device of the present invention includes at least a crystallized region, by providing the semiconductor device of the present invention to the display portion 2111, an inexpensive digital audio player with good performance can be provided. Further, since the channel forming region of the oxide semiconductor film is transparent and does not absorb visible light, unnecessary light carriers are not generated. Therefore, since characteristic degradation of the channel forming region due to light irradiation does not occur, a highly reliable digital audio player can be provided.

This embodiment can be appropriately combined with Embodiment Modes 1 to 6 and Embodiments 1 to 4.

This application is based on Japanese Patent Application serial no. 2005-283782 filed in Japan Patent Office on Sep., 29, in 2005, the entire contents of which are hereby incorporated by reference:

What is claimed is:

1. A semiconductor device comprising:
   a gate electrode over a substrate;
   a gate insulating film including a first insulating oxide film;
   an oxide semiconductor layer on the first insulating oxide film, the oxide semiconductor layer including a channel region;
   a pair of conductive layers on the oxide semiconductor layer; and
   a second insulating oxide film over the oxide semiconductor layer and the pair of conductive layers, wherein the second insulating oxide film is in contact with a portion of the oxide semiconductor layer, the portion being between the pair of conductive layers,
   wherein an upper surface of the oxide semiconductor layer between the pair of conductive layers is etched so that the portion of the oxide semiconductor layer is thinner than portions of the oxide semiconductor layer below the pair of conductive layers, and
   wherein the oxide semiconductor layer comprises indium and zinc.

2. The semiconductor device according to claim 1 wherein the oxide semiconductor layer has a crystalline state.

3. The semiconductor device according to claim 1 wherein the oxide semiconductor layer has an amorphous state at least partly.

4. The semiconductor device according to claim 1 wherein the oxide semiconductor layer has a state in which both an amorphous structure and a crystalline structure exist.

5. The semiconductor device according to claim 1 wherein the oxide semiconductor layer contains at least one element selected from the group consisting of nitrogen, phosphorus, arsenic, antimony, bismuth, fluorine, chlorine, bromine, and iodine.

6. The semiconductor device according to claim 1 wherein the oxide semiconductor layer further comprises gallium.

7. The semiconductor device according to claim 1, wherein the first insulating oxide film comprises silicon oxide or silicon oxynitride.

8. The semiconductor device according to claim 1, wherein the second insulating oxide film comprises silicon oxide or silicon oxynitride.

9. The semiconductor device according to claim 1, wherein the first insulating oxide film comprises aluminum oxide.

10. The semiconductor device according to claim 1, wherein the second insulating oxide film comprises aluminum oxide.

11. A display device comprising:
a gate electrode over a substrate;
a gate insulating film including a first insulating oxide film;
an oxide semiconductor layer on the first insulating oxide film, the oxide semiconductor layer including a channel region;
a pair of conductive layers on the oxide semiconductor layer; and
a second insulating oxide film over the oxide semiconductor layer and the pair of conductive layers, wherein the second insulating oxide film is in contact with a portion of the oxide semiconductor layer, the portion being between the pair of conductive layers,
a pixel electrode over the second insulating oxide film, the pixel electrode being electrically connected to one of the pair of conductive layers,
wherein the oxide semiconductor layer comprises indium and zinc, and
wherein an upper surface of the oxide semiconductor layer between the pair of conductive layers is etched so that the portion of the oxide semiconductor layer is thinner than portions of the oxide semiconductor layer below the pair of conductive layers.

12. The display device according to claim 11 wherein the oxide semiconductor layer has a crystalline state.

13. The display device according to claim 11 wherein the oxide semiconductor layer has an amorphous state at least partly.

14. The display device according to claim 11 wherein the oxide semiconductor layer has a state in which both an amorphous structure and a crystalline structure exist.

15. The display device according to claim 11 wherein the oxide semiconductor layer contains at least one element selected from the group consisting of nitrogen, phosphorus, arsenic, antimony, bismuth, fluorine, chlorine, bromine, and iodine.

16. The display device according to claim 11 wherein the display device is a liquid crystal device.

17. The display device according to claim 11 wherein the display device is an electroluminescence device.

18. The display device according to claim 11 wherein the oxide semiconductor layer further comprises gallium.

19. The display device according to claim 11, wherein the first insulating oxide film comprises silicon oxide or silicon oxynitride.

20. The display device according to claim 11, wherein the second insulating oxide film comprises silicon oxide or silicon oxynitride.

21. The display device according to claim 11, wherein the first insulating oxide film comprises aluminum oxide.

22. The display device according to claim 11, wherein the second insulating oxide film comprises aluminum oxide.

* * * * *

UNITED STATES PATENT AND TRADEMARK OFFICE
CERTIFICATE OF CORRECTION

PATENT NO. : 8,466,463 B2
APPLICATION NO. : 12/948095
DATED : June 18, 2013
INVENTOR(S) : Kengo Akimoto, Tatsuya Honda and Norihito Sone It is certified that error appears in the above-identified patent and that said Letters Patent is hereby corrected as shown below:

In the Specification:

Column 4, line 4-5; Change "have agate electrode" to --have a gate electrode--.
Column 5, line 7; Change "Er, Tin, and" to --Er, Tm, and--.
Column 6, line 53; Change "organic iridium," to --organic indium,--.
Column 20, line 19-20; Change "denotes across-sectional view" to --denotes a cross sectional view--.
Column 30, line 47; Change "By fanning the" to --By forming the--.
Column 37, line 12; Change "FIG. 100," to --FIG. 10C,--.

Signed and Sealed this
Twenty-second Day of October, 2013

Teresa Stanek Rea
*Deputy Director of the United States Patent and Trademark Office*